United States Patent
Cuban et al.

(10) Patent No.: US 10,573,993 B2
(45) Date of Patent: Feb. 25, 2020

(54) COAXIAL CONNECTOR CALIBRATION DEVICES

(71) Applicant: Micro-Mode Products, Inc., El Cajon, CA (US)

(72) Inventors: Michael Anthony Cuban, Coronado, CA (US); Mario Cruz Torres, San Diego, CA (US); Eric Paul Brandauer, Lemon Grove, CA (US)

(73) Assignee: Micro-Mode Products, Inc., El Cajon, CA (US)

( * ) Notice: Subject to any disclaimer, the term of this patent is extended or adjusted under 35 U.S.C. 154(b) by 0 days.

(21) Appl. No.: 15/591,007

(22) Filed: May 9, 2017

(65) Prior Publication Data

US 2018/0006398 A1   Jan. 4, 2018

Related U.S. Application Data

(60) Provisional application No. 62/334,041, filed on May 10, 2016.

(51) Int. Cl.
| | | |
|---|---|---|
| *H01R 13/62* | (2006.01) | |
| *H01R 24/38* | (2011.01) | |
| *H01R 24/42* | (2011.01) | |
| *H01R 24/54* | (2011.01) | |
| *G01R 35/00* | (2006.01) | |
| *H01R 13/622* | (2006.01) | |

(52) U.S. Cl.
CPC ............. *H01R 13/62* (2013.01); *H01R 24/38* (2013.01); *H01R 24/42* (2013.01); *H01R 24/54* (2013.01); *G01R 35/00* (2013.01); *H01R 13/622* (2013.01)

(58) Field of Classification Search
CPC ................................ H01R 13/62; H01R 24/38
USPC .................................................. 439/578–583
See application file for complete search history.

(56) References Cited

U.S. PATENT DOCUMENTS

| | | | | |
|---|---|---|---|---|
| 3,292,117 A * | 12/1966 | Bryant | ................ | H01R 24/542 174/151 |
| 3,673,546 A * | 6/1972 | Green | ................ | H01R 24/542 439/172 |
| 3,858,156 A * | 12/1974 | Zarro | .................... | H01R 24/40 439/221 |
| 4,333,697 A * | 6/1982 | Dreyer | ................ | H01R 24/542 439/166 |
| 4,687,279 A * | 8/1987 | Holland | ............... | H01R 24/542 439/578 |
| 4,846,731 A * | 7/1989 | Alwine | ................ | H01R 24/542 439/642 |

(Continued)

OTHER PUBLICATIONS

Maury Microwave. 1.85mm Calibration Kits. Downloaded on Mar. 12, 2018.

*Primary Examiner* — Edwin A. Leon
*Assistant Examiner* — Milagros Jeancharles
(74) *Attorney, Agent, or Firm* — Knobbe Martens Olson & Bear LLP

(57) ABSTRACT

Calibration devices, systems, and methods for push-on RF connectors are described. A male calibration connector can include a removable detent portion. With the removable detent portion removed, the male calibration connector can connect to a female calibration standard during a calibration process. With the removable detent portion installed, the male calibration connector can connect to a female push on connectors. Female calibration connectors and male calibration standards are also described.

11 Claims, 30 Drawing Sheets

(56) References Cited

U.S. PATENT DOCUMENTS

| | | | | |
|---|---|---|---|---|
| 4,925,403 A * | 5/1990 | Zorzy | H01R 13/6315 | 439/578 |
| 4,955,826 A * | 9/1990 | Potter | H01R 24/44 | 439/578 |
| 4,967,173 A * | 10/1990 | Watson | G01R 27/32 | 333/260 |
| 5,439,386 A * | 8/1995 | Ellis | H01R 13/622 | 439/271 |
| 5,700,160 A * | 12/1997 | Lee | H01R 24/542 | 439/578 |
| 6,146,208 A * | 11/2000 | Pennell | H01R 13/646 | 439/578 |
| 6,827,608 B2 | 12/2004 | Hall et al. | | |
| 7,014,513 B2 * | 3/2006 | Tomasino | H01R 4/5033 | 439/274 |
| 7,217,160 B2 * | 5/2007 | Hsu | H01R 24/542 | 439/538 |
| 7,309,247 B1 | 12/2007 | Keating | | |
| 7,335,058 B1 * | 2/2008 | Burris | H01R 9/0524 | 439/353 |
| 7,354,289 B2 * | 4/2008 | Cannon | G01R 1/06788 | 439/314 |
| 8,016,614 B2 * | 9/2011 | Xie | H01R 13/6315 | 439/578 |
| 8,597,050 B2 * | 12/2013 | Flaherty | H01R 13/6277 | 439/578 |
| 8,827,743 B1 * | 9/2014 | Maury | H01R 24/40 | 439/578 |
| 8,888,519 B2 * | 11/2014 | Baumler | H01R 31/06 | 439/248 |
| 2003/0092317 A1 * | 5/2003 | Kooiman | H01R 13/622 | 439/578 |
| 2004/0169986 A1 * | 9/2004 | Kauffman | H01P 1/045 | 361/119 |
| 2007/0275584 A1 * | 11/2007 | Keating | H01R 13/5219 | 439/271 |
| 2011/0151714 A1 * | 6/2011 | Flaherty | H01R 13/6277 | 439/578 |

* cited by examiner

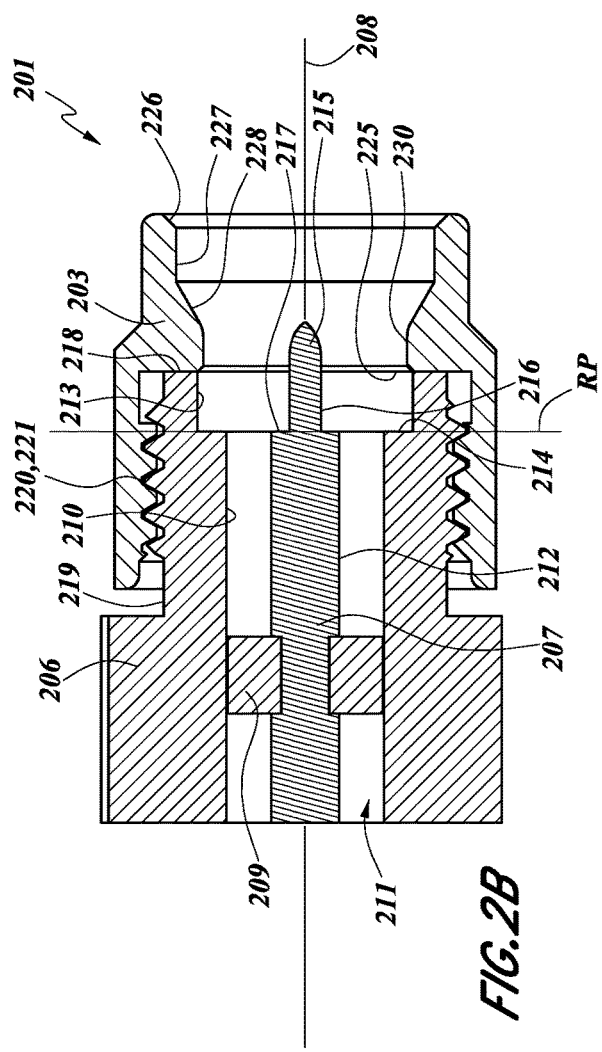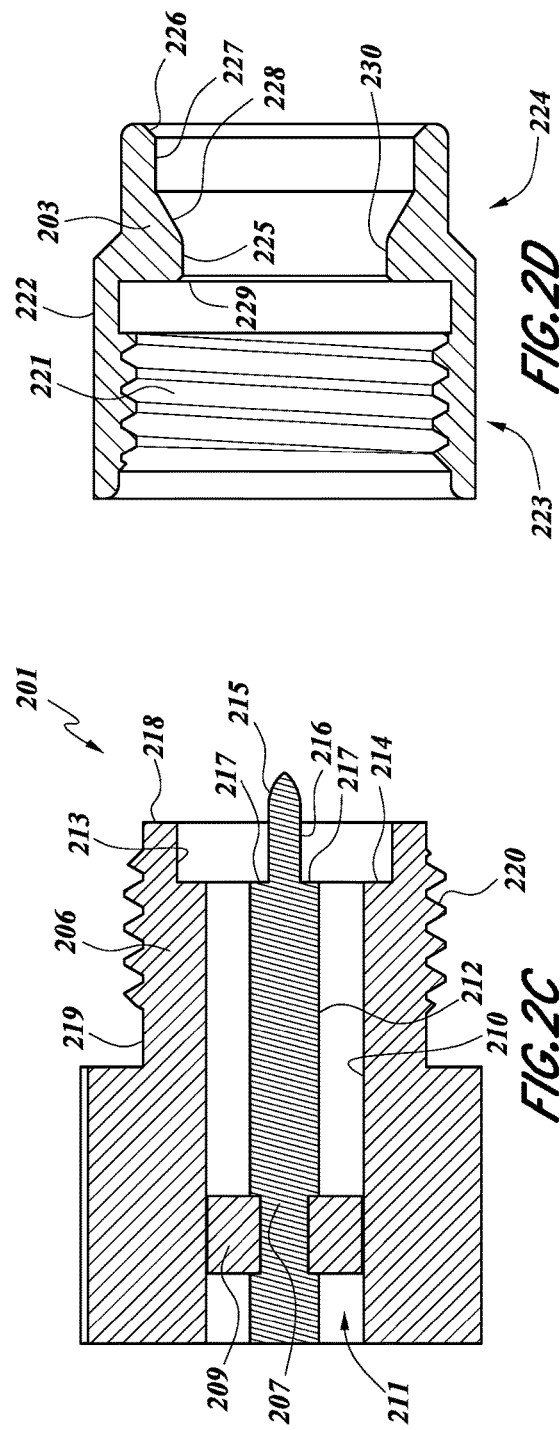

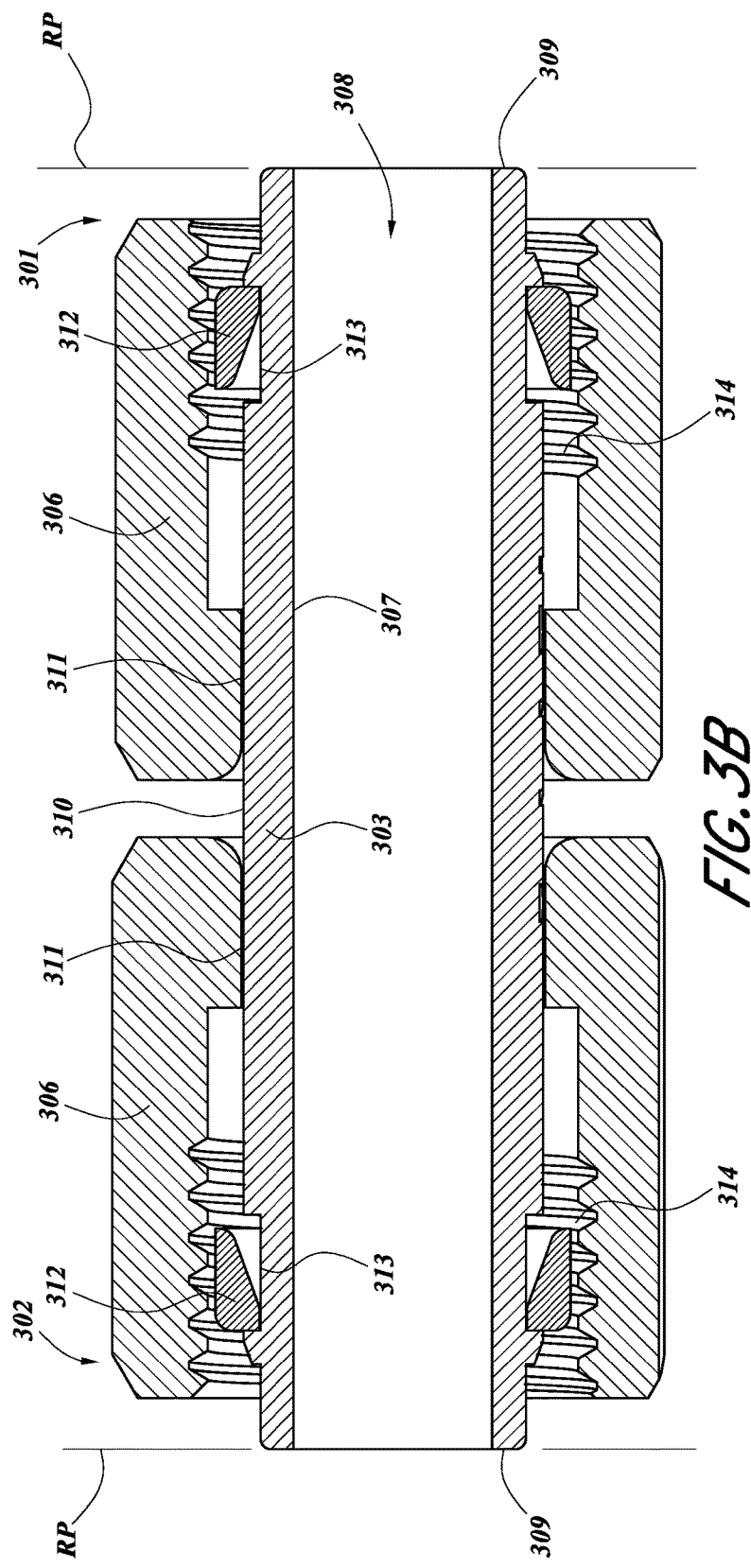
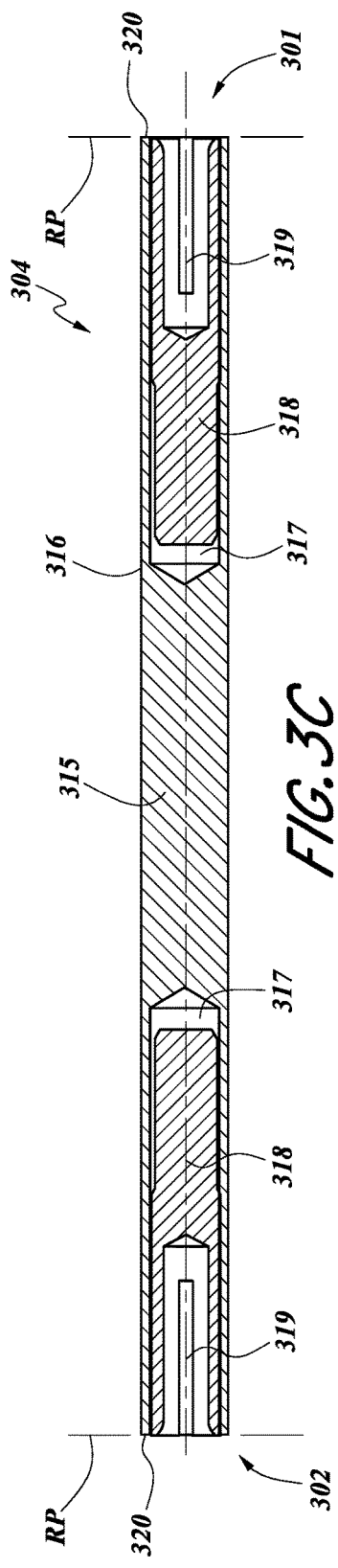

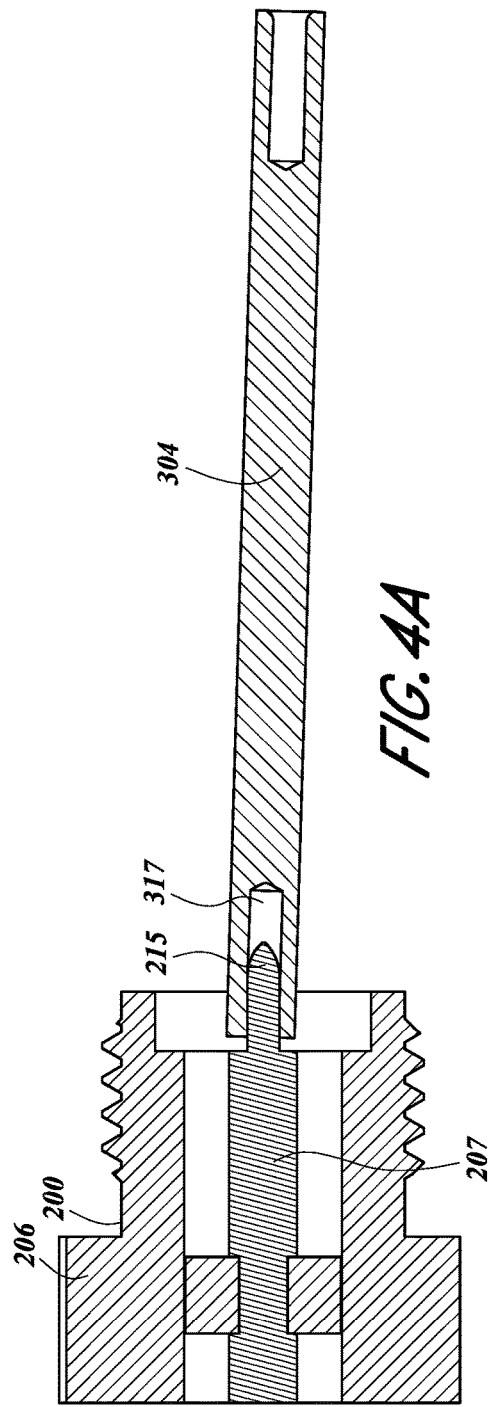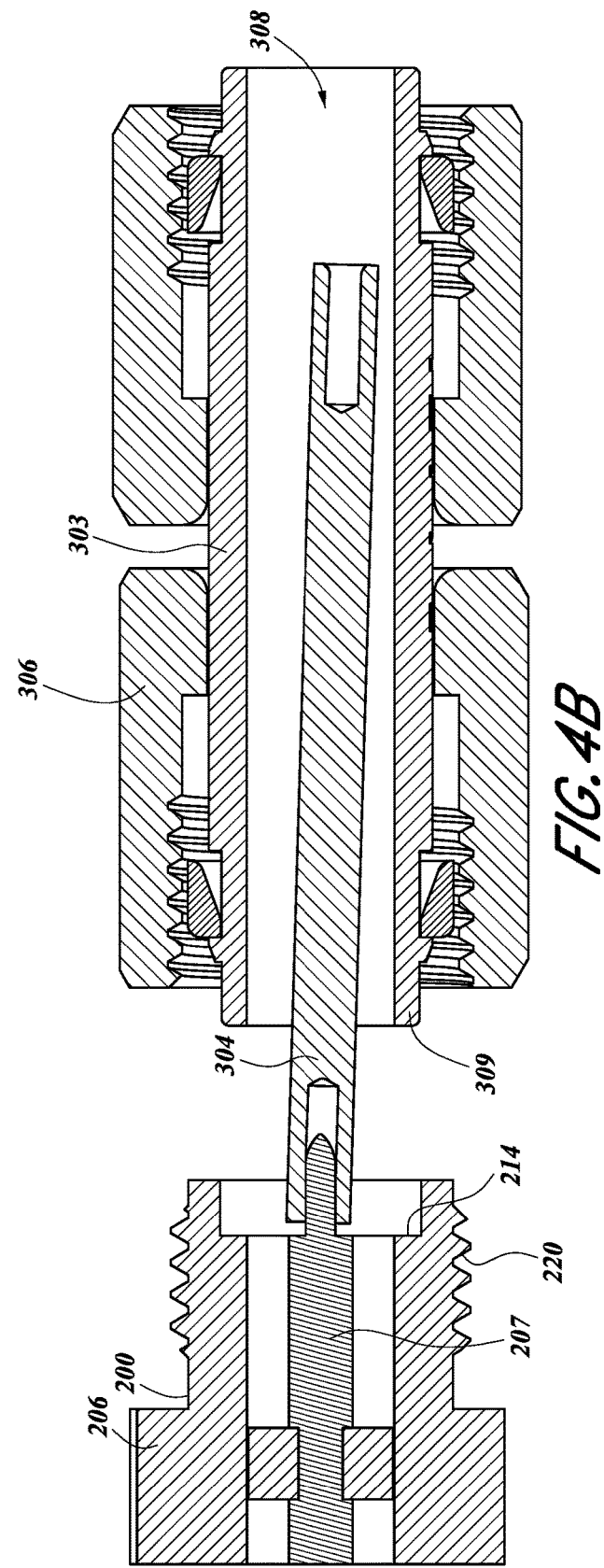

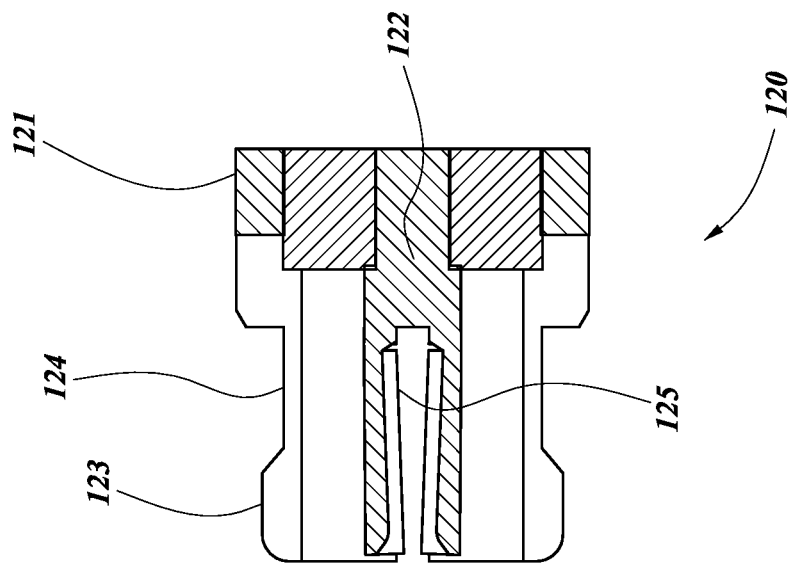
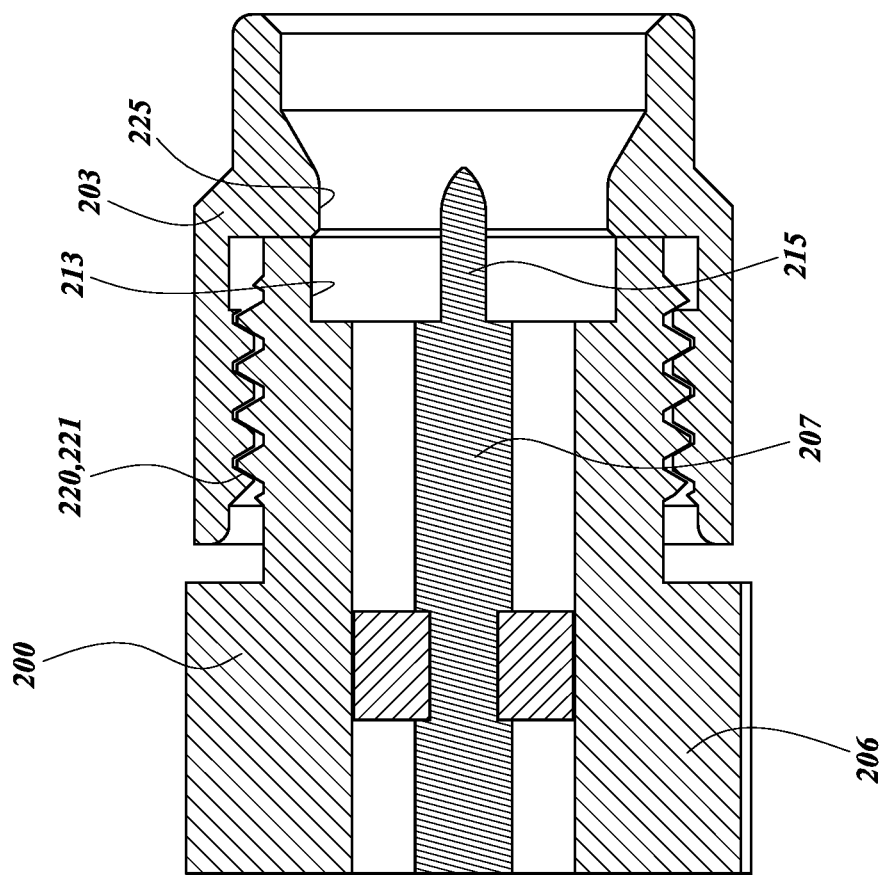
FIG.5A

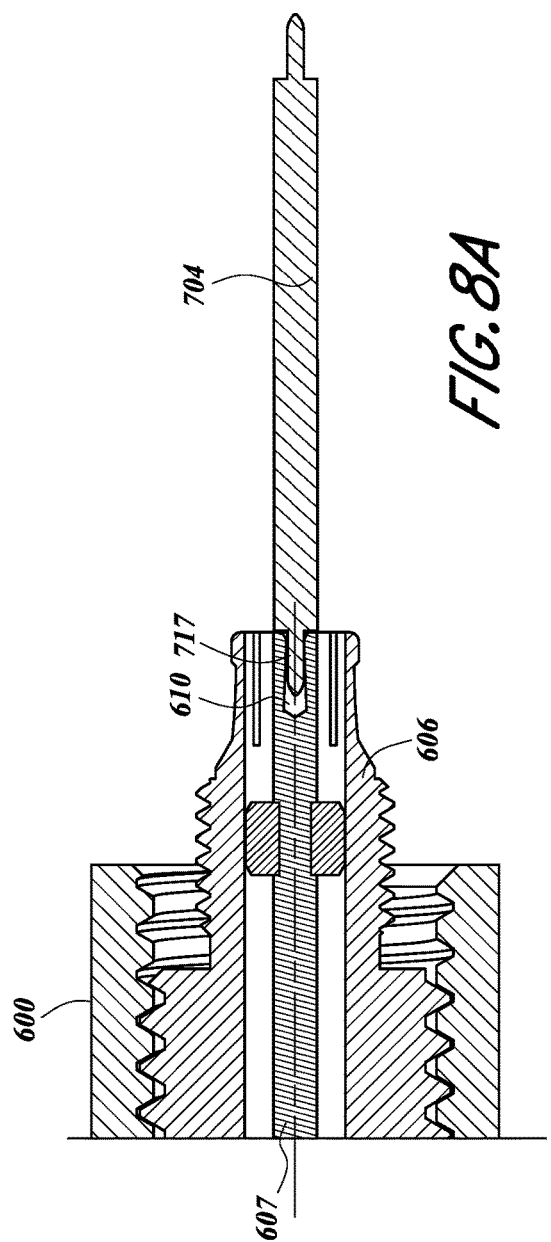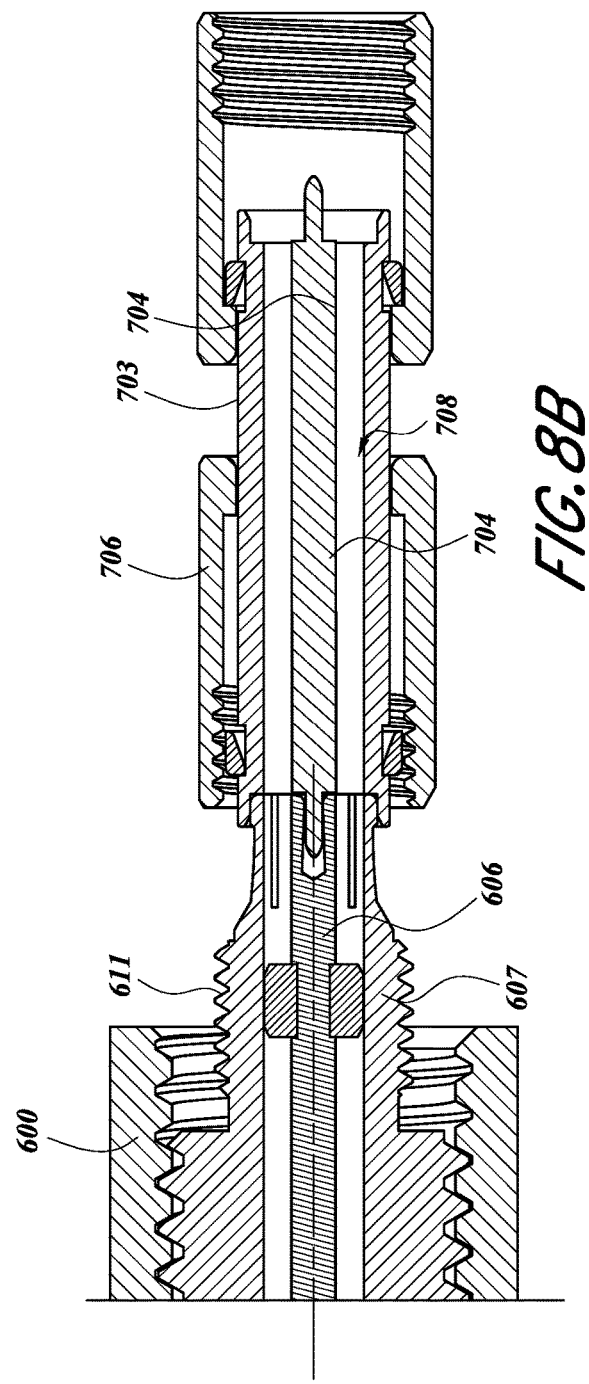

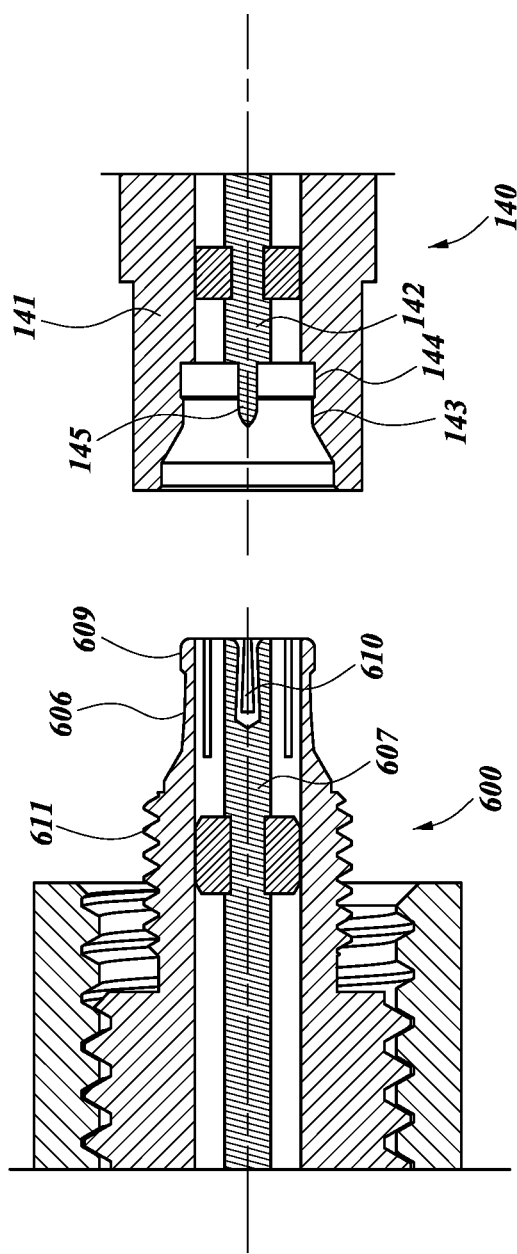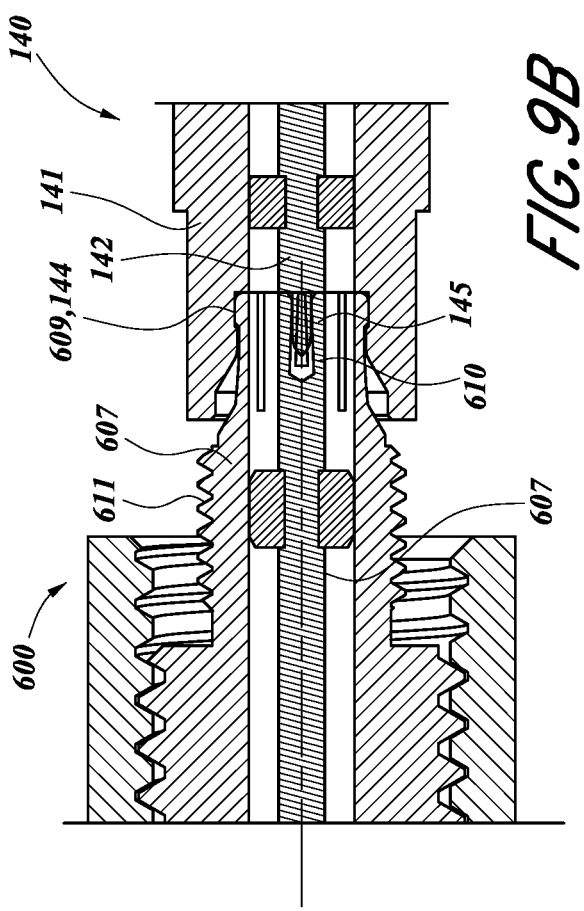

COAXIAL CONNECTOR CALIBRATION DEVICES

INCORPORATION BY REFERENCE TO ANY PRIORITY APPLICATIONS

This application claims priority to U.S. Provisional Application No. 62/334,041, filed May 10, 2016, which is incorporated herein by reference. Any and all applications for which a foreign or domestic priority claim is identified in the Application Data Sheet as filed with the present application are hereby incorporated by reference under 37 CFR 1.57.

BACKGROUND

Field

The present disclosure relates to calibration devices and systems for push-on radio frequency (RF) connectors.

Description

Precisely manufactured standards may be used to calibrate analyzers prior to testing the performance and characteristics of RF devices. There is a need for calibration standards that are compatible with RF devices that include push-on RF connectors.

SUMMARY

Calibration devices, systems and methods are described.

In a first aspect, a male calibration kit for use with RF components having female push-on connectors is disclosed. The kit includes a first male calibration connector. The first male calibration connector includes an annular outer conductor. An inner conductor is supported within a bore of the outer conductor by a dielectric support structure. The inner conductor includes a pin. The first male calibration connector includes a removable detent portion removably attached to a first end of the first male calibration connector. The first male calibration connector is configured to connect to a female push-on connector when the removable detent portion is attached to the first male calibration connector.

The kit also includes a first female calibration standard outer conductor. The first female calibration standard outer conductor includes an annular body having a smooth inner surface defining a bore through the body. A first attachment mechanism is positioned at a first end of the first female calibration standard outer conductor. The first attachment mechanism is configured to attach the first end of the first female calibration standard outer conductor to the first end of the first male calibration connector when the removable detent portion is removed from the first male calibration connector.

The kit also includes a first female calibration standard inner conductor. The first female calibration standard inner conductor includes a cylindrical body. The first end of the first female calibration standard inner conductor includes a first opening configured to receive the pin of the first male calibration connector.

In another aspect, a male calibration connector is disclosed. The male calibration connector includes an annular outer conductor extending along an axis between a first end and a second end. The outer conductor has an outer surface and an inner surface. The outer surface includes a threaded portion proximal the first end. The inner surface defines a bore extending along the axis through the outer conductor. The male calibration connector also includes an inner conductor positioned within the bore and extending along the axis. The inner conductor has an outer surface spaced apart from the inner surface of the outer conductor. A support structure supports the inner conductor within the bore. The support structure extends between the inner surface of the outer conductor and the outer surface of the inner conductor. The support structure comprises a dielectric material. The male calibration standard includes a removable detent portion having an inner surface defining an opening through the detent portion. A first portion of the inner surface includes a detent extending therefrom. A second portion of the inner surface includes a threaded portion removably engaging the threaded portion of the outer surface of the outer conductor.

In another aspect, a female calibration standard is disclosed. The female calibration standard includes an annular outer conductor extending along an axis between a first end and a second end. The outer conductor includes an inner surface defining a cylindrical bore that extends along the axis. A rotatable first retaining nut is retained on the first end of the outer conductor by a first retaining ring positioned within a first annular groove on the first end of an outer surface of the outer conductor. The first rotatable nut includes a first threaded portion configured to engage a corresponding threaded portion of a first male calibration connector. A rotatable second retaining nut is positioned around the outer conductor proximal to the second end. The second retaining nut is retained on the second end of the outer conductor by a second retaining ring positioned within a second annular groove on the second end of an outer surface of the outer conductor. The second rotatable nut includes a second threaded portion configured to engage a corresponding threaded portion of a second male calibration connector. The female calibration standard also includes an inner conductor extending along the axis between a first end and a second end. The first end includes an opening configured to receive a pin of the first male calibration connector, and the second end includes an opening configured to receive a pin of the second male calibration connector.

In another aspect, a method for calibrating an analyzer is disclosed. The method can include: attaching a first male calibration connector to a first test port of the analyzer; removing a removable detent portion from the first male calibration connector; connecting a female calibration standard inner conductor to the first male calibration connector by receiving a pin of the first male calibration connector in a first opening on a first end of the female calibration standard inner conductor; and securing a female calibration standard outer conductor to the first male calibration connector by attaching a first threaded retaining nut of the female calibration standard outer conductor to the first male calibration connector.

In another aspect, a female calibration kit for use with RF components having male push-on connectors is disclosed. The kit includes a first female calibration connector having an annular outer conductor having a plurality of slots dividing a distal end of the outer conductor into a plurality of flexible arms, a nib extending radially outward from the distal tip of each of the plurality of flexible arms, and a threaded portion on an outer surface of the outer conductor. The female calibration connector also includes an inner conductor supported within a bore of the outer conductor by a dielectric support structure. The inner conductor includes a slotted opening. The kit also includes a first male calibration standard outer conductor. The first male calibration standard outer conductor includes an annular body having a smooth inner surface defining a bore through the body. A first attachment mechanism is positioned at a first end of the first male calibration standard outer conductor. The first attachment mechanism is configured to attach the first end of the first male calibration standard outer conductor to the threaded portion of the first female calibration connector. The kit also includes a first male calibration standard inner conductor comprising a cylindrical body. A first end of the first female calibration standard inner conductor includes a pin configured to be received in the slotted opening of first female calibration connector.

In another aspect, a male calibration standard is disclosed. The male calibration standard includes an annular outer conductor extending along an axis between a first end and a second end. The outer conductor includes an inner surface defining a cylindrical bore that extends along the axis. A rotatable first retaining nut is retained on the first end of the outer conductor by a first retaining ring positioned within a first annular groove on the first end of an outer surface of the outer conductor. The first rotatable nut includes a first threaded portion configured to engage a corresponding threaded portion of a first male calibration connector. A rotatable second retaining nut is positioned around the outer conductor proximal to the second end. The second retaining nut is retained on the second end of the outer conductor by a second retaining ring positioned within a second annular groove on the second end of an outer surface of the outer conductor. The second rotatable nut includes a second threaded portion configured to engage a corresponding threaded portion of a second male calibration connector. The male calibration standard also includes an inner conductor extending along the axis between a first end and a second end, each of the first end and the second end including a pin extending outwardly therefrom.

In another aspect, a method for calibrating an analyzer is disclosed. The method can include attaching a first female calibration connector to a first test port of the analyzer; connecting a male calibration standard inner conductor to the first female calibration connector by receiving a first pin of the first male calibration standard inner conductor in a slotted opening on the female calibration connector; and securing a male calibration standard outer conductor to the first female calibration connector by attaching a first threaded retaining nut of the male calibration standard outer conductor to the first female calibration connector.

The foregoing is a summary and contains simplifications, generalizations, and omissions of detail. This summary is illustrative only and is not intended to be limiting. Other aspects, features, and advantages of the systems, devices, and methods and/or other subject matter described in this application will become apparent in the teachings set forth below.

BRIEF DESCRIPTION OF THE DRAWINGS

The features and advantages of the systems, devices, and methods described herein will become apparent from the following description, taken in conjunction with the accompanying drawings. These drawings depict several embodiments in accordance with the disclosure. The drawings are not to be considered limiting. In the drawings, similar reference numbers or symbols typically identify similar components, unless context dictates otherwise.

FIG. 2B is a cross-sectional detail view of a first end of the male calibration connector of FIG. 2A.

FIG. 2C is a cross-sectional detail view of the first end of the male calibration connector of FIG. 2A with a removable detent portion removed.

FIG. 2D is cross-sectional view of the removable detent portion of the male calibration connector of FIG. 2A.

FIG. 3B is a cross-sectional view of the outer conductor of the female calibration standard of FIG. 3A.

FIG. 3C is a cross-sectional view of the inner conductor of the female calibration standard of FIG. 3A.

FIGS. 4A-4F are cross-sectional views illustrating several example steps for mating the female calibration standard of FIG. 3A to the male calibration connector of FIG. 2A.

FIGS. 5A-5C are cross-sectional views illustrating several example steps for mating the male calibration connector of FIG. 2A to a female push-on connector.

FIGS. 8A-8F are cross-sectional views illustrating several example steps for mating the male calibration standard of FIG. 7A to the female calibration connector of FIG. 6.

FIGS. 9A-9B are cross-sectional views illustrating two example steps for mating the female calibration connector of FIG. 6 to a male push-on connector.

DETAILED DESCRIPTION

Figure 1A:
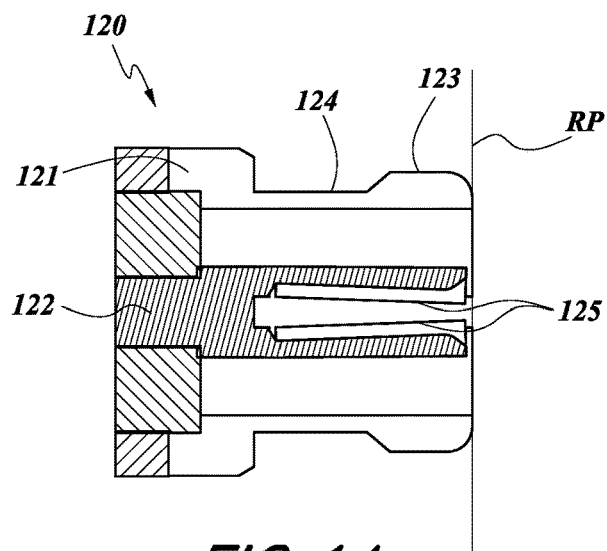
FIGS. 1A and 1B show female and male push-on connectors, respectively.

The various features and advantages of the systems, devices, and methods described herein will become more fully apparent from the following description of the several specific embodiments illustrated in the figures. These embodiments are intended to illustrate the principles of this disclosure, and this disclosure should not be limited to merely the illustrated examples. The features of illustrated embodiments can be modified, combined, removed, and/or substituted as will be apparent to those of ordinary skill in the art upon consideration of the principles disclosed herein.

Any feature or combination of features described herein are included within the scope of the present invention provided that the features included in any such combination are not mutually inconsistent as will be apparent from the context, this description, and the knowledge of one skilled in the art. In addition, any feature or combination of features may be specifically excluded from any embodiment of the present invention. For purposes of summarizing the present invention, certain aspects, advantages, and novel features of embodiments of the present invention are described herein. Of course, it is to be understood that not necessarily all such aspects, advantages, or features will be present in any particular embodiment of the present invention.

It is to be understood that embodiments presented herein are by way of example and not by way of limitation. The intent of the following detailed description, although discussing exemplary embodiments, is to be construed to cover all modifications, alternatives, and equivalents of the embodiments as may fall within the spirit and scope of the invention.

Introduction

RF (radio frequency) components can include RF connectors (referred to throughout as "connectors") that can be used to connect the RF components to cables, such as coaxial cables, or other RF components. A connector can be designed to both mechanically couple to (i.e., physically engage with) a corresponding connector and to establish a link (e.g., a communicative, data, or signal link) to transfer an RF signal between the two connectors. Connectors generally include an annular outer conductor surrounding a cylindrical inner conductor. The outer conductor may be separated from the inner conductor by a dielectric material. In some instances, the dielectric material supports the inner conductor within the outer conductor. Connectors are commonly available in various series that vary in size and design. Within a particular series there are typically male and female connectors. Generally, male connectors are designed to mate only with corresponding female connectors within the same series (i.e., of the same size and type) and vice versa.

Calibration Standards

Analyzers, such as vector network analyzers or others, are commonly used to measure the performance of RF devices. Analyzers may operate at very high frequencies. For example, in some instances, analyzers operate at frequencies above 100 GHz, although other frequencies may also be used. The characteristic impedance of the analyzers is commonly 50 Ohms, although other impedances can also be used. Typically, the analyzer includes at least two test ports. To measure the performance of an RF device, the RF device is typically connected to the analyzer via the test ports.

In some embodiments, cables are used to connect the test ports of the analyzer to the RF device. The cables can be coaxial cables having inner and outer conductors. The cables can include connectors at the distal ends thereof. In some embodiments, the connectors are configured to connect directly to corresponding connectors on the RF device to be tested by the analyzer. In some embodiments, the RF device to be tested may include connectors that are not directly compatible with the connectors on the cables and an intermediary set of connectors (i.e., a set of adapters) must be used to connect the connectors of the cables with the connectors of the RF device to be tested.

Once the RF device to be tested is connected to the analyzer, the analyzer can test the performance of the connected RF device. To improve accuracy, however, it may be desirable to first calibrate the measurement system (i.e., the analyzer, cables, connectors, and any intermediary connectors or adapters) before connecting the RF device to be tested to the analyzer. In some instances, calibration includes determining errors introduced by the measurement system itself (i.e., the analyzer, cables, connectors, and any intermediary connectors or adapters), so that they can be subtracted out when the RF device is tested. This helps to ensure that the performance measured by the analyzer when analyzing the RF device is attributable to the RF device alone, rather than to the measurement system.

Calibration is typically performed by attaching calibration standards (precisely manufactured devices having known RF properties) to the connectors and performing measurements on the system. Typically, calibration standards are precisely manufactured coaxial devices including substantially featureless outer and inner conductors. For example, the inner surface of the outer conductor of a calibration standard can be formed as a smooth, uninterrupted cylinder, and the outer surface of the inner conductor of the calibration standard can also be formed as a smooth, uninterrupted cylinder. For calibration standards, the inner conductor is ideally not supported within the outer conductor by any structure connected to the outer conductor (for example, by a dielectric bead). Rather, it is instead supported by the connectors to which the calibration standards are connected. Because the calibration standards are precisely manufactured and include featureless inner and outer conductors, the performance of the calibration standards can be mathematically determined. Thus, the calibration standards provide a known RF performance that can be used to calibrate the analyzer.

To calibrate an analyzer, a calibration standard is connected to the test ports (potentially via one or more cables, connectors, and/or adapters). The analyzer measures the performance of the calibration standard. Deviation of the measured performance of the calibration standard from the mathematically determined performance of the calibration standard can be attributed to the measurement system (i.e., the analyzer, cables, connectors, and/or adapters) and used to calibrate the measurement system such that future measurements are substantially attributable to the RF device being tested and do not include deviations attributable to the measurement system itself.

Various methods of calibration using calibration standards exist, including thru-reflect-line (TRL) and line-reflect-line (LRL) methods. These methods can involve testing several calibration standards of different lengths, as well as a "short circuit" calibration standard to calibrate the analyzer. Other calibration methods are also possible.

Push-on RF Connectors

Figure 1B:
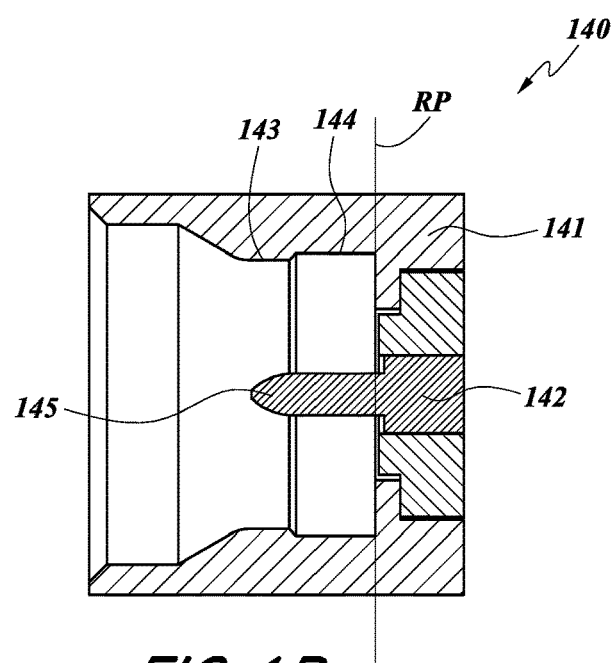
Figure 1C:
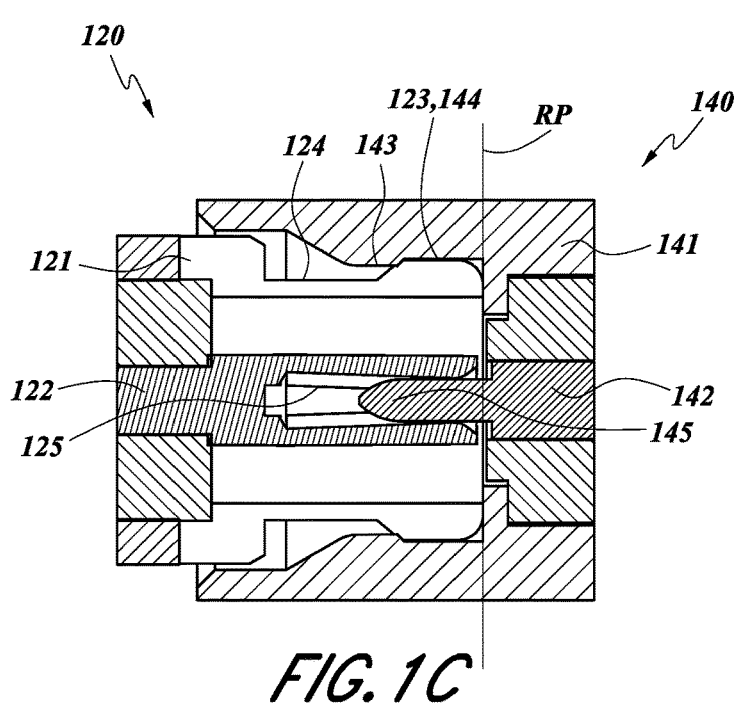
FIG. 1C shows the female and male push-on connectors of FIGS. 1A and 1B in a mated state.

RF connectors that can be pushed together and hold themselves in a mated state without using a threaded coupling mechanism are commonly called push-on connectors or blindmate connectors. FIG. 1A shows an embodiment of a female push-on connector 120 and FIG. 1B shows an embodiment of male push-on connector 140. FIG. 1C shows the female push-on connector 120 and the male push-on connector 140 in a mated state.

As shown, the female push-on connector 120 includes an outer conductor 121 and an inner conductor 122. Distal ends of the outer and inner conductors 121, 122 may lie substantially in a reference plane RP. The term "reference plane" is commonly used to refer to the plane at which an RF signal is transferred from a female connector to a male connector or vice versa.

In many embodiments, both the outer and inner conductors 121, 122 are slotted to divide the distal ends of the outer and inner conductors 121, 122 into a plurality of flexible arms or body fingers. The flexible arms can allow the distal ends of the outer and inner conductors 121, 122 to deflect slightly as the female push-on connector 120 is mated with the male push-on connector 140 as will be described more fully below. As illustrated, the outer surface of the outer conductor 121 includes a nib 123 (formed as a protrusion extending radially outward) and a recess 124. The diameter of the nib 123 is greater than the diameter of the recess 124. The nib 123 is located on the distal tip of the outer conductor 123 near the reference plan RF.

As shown in FIG. 1B, the male push-on connector 140 includes an outer conductor 141 and an inner conductor 142. An inner surface of the outer conductor 141 includes a detent 143 (formed as a protrusion extending radially inward) and a recess 144. The detent 143 is located distally from the recess 144. The diameter of the detent 143 is less than the diameter of the recess 144. The diameter of the detent 143 is less than the diameter of the nib 123 of the female push-on connector 120. The distal end of the inner conductor 142 includes a pin 145. As shown, a portion of the outer conductor 141 (including the detent 143 and the recess 144) and a portion of the inner conductor (the pin 145) extend across the reference plane RP.

The female push-on connector 120 and the male push-on connector 140 can be mated (see FIG. 1C, which shows the female push-on connector 120 and the male push-on connector 140 in the mated state by pushing them together. When mating, the slots in the outer conductor 121 of the female push-on connector 120 allow the distal end of the outer conductor 121 (i.e., the flexible arms or body fingers) to deflect inwardly as the nib 123 passes the detent 143. When mated (FIG. 15C), flexible arms return to their undeflected positions such that the nib 123 is received within the recess 144 and is retained by the detent 143 to secure the female push-on connector 120 to the male push-on connector 140. Similarly, the detent 143 is received within the recess 124. In the mated state, the pin 145 of the inner conductor 142 of the male push-on connector 140 is received within the slot or slots 125 of the inner conductor 122 of the female push-on connector 120. In the mated state, the female push-on connector 120 and the male push-on connector 140 are mechanically engaged (i.e. retained in a mated or joined state) and an RF signal can pass between the female push-on connector 120 and the male push-on connector 140.

Push-on connectors, such as the female push-on connector 120 and the male push-on connector 140 are commonly used in a variety of RF devices. It may be desirable to test or measure the performance of RF devices including push-on connectors using an analyzer as described above. As before, it may be beneficial to calibrate the measurement system prior to measuring the performance of an RF device that includes push-on connectors.

Challenges in Designing Calibration Standards for Push-on Connectors

There are two primary challenges in developing calibration standards that are useable with push-on connectors (such as the connectors 120, 140 of FIGS. 1A-1C).

First, as shown in FIG. 1A, the distal end of the female push-on connector 120 is slotted. As described above, the slots allow the nib 123 to be pushed past the detent 143 of the male push-on connector 140. A female calibration standard, however, should not be slotted, as such slots would introduce uncertainty and error into the mathematically determined RF performance of the female calibration standard. As noted above, calibration standards typically include substantially featureless outer and inner conductors (i.e., outer and inner conductors without slots or other irregular geometries). It is important that the calibration standards are featureless so that the RF performance of the calibration standards can be mathematically determined. Thus, it is difficult to design a calibration standard, which should be featureless (i.e., no slots), in a manner that will allow it to connect to a male push-on connector 140.

Second, as shown in FIG. 1C, the detent 143 on the male push-on connector 140 extends past (in a distal direction) the end of the pin 145 of the inner conductor 142, and the slot 125 (which receives the pin 145) in the inner conductor 122 is flush with the distal end of the female inner conductor 122. As noted above, for calibration standards, the inner conductor is ideally only supported by the inner conductor of the connectors to which it is connected. When connecting the inner conductor of a calibration standard, a technician must visually align the inner conductor of the calibration standard with the pin 145 prior to mating them. This cannot be done with standard push-on connector designs because the detent 143 obscures the view of the pin 145 as the interfaces are brought together.

As will be described in greater detail with reference to the embodiments shown in the remaining figures, the calibration devices, systems, and methods described herein may provide solutions to one or more of these problems and can be used to provide calibration standards for use with RF devices that include push-on connectors.

Example Devices, Systems, and Methods for a Male Calibration System

As used herein, a male calibration system can be configured for use with RF devices that include female push-on connectors. A male calibration system can include one or more male calibration connectors and one or more female calibration standards, among other things. The male calibration connectors can include a first end configured to connect to (1) the female calibration standards (for, example, during calibration) and to also connect to (2) a female push-on connector (for example, to a female push-on connector of an RF device to be tested or measured by the analyzer). A second end of the male calibration connector can be configured to connect to a test port of the analyzer or a connector at a distal end of a cable connected to the test port of the analyzer.

Example Male Calibration Connector

Figure 2A:
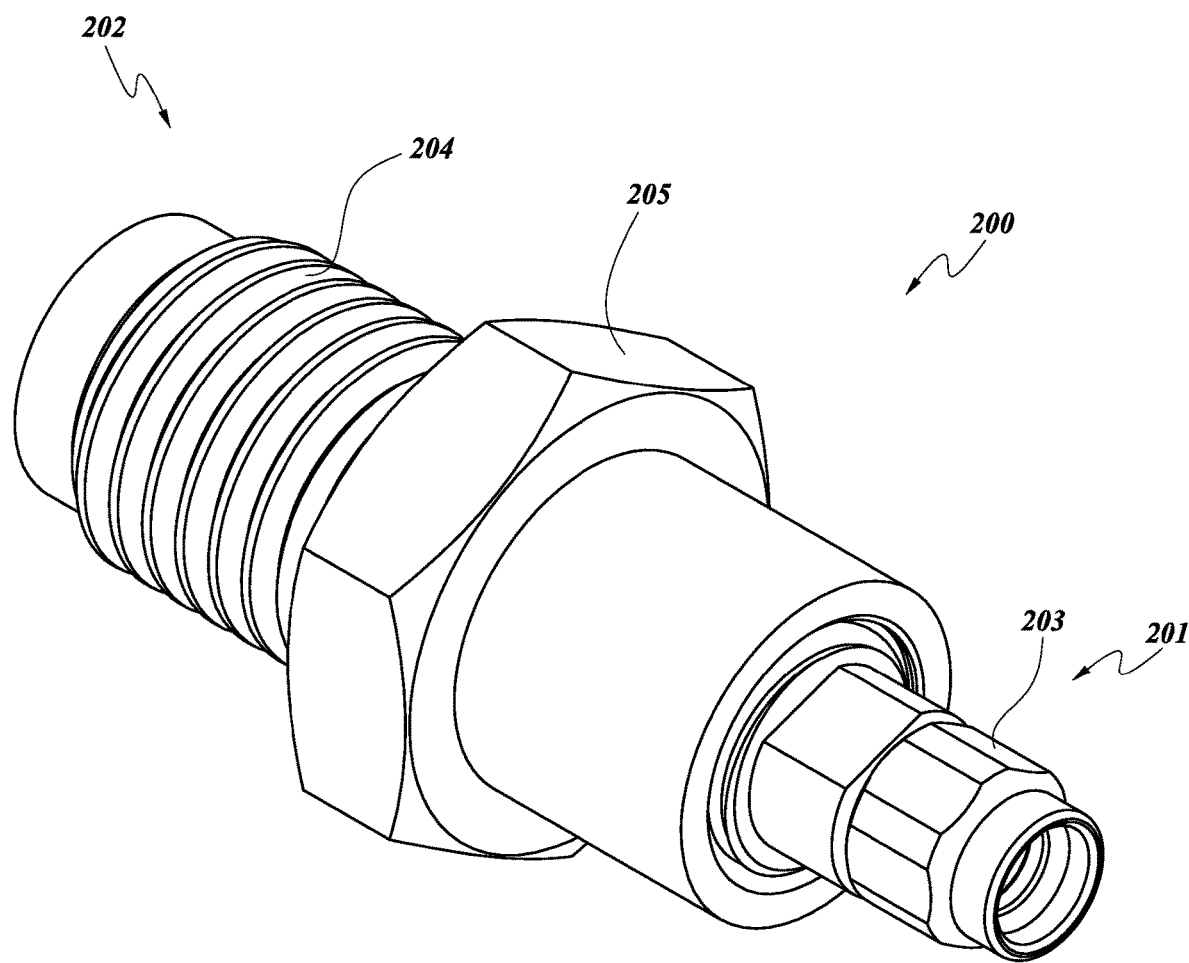
FIG. 2A is an isometric view of an embodiment of a male calibration connector.

FIG. 2A is an isometric view of an embodiment of a male calibration connector 200. The male calibration connector 200 includes a first end 201 and a second end 202. The first end 201 includes a removable detent portion 203. As will be described more fully below, with the removable detent portion 203 installed on the first end 201, the male calibration connector 200 is configured to connect to a female push-on connector (such as female push-on connector 120 of FIG. 1A). With the removable detent portion 203 removed from the first end 201, the first end 201 of the male calibration connector 200 is configured to connect to a female calibration standard (for example, the female calibration standard 300 shown in FIG. 3A). The first end 201 and the removable detent portion 203 will be described in greater detail below with reference to FIGS. 2B-2D.

The second end 202 of the male calibration connector 200 can be configured to connect to a test port of an analyzer or to a connector at a distal end of a cable connected to the test port of the analyzer. In the illustrated embodiment, the second end 202 is configured as a 1.85 mm female coaxial connector, including a threaded portion 204. Many analyzer test ports and connectors on coaxial cables use 1.85 mm male coaxial connectors, and a male calibration connector 200 with a second end 202 configured as illustrated is configured to connect thereto. The illustrated embodiment of the second end 202, however, is provided merely as one example of many. As another example, the second end 202 can be configured as a 1.85 mm male coaxial connector. In some embodiments, the second end 202 can be configured as any type of coaxial or RF connector without limit. Those skilled in the art will appreciate that the configuration of the second end 202 can be widely varied such that the male calibration connector 200 can be connected to a wide variety of RF or coaxial connectors, adapters, cables, ports, interfaces, etc.

As illustrated, for some embodiments, the male calibration connector 200 includes a tool engagement structure 205. The tool engagement structure 205 can be configured to engage a tool, such as a wrench or other tool, as an aid for holding, securing, or tightening the male calibration connector 200 during use. The tool engagement structure 205 can be positioned between the first end 201 and the second end 202. In the illustrated embodiment, the tool engagement structure 205 comprises a hexagonal body in the shape of a nut.

FIGS. 2B-2D show certain features of the first end 201 of the male calibration connector 200 in greater detail. FIG. 2B is a cross-sectional detail view of the first end 201 with the removable detent portion 203 installed thereon. FIG. 2C is a cross-sectional detail view of the first end 201 with the removable detent portion 203 removed. FIG. 2D is cross-sectional view of the removable detent portion 203 alone.

As shown in FIGS. 2B and 2C, the male calibration connector 200 includes an outer conductor 206 and an inner conductor 207. The outer conductor 206 can be annular. The outer conductor 206 can surround the inner conductor 207. The outer conductor 206 and the inner conductor 207 can be coaxial on an axis 208. The outer conductor 206 and the inner conductor 207 can extend from the first end 201 to the second end 202 of the male calibration connector 200 such that an RF signal can be transmitted through the male calibration connector 200 by the outer conductor 206 and the inner conductor 207. A reference plane RP, indicating the plane in which an RF signal is transferred to or from the male calibration connector 200 to a corresponding connector is illustrated.

The outer conductor 206 can include an inner surface 210. The inner surface can define a bore 211 through the body of the outer conductor 206. The bore 211 may extend along the axis 208. The inner conductor 207 can be positioned within the bore 211. The inner surface 210 and the bore 211 can be substantially cylindrical. The inner surface 210 can be substantially smooth. The inner surface 210 can have a substantially constant diameter along its length. In some embodiments, the inner surface 210 extends in a distal direction to the reference plane RP. In some embodiments, at the reference plane RP, the bore 211 widens to form a recess 213 having a diameter that is larger than the diameter of the inner surface 210. Thus, as illustrated, for some embodiments, the bore 211 extends through the first end 201 having a larger diameter at the recess 213 on a distal side of the reference plane RP and a smaller diameter at the inner surface 210 on the opposite side of the reference plane RP. As illustrated, for some embodiments, a surface 214 connects the recess 213 to the inner surface 210. The surface 214 may be flat. The surface 214 may lie in a plane orthogonal to the axis 208. The surface 214 may lie in the reference plane RP. The bore 211 (including the inner surface 210, surface 214, and/or recess 213) can be tightly toleranced (e.g., made to a precise size) and is typically defined within the various specifications that apply to push-on RF connectors. This bore 211 can affect the electrical performance of the male calibration connector 200 when mated. In use, the inner surface 210 of the outer conductor 206 can conduct the electrical signal. A distal end of the outer conductor 206 may extend onto a distal side of the reference plane RP to a distal tip 218. The distal tip 218 can comprise a surface. The surface of the distal tip 218 can be flat. The surface of the distal tip 218 can lie in a plane parallel to the reference plane RP.

The inner conductor 207 can comprise a body with an outer surface 212. The outer surface 212 can be substantially cylindrical. The outer surface 212 can be substantially smooth. The outer surface 212 can be tightly toleranced (e.g., made to a precise size) and is typically defined within the various specifications that apply to push-on RF connectors. In use, the outer surface 212 can conduct the electrical signal. In some embodiments, the outer surface 212 extends in a distal direction to the reference plane RP. In some embodiments, at the reference plane RP, the inner conductor 207 narrows from the outer surface 212 to form a pin 215. An outer surface 216 of the pin 215 can have a diameter smaller than the diameter of the outer surface 212. In some embodiments, a distal tip of the pin 215 can be rounded, pointed, or flat. As illustrated, for some embodiments, the inner conductor 207 extends through the first end 201 having a smaller diameter forming the pin 215 on the distal side of the reference plane RP and a larger diameter at the outer surface 212 on the opposite side of the reference plane RP. As illustrated, for some embodiments, a surface 217 connects the outer surface 212 to the outer surface 216 of the pin 215. The surface 217 may be flat. The surface 217 may lie in a plane orthogonal to the axis 208. The surface 217 may lie in the reference plane RP.

A support structure 209 can support the inner conductor 207 within the outer conductor 206. The support structure 209 can extend between the outer conductor 206 and the inner conductor 207. The inner conductor 207 can extend through the support structure 209. In some embodiments, the diameter of the outer surface 212 of the inner conductor 207 narrows in the region of the inner conductor 207 that extends through the support structure 209. The support structure 209 can comprise a dielectric material. The support structure 209 can be a dielectric bead. The outer surface 212 of the inner conductor 207 can be spaced apart from the inner surface 210 of the outer conductor 206.

As shown in FIG. 2C, an outer surface 219 of outer conductor 206 can include a threaded portion 220. The threaded portion 220 can be configured to engage a corresponding threaded portion 221 on the removable detent portion 203. The interaction between the threaded portion 220 and the threaded portion 221 allows the removable detent portion 203 to be removably coupleable to the first end 201 of the male calibration connector 200. FIGS. 2A and 2B illustrate the first end 201 of the male calibration connector 200 with the removable detent portion 203 installed thereon. FIGS. 2C and 2D show the first end 201 with the removable detent portion 203 removed. Although threaded portions 220, 221 are illustrated in the figures, other structures, mechanisms, and methods are possible for removably coupling the removable detent portion 203 to the first end 201 of the male calibration connector 200. For example, spring loaded retaining balls and corresponding recesses, pins, mechanical fasteners such as screws, etc., can be used With reference to 2D, the removable detent portion 203 can comprise an body 222. The body 222 may be annular. The body 222 may be open on both ends. A first portion 223 of the removable detent portion 203 can include the threaded portion 221 or other structure for removably coupling the removable detent portion 203 to the first end 201 of the male calibration connector 200. A second portion 224 of the removable detent portion 203 can be configured in size and shape to correspond to or mimic the distal portion of a male push-on connector (such as male push-on connector 140 of FIG. 1B).

In some embodiments, the features of the second portion 224 of the removable detent portion 203 help to align a female push-on connector and to hold the female push-on connector in the mated condition. For example, the second portion 224 can include a detent 225. The detent 225 can be configured as a protrusion extending radially inward from an inner surface of the removable detent portion 203. The size and shape of the detent 225 can be configured to match the size and shape of detent 143 of the male push-on connector 140 (compare FIG. 1B). The second portion 224 can also include a lead in chamfer 226, a first cylindrical bore 227, a tapered portion 228, and a second cylindrical bore 229 as shown. The lead in chamfer 226 can be configured such that it captures (or guides) a female push-on connector (not shown) as the connectors are brought together. In some embodiments, there may be no lead in chamfer 226 and the first cylindrical bore 227 can extend to the distal end. The first cylindrical bore 227 can help minimize angular movements of the mated connectors when in the fully mated condition. The tapered portion 228 can extend between the first cylindrical bore 227 and the second cylindrical bore 230. The tapered portion 228 can provide an angled surface that guides the flexible arms of the outer conductor of a female push-on connector as they deflect inwardly as the connectors are mated. The second cylindrical bore 230 may have a smaller diameter than first cylindrical bore 227. The detent 225 may comprise the second cylindrical bore 230. The detent 225 may also comprise another tapered portion 229. The tapered portion 229 may facilitate unmating of the male calibration connector 200 from a female push-on connector.

With the removable detent portion 203 installed (FIG. 2B), the male calibration connector 200 functions in a manner similar to the male push-on connector 140 (compare FIGS. 1B and 2B). That is, with the removable detent portion 203 installed, the male calibration connector 200 can be pushed together to engage a female push-on connector 120 (see FIGS. 5A-5C described below). With the removable detent portion 203 removed (FIG. 2B), the male calibration connector 200 can be connected to a female calibration standard (such as the female calibration standard 300 of FIG. 3A) for use during calibration (see FIGS. 4A-4F described below). In some embodiments, the removable detent portion 203 is removed during calibration and reinstalled after the calibration process is completed.

The materials from which the male calibration connector 200 (including the outer and inner conductors 206, 207 and/or removable detent portion 203) is made can include copper alloys, steel alloys, or other suitable metals or materials. In some embodiments, the outer and inner conductors 206, 207 and/or removable detent portion 203 are plated with gold or other materials to improve conductivity.

In some embodiments, the male calibration connector 200 can be configured for use with any of a plurality of different removable detent portions 203. Each removable detent portion 203 may have a different sized detent 225 (e.g., different diameters) providing a different insertion and/or retention force. A user may vary the insertion or retention force of the male calibration 200 by selecting different removable detent portions 203 as desired.

The above-described design for a male calibration connector 200 is compatible with standard push-on connector interfaces of various sizes. Presently, standard designs are available in line sizes from 1 millimeter to 7 millimeter. Other sizes can be accommodated using this design as well.

Example Female Calibration Standard

Figure 3A:
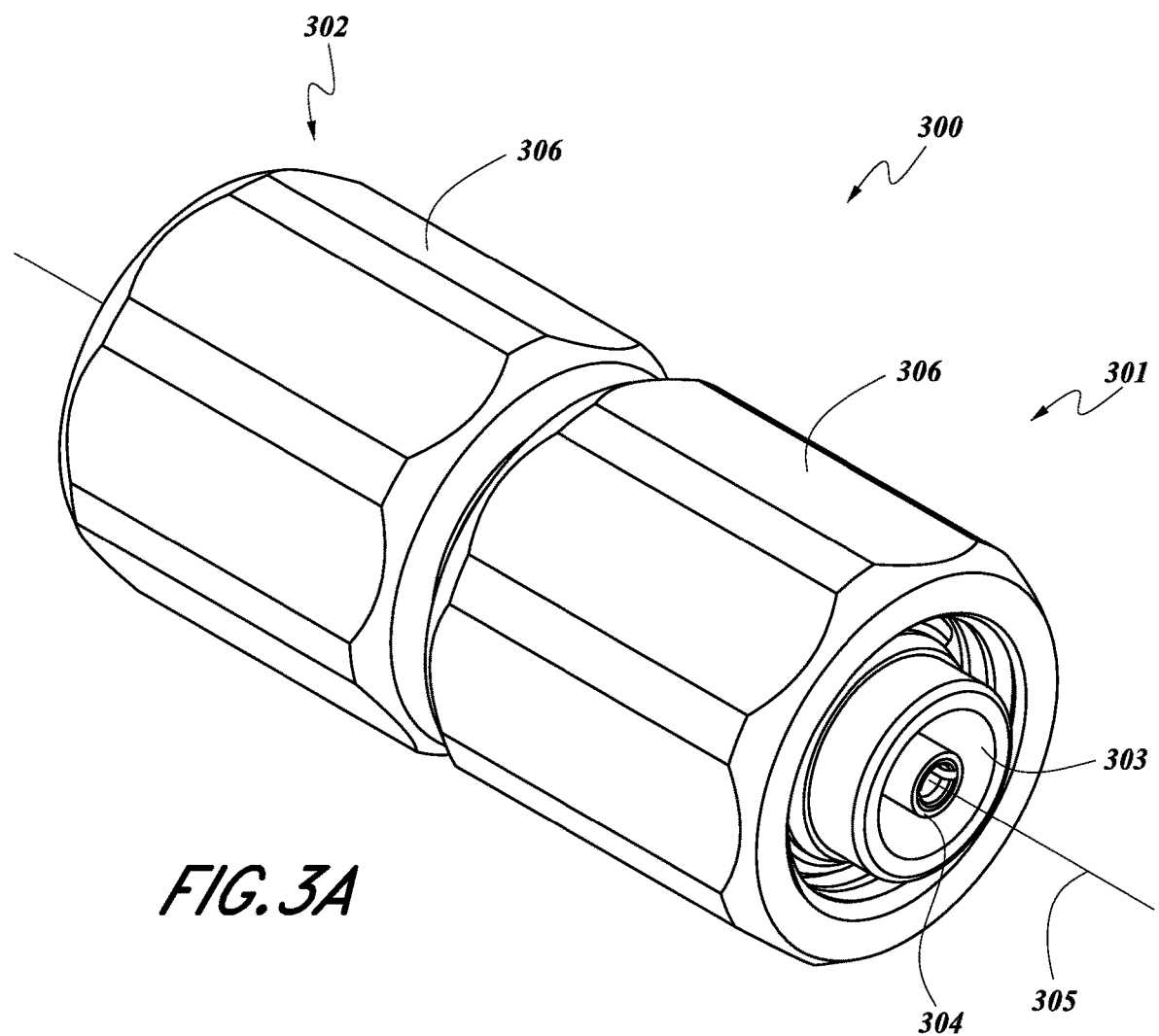
FIG. 3A is an isometric view of an embodiment of a female calibration standard including an outer conductor and an inner conductor.

During calibration, the male calibration connector 200 is configured to be connected (with the removable detent portion 203 removed) to a female calibration standard 300 shown in FIGS. 3A-3C. FIG. 3A is an isometric view of an embodiment of the female calibration standard 300 including an outer conductor 303 and an inner conductor 304. The female calibration standard 300 extends between a first end 301 and a second end 302 along an axis 305. The first end 301 and the second end 302 may be substantially similar, but oriented in opposite directions. As illustrated, for some embodiments, each of the first and second ends 301, 302 includes a coupling mechanism 306. The coupling mechanism 306 is configured to engage the first end 201 of a male calibration connector 200 (with the removable detent portion 203 removed). In the illustrated embodiment, the coupling mechanism 306 comprises a rotatable retaining nut, although other structures, mechanisms, and devices can be used, including spring loaded retaining balls and corresponding recesses, pins, mechanical fasteners such as screws, etc. For some embodiments, during use, a male calibration connector 200 is connected to both the first end 301 and the second end 302 of the female calibration standard 300 during calibration.

As will be described below, the outer and inner conductors 303, 304 include substantially featureless surfaces that can conduct the electrical signal. The outer and inner conductors 303, 304 can extend along the axis 305. In FIG. 3A, the outer and inner conductors 303, 304 are shown as coaxially positioned. This may be the position of the outer and inner conductors 303, 304 during calibration. However, typically the inner conductor 304 is not connected to the outer conductor 305. Rather, during calibration the inner conductor 304 is supported within the outer conductor 303 by the inner conductors 207 of the male calibration connectors 200 to which it is connected.

FIG. 3B is a cross-sectional view of the outer conductor 303 of the female calibration standard 300. The outer conductor 303 comprises a generally annular body extending between the first end 301 and the second 302. The first end 301 and the second end 302 of the outer conductor 303 each lie in a reference plane RP. In some embodiments, each of the first end 301 and the second end 302 comprise flat surfaces 309. The surfaces 309 can lie in the reference planes RP.

An inner surface 307 defines a bore 308 through the outer conductor 303. The inner surface 307 may be a cylindrical surface and the bore 308 may be cylindrical. The inner surface 307 may be substantially smooth. The inner surface 307 may be substantially featureless. The inner surface 307 may not include any slots (for example, it may not include slots like those present on the outer conductor 121 of the female push-on connector 120). The inner surface 307 and bore 308 may be tightly toleranced (e.g., made with precision) and may have a fine surface finish. The inner surface 307 may conduct electrical signals during calibration.

As illustrated, for some embodiments, each end of the outer conductor 303 is fitted with a coupling mechanism 306 configured to secure the outer conductor 303 to a male calibration connector 200. As noted above, in the illustrated embodiment, the coupling mechanism 306 comprises a retaining nut. The retaining nuts 306 can be slidingly and/or rotatably mounted on an outer surface 310 of the outer conductor 303. For example, the retaining nuts 306 can include openings 311 through which the outer conductor 303 extends. The openings can be configured in size and shape such the retaining nuts 306 are loosely mounted on the outer conductor 303 in a manner that allows them to slide axially along the outer conductor 303 and also to rotate around the axis 305. Retaining rings 312 can be positioned on the outer surface 310 of the outer conductor to prevent the retaining nuts 306 from sliding off the outer conductor 303. The retaining rings 312 can be partially received in grooves 313 formed on the outer surface 310 of the outer conductor. The retaining rings 312 and/or the grooves 313 can be annular. In some embodiments, the retaining rings 312 comprise a generally triangular cross-section as shown, although other cross-sectional shapes are also possible. The retaining nuts 306 can include a threaded portion 314. The threaded portion 314 may be an interior threaded portion. The threaded portion 314 can be positioned so as to engage the threaded portion 220 on the first end of a male calibration connector 200 when the removable detent portion 203 is removed. In some embodiments, the threaded portion 314 engages the same threaded portion 220 as the removable detent portion 203. That is, for some embodiments, either the retaining nut 306 or the removable detent portion 203 engages the threaded portion 220 of the male calibration connector 200. When the retaining nut 306 is engaged with the threaded portion 220 of the male calibration connector 200, the surface 309 contacts the surface 214 of the male calibration connector 200 in the reference plane RP. Thus, an electrical signal can pass from the inner surface 210 of the male calibration connector 200 to the inner surface 307 of the outer conductor 303 of the female calibration standard at the reference plane RF.

FIG. 3C is a cross-sectional view of the inner conductor 304 of the female calibration standard 300. The inner conductor 304 includes a body 315. The body 315 can be cylindrical. The body 315 can have an outer surface 316. The diameter of the outer surface 316 can be substantially constant along its length. The outer surface 316 can be substantially smooth. The outer surface 316 can be substantially featureless. The outer surface 316 can be tightly toleranced (e.g. precisely made) and have a fine surface finish.

The inner conductor 304 extends between the first end 301 and the second end 302. Each of the first end 301 and the second end 302 can lie in a reference plane RP as shown. Each end 301, 302 of the inner conductor 304 can include a bore 317 extending axially into the inner conductor 304. In some embodiments, the bore 317 is configured in size and shape to receive the pin 215 of the inner conductor 207 of a male calibration connector 200. In some embodiments, the bore 317 receives an insert 318 as illustrated. The insert 318 can include an axial bore 319. The bore 319 can be configured in size and shape to receive the pin 215 of the inner conductor 207 of a male calibration connector 200. The insert 319 can be adhesively mounted inside the bore 317.

During calibration, the inner conductor 303 is supported by the pins 215 of the male calibration connectors 200 to which it is attached. As noted above, the pins 215 are received either directly in the bores 317 or within the bores 319 of the inserts 318. Each end of the inner conductor 304 has an end surface 320. The end surfaces 320 can be planar. The end surfaces 320 can lie in the reference planes RP. When supported between two male calibration connectors 200, the end surfaces 320 can contact or abut surfaces 217 on the inner conductors 207 of the male calibration connectors 200. As noted above, during calibration, the inner conductor 304 is not supported by and does not contact the outer conductor 303. The inner conductor 304 may be supported only by the engagement features of the connector to which it is intended to be mated.

The materials from which the outer conductor 303 and the inner conductor 304 are made can include copper alloys, steel alloys, or other suitable metals or materials. The outer conductor 303 and the inner conductor 304 can be plated with gold or other materials to improve conductivity. The outer conductor 303 and the inner conductor 304 can be made from the same material or from different materials.

Example Method of Use

Figure 4C:
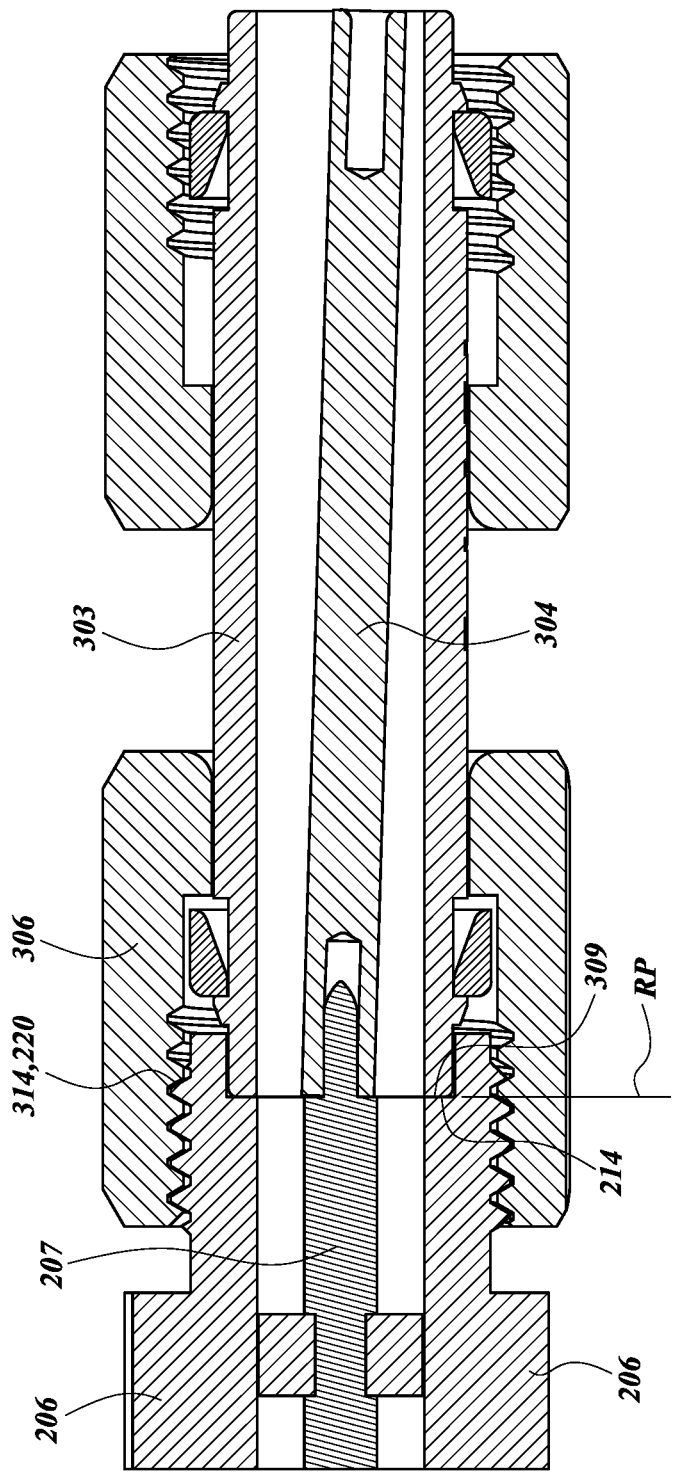
Figure 4D:
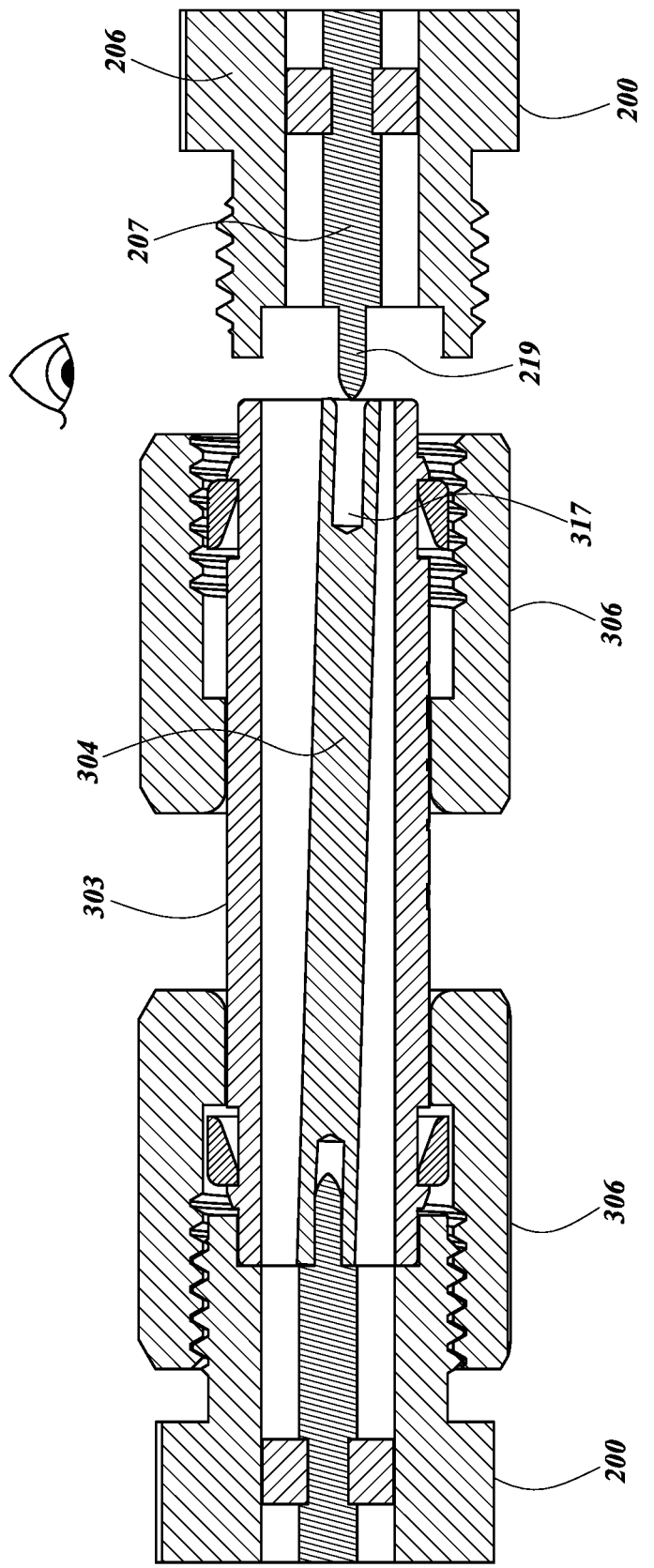

FIGS. 4A-4F are cross-sectional views illustrating several example steps for mating the female calibration standard 300 to the male calibration connector of 200. The second end of the male calibration connector 200 (not shown) is connected to a test port of an analyzer (possibly via a cable). As shown in FIG. 4A, with the removable detent portion 203 removed, the inner conductor 304 of the female calibration standard 300 is installed on the male calibration connector 200. The bore 317 (inserts 318 are not illustrated) of the inner conductor 304 is inserted over the pin 215 of the inner conductor 207.

In FIG. 4B, the outer conductor 303 of the female calibration standard 300 is inserted over the inner conductor 304. The inner conductor 304 is received within the bore 308. In the illustrated embodiment, the retaining nut 306 is slid back to expose the end of the outer conductor 303. This may simplify the process of inserting the outer conductor 303 over the inner conductor 304. As shown, the threaded portion 220 is exposed (because the removable detent portion 203 has been removed). The end surface 309 is moved toward the surface 214.

Figure 4E:
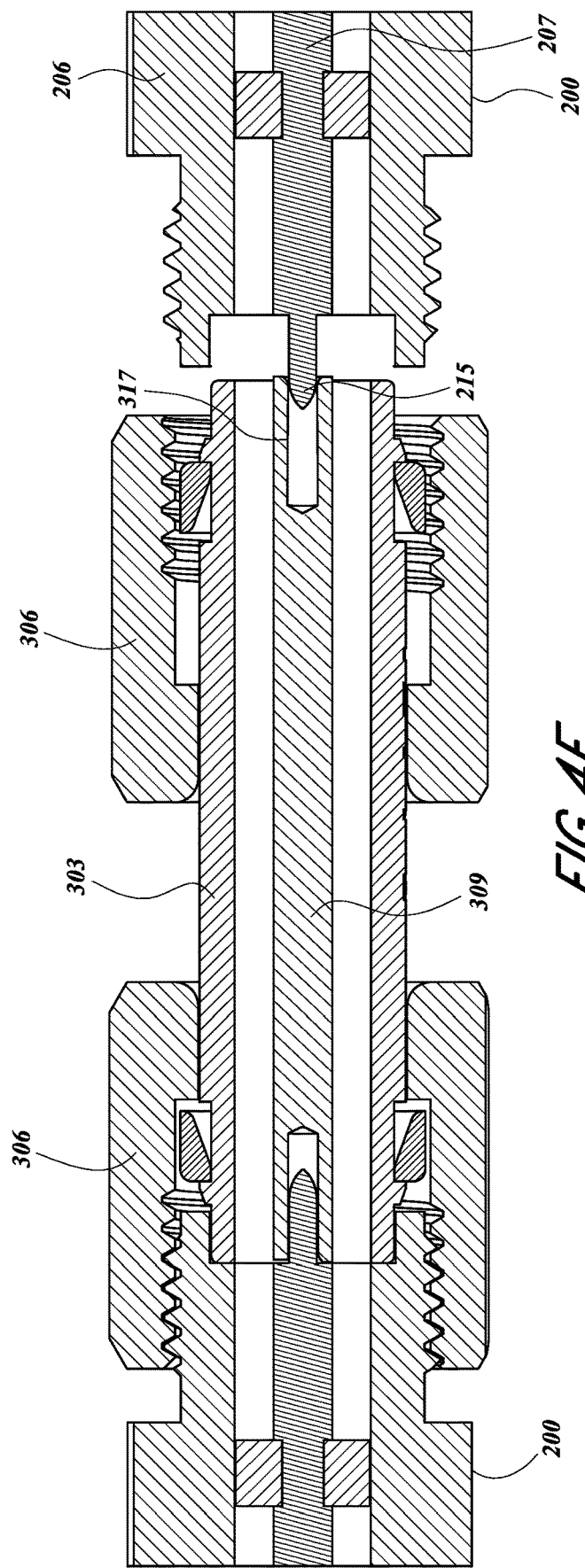

In FIG. 4C, the retaining nut 306 is slid forward and the threaded portion 314 engages the threaded portion 220 of the male calibration connector 200. As the retaining nut 306 is tightened, the retaining nut 306 pulls the outer conductor 303 into position relative to the outer conductor 206 of the male calibration connector 200. The end surface 309 of the outer conductor 303 is brought into contact with the surface 214 of the outer conductor 206 in the reference plane RP In FIG. 4D, the removable detent portion 203 of a second male calibration connector 200 is removed. The pin 215 of the inner conductor 207 is visually aligned (as represented by the illustrated eye) and guided into the bore 317 on the inner conductor 304. Again, the retaining 306 can be slid back to provide visual access to both the pin 215 and the bore 317. In FIG. 4E, the pin 215 is inserted into the bore 317.

Figure 4F:
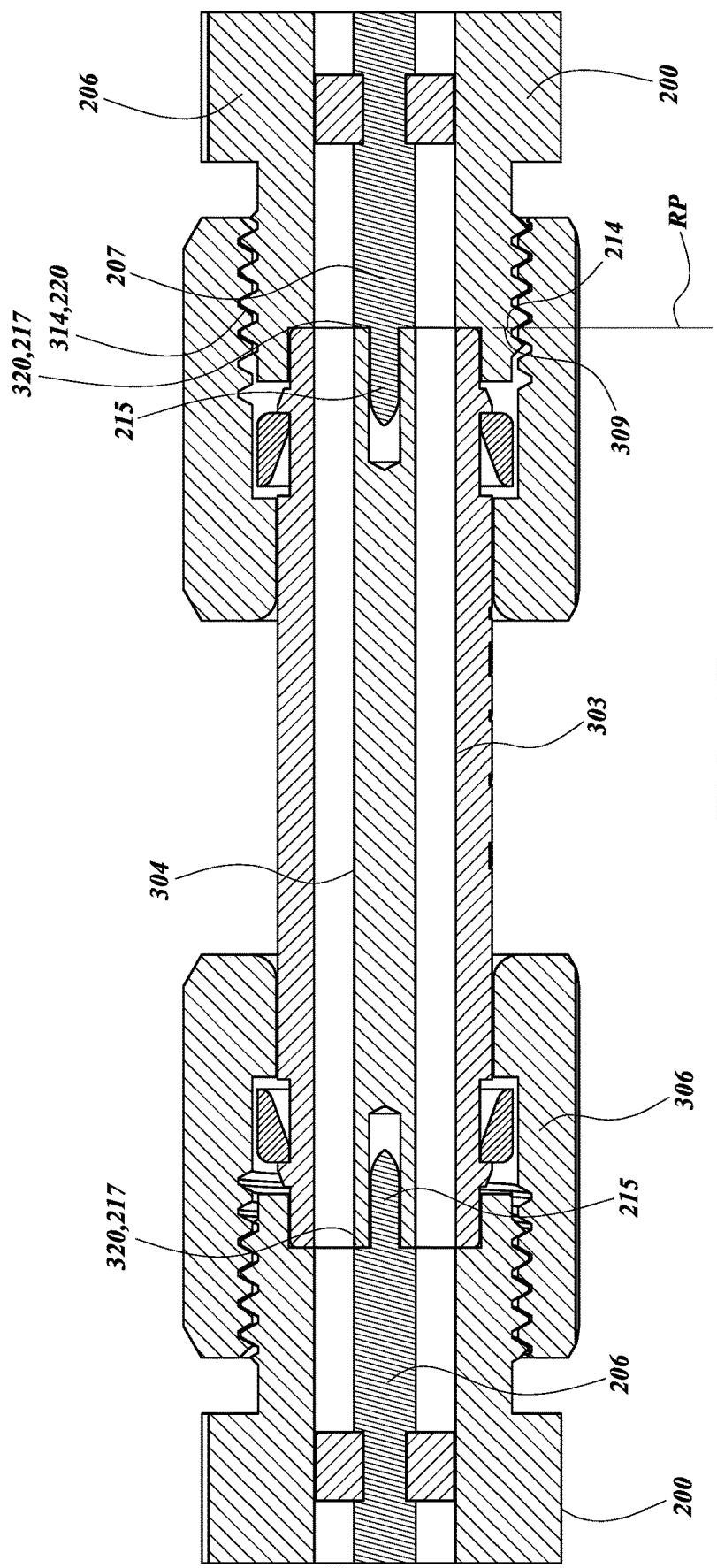

In FIG. 4F, the retaining nut 306 is slid forward and the threaded portion 314 engages the threaded portion 220 of the second male calibration connector 200. As the retaining nut 306 is tightened, the retaining nut 306 pulls the outer conductor 303 into position relative to the outer conductor 206 of the second male calibration connector 200. The end surface 309 of the outer conductor 303 is brought into contact with the surface 214 of the outer conductor 206 in the reference planes RP. Similarly, end surfaces 320 of the inner conductor 304 may be brought into contact with surfaces 217 of the inner conductor 207 of the male calibration connectors 200 in the reference planes RP. As shown, the inner conductor 304 of the female calibration standard 300 is coaxially supported with the outer conductor 303 by the pins 215 of the inner conductors 207 of the male calibration connectors 200. With the female calibration standard 300 connected to the male calibration connectors 200 as shown in FIG. 4F, a calibration process can be performed on an analyzer.

Figure 5B:
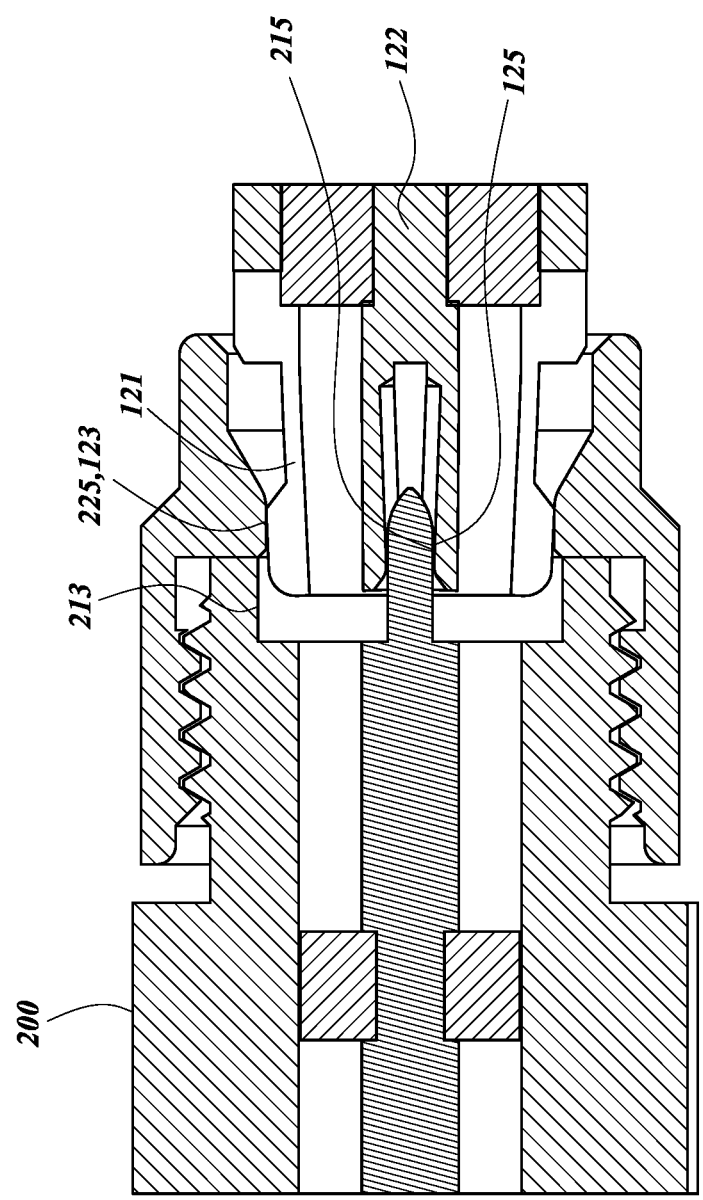
Figure 5C:
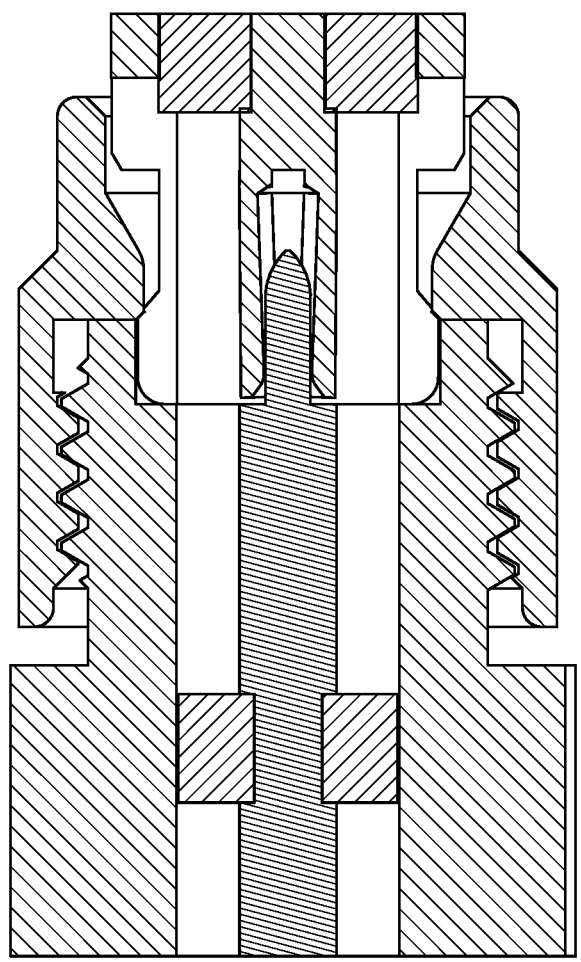

After calibration, the female calibration standard 300 can be removed from the male calibration connectors 200. The male calibration connectors 200 can then be connected to an RF device to be tested or measured such that the now calibrated analyzer can test the RF device. The male calibration connectors 200 are configured for use with RF devices having female push-on connectors. FIGS. 5A-5C are cross-sectional views illustrating several example steps for mating one of the male calibration connectors 200 to a female push-on connector of an RF device.

As shown in FIG. 5A, the removable detent portion 203 is installed on the first end of the male calibration connector 200. Threaded portions 220, 221 are engaged. With the removable detent portion 203 installed, the male calibration connector 200 resembles a male push-on connector 140 (compare FIGS. 1B and 5A). The male calibration connector 200 includes a detent 225 and a recess 213. The male calibration connector 200 is moved toward a female push-on connector 120. The features of the female push-on connector 120 have been previously described with reference to FIG. 1A. The female push-on connector 120 includes a slotted outer conductor 121 and a slotted inner conductor 122. The slotted outer conductor 121 includes flexible arms that have nibs 123 and recesses 124. The slotted inner conductor 122 includes a slot or slots 125.

As shown in FIG. 5B, as the male calibration connector 200 is pushed together with the female push-on connector 120, the flexible arms of the female push-on connector 120 are deflected inward toward the longitudinal axis by contact with the detent 225. The pin 215 is received within the slot 125 of the inner conductor 122.

As the male calibration connector 200 and the female push-on connector 120 are pushed together to the fully mated condition (FIG. 5C), the nibs 123 of the female push-on connector 120 are pushed past the detent 225 of the male calibration connector 200. The flexible arms of the outer conductor 121 recover outwardly by pushing the nibs 123 into the recess 213 of the male calibration connector 200. The spring force of the flexible arms of the outer conductor 121 acting outward causes the nib 123 to be retained axially behind the detent 225. This holds the pair together mechanically and maintains the reference plane of the female push-on connector 120 in close proximity to the reference plane of the male calibration connector 200.

FIGS. 4A-5C illustrate only certain steps in an example method of use for the male calibration connectors 200 and the female calibration standard 300. Methods of use can include other steps than those shown. Not all illustrated steps need be included in all methods of use. The order of steps may be varied as applicable.

Example Devices, Systems, and Methods for a Female Calibration System

As used herein, a female calibration system can be configured for use with RF devices that include male push-on connectors. A female calibration system can include one or more female calibration connectors and one or more male calibration standards, among other things. The female calibration connector can include a first end configured to connect to (1) a male calibration standard (for, example, during calibration) and to also connect to (2) a male push-on connector (for example, to a male push-on connector of a device to be tested or measured by the analyzer). A second end of the female calibration connector can be configured to connect to a test port of the analyzer or a connector at a distal end of a cable connected to the test port of the analyzer.

First Example Female Calibration Connector

Figure 6:
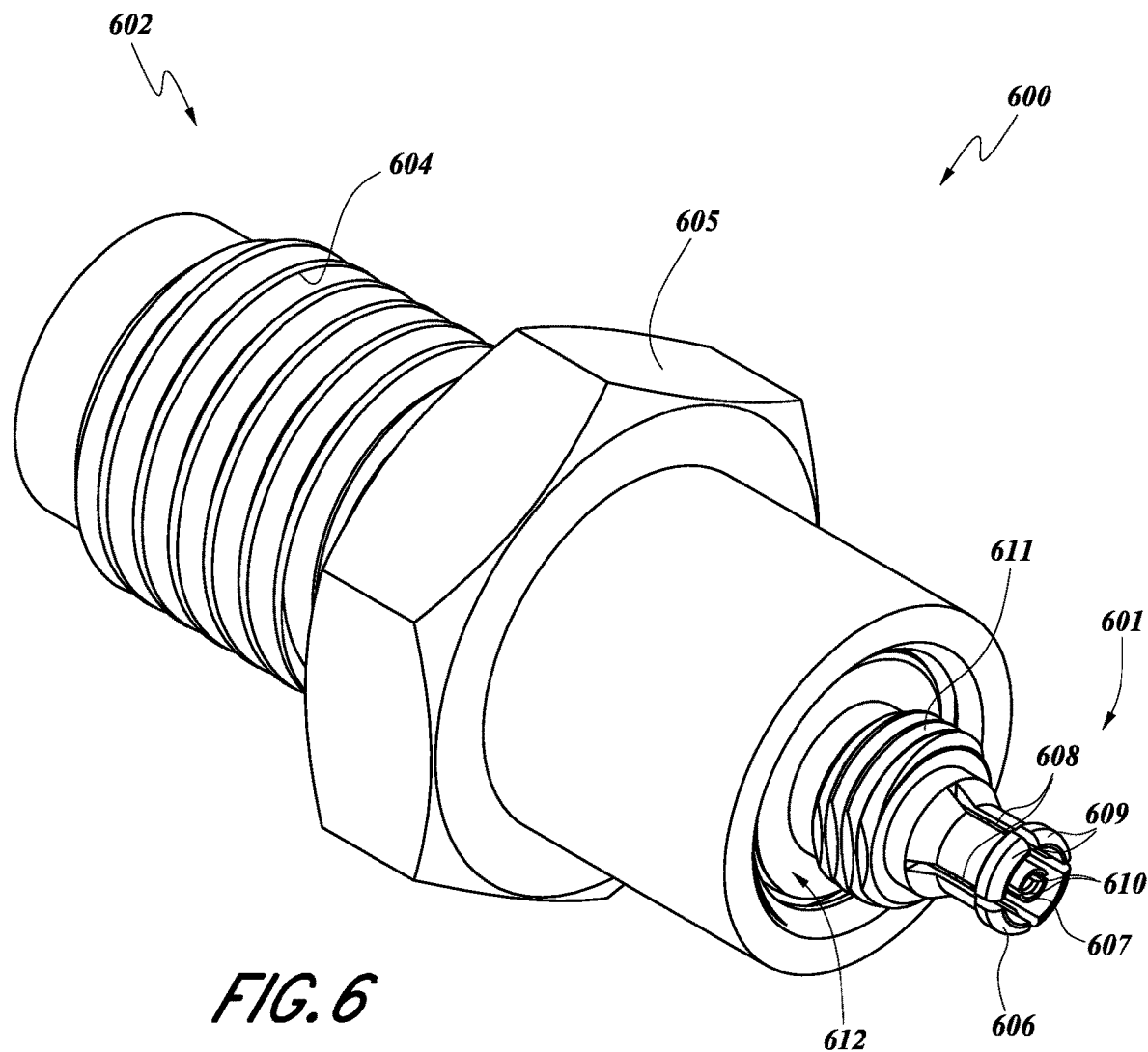
FIG. 6 is an isometric view of an embodiment of a female calibration connector.

FIG. 6 is an isometric view of an embodiment of a female calibration connector 600. The female calibration connector 600 includes a first end 601 and a second end 602. The female calibration connector 600 includes an outer conductor 606 and an inner conductor 607. The distal portions of the outer conductor 606 and the inner conductor 607 are configured in a manner similar to the distal portions of the outer conductor 121 and the inner conductor 122 of the female push-on conductor 120 of FIG. 1A. For example, the outer conductor 606 and the inner conductor 607 are slotted. The slotted outer conductor 606 and the slotted inner conductor 607 allow the first end 601 of the female calibration connector 600 connect to a male push-on connector, such a male push-on connector 140 of FIG. 1B.

The outer conductor 606 includes slots 608 at the distal end thereof. In the illustrated embodiment, six slots 608 are included, but other numbers of slots 608 can be included in other embodiments. The slots 608 divide the distal end of the outer conductor 606 into a plurality of flexible arms. A nib 609 is positioned at the distal tip of each of the flexible arms. The nib 609 can be a protrusion that extends radially outward. The flexible arms and the nibs 609 allow the first end 601 of the female calibration connector 600 to engage with the detent 143 of a male push-on connector 140 in a manner previously described.

The inner conductor 607 includes slots 610. In the illustrated embodiment, the two slots 610 are included, but other numbers of slots 610 can be used in other embodiments. The slots 610 are configured to allow the inner conductor 607 to receive a pin 145 of a male push-on connector 140 in a manner previously described.

The first end 601 of the female push-on connector 600 also includes a threaded portion 611. As will be described below the threaded portion 611 is positioned and configured to engage a corresponding threaded portion 713 on an outer conductor 703 of a male calibration standard 700 (see FIGS. 7A-7C). In some embodiments, the first end 601 of the female calibration connector 600 also includes an annular recess 612 surrounding the threaded portion 714. In some embodiments, the interior of the annular recess 612 is threaded as illustrated.

The second end 602 of the female calibration connector 600 can be configured to connect to a test port of an analyzer or to a connector at a distal end of a cable connected to the test port of the analyzer. In the illustrated embodiment, the second end 602 is configured as a 1.85 mm female coaxial cable connector, including a threaded portion 604. The illustrated embodiment of the second end 602, however, is provided merely as one example of many. As another example, the second end 602 can be configured as a 1.85 mm male coaxial connector. In some embodiments, the second end 602 can be configured as any type of coaxial or RF connector without limit. Those skilled in the art will appreciate that the configuration of the second end 602 can be widely varied such that the female calibration connector 600 can be connected to a wide variety of RF or coaxial connectors, adapters, cables, ports, interfaces, etc.

As illustrated, for some embodiments, the female calibration connector 600 includes a tool engagement structure 605. The tool engagement structure 605 can be configured to engage a tool, such as a wrench or other tool as an aid for holding, securing, or tightening the female calibration connector 600 during use. The tool engagement structure 605 can be positioned between the first end 601 and the second end 602. In the illustrated embodiment, the tool engagement structure 605 comprises a hexagonal body in the shape of a nut.

The materials from which the female calibration connector 600 (including the outer and inner conductors 606, 607) is made can include copper alloys, steel alloys, or other suitable metals or materials. In some embodiments, the outer and inner conductors 606, 607 are plated with gold or other materials to improve conductivity.

The above-described design for a female calibration connector 600 is compatible with standard push-on connector interfaces of various sizes. Presently, standard designs are available in line sizes from 1 millimeter to 7 millimeter. Other sizes can be accommodated using this design as well.

First Example Male Calibration Standard

Figure 7A:
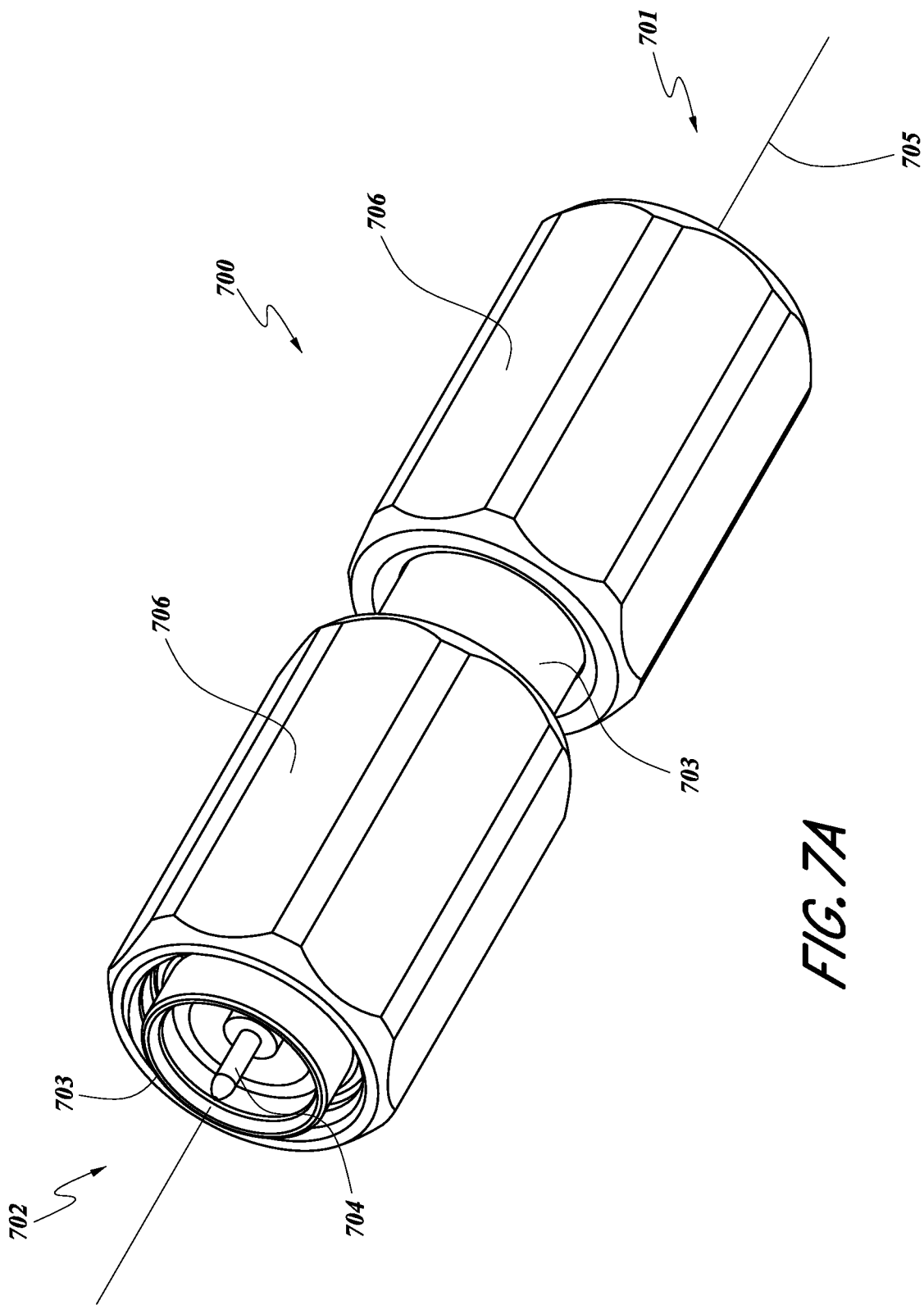
FIG. 7A is an isometric view of an embodiment of a male calibration standard including an outer conductor and an inner conductor.
Figure 7B:
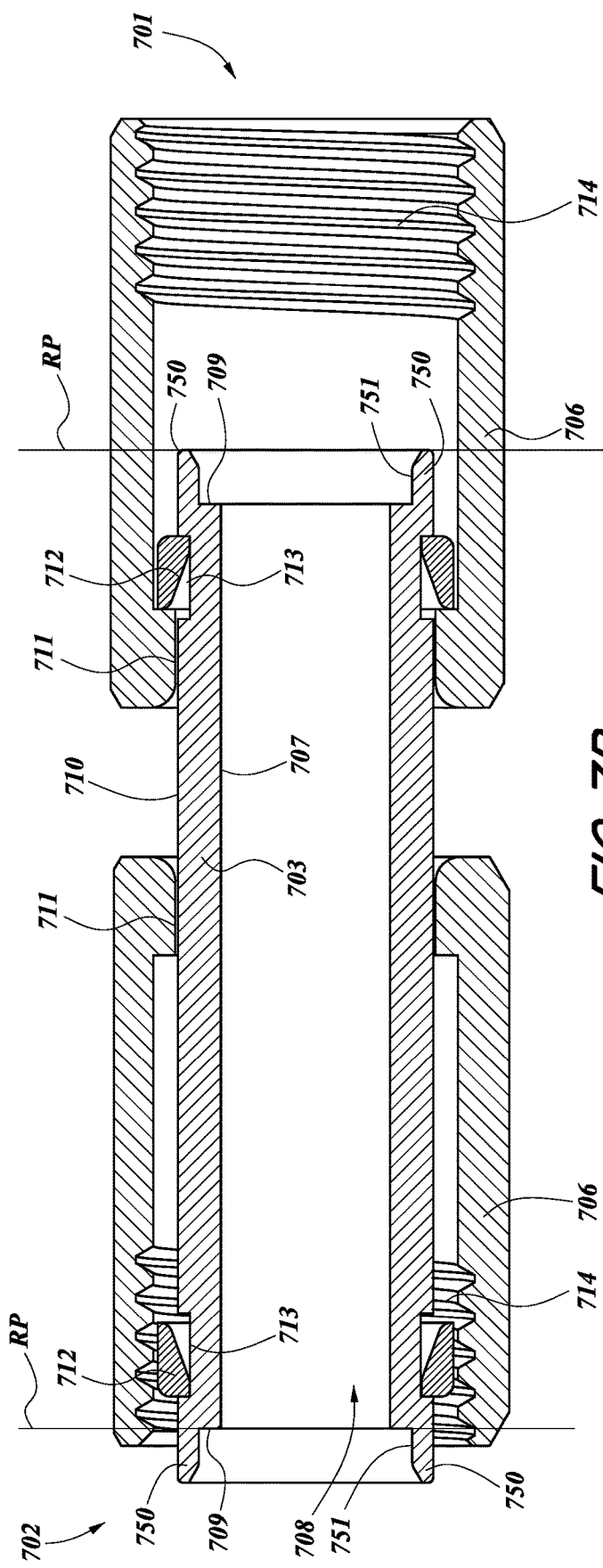
FIG. 7B is a cross-sectional view of the outer conductor of the male calibration standard of FIG. 7A.
Figure 7C:
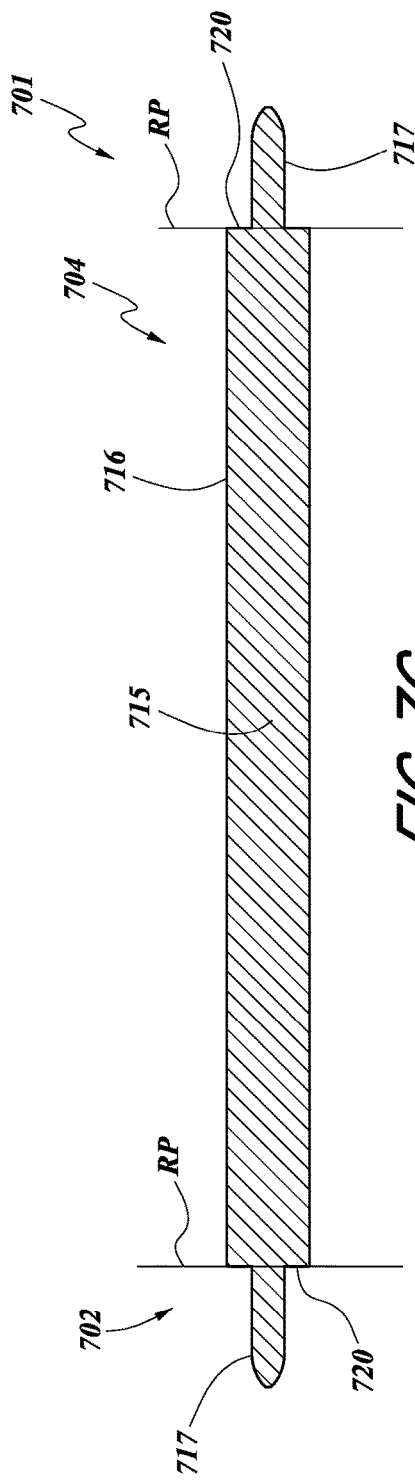
FIG. 7C is a cross-sectional view of the inner conductor of the male calibration standard of FIG. 7A.

During calibration, the female calibration connector 600 is configured to be connected to a male calibration standard 700 shown in FIGS. 7A-7C. FIG. 7A is an isometric view of an embodiment of the male calibration standard 700 including an outer conductor 703 and an inner conductor 704. The male calibration standard 700 extends between a first end 701 and a second end 702 along an axis 705. The first end 701 and the second end 702 may be substantially similar, but oriented in opposite directions. As illustrated, for some embodiments, each of the first and second ends 701, 702 includes a coupling mechanism 706. The coupling mechanism 706 is configured to engage the first end 601 of a female calibration connector 600. In the illustrated embodiment, the coupling mechanism 706 comprises a rotatable retaining nut, although other structures, mechanisms, and devices can be used, including spring loaded retaining balls and corresponding recesses, pins, mechanical fasteners such as screws, etc. For some embodiments, during use a female calibration connector 600 is connected to both the first end 701 and the second end 702 of the male calibration standard 700 during calibration.

As will be described below, the outer and inner conductors 703, 704 include substantially featureless surfaces that can conduct the electrical signal. The outer and inner conductors 703, 704 can extend along the axis 705. In FIG. 7A, the outer and inner conductors 703, 704 are shown as coaxially positioned. This may be the position of the outer and inner conductors 703, 704 during calibration. However, typically the inner conductor 704 is not connected to the outer conductor 705. Rather, during calibration the inner conductor 704 is supported within the outer conductor 703 by the inner conductors 607 of the female calibration connectors 600 to which it is connected.

FIG. 7B is a cross-sectional view of the outer conductor 703 of the male calibration standard 700. The outer conductor 703 comprises a generally annular body extending between the first end 701 and the second 702. The first end 701 and the second end 702 of the outer conductor 703 may each extend beyond a reference plane RP as shown. In some embodiments, the first end 701 and the second end 702 each lie in the reference planes RP. In some embodiments, the outer conductor 703 include flat surfaces 709 proximal the first and second ends 701, 702. The surfaces 709 can lie in the reference planes RP. Flanges 750 can project outwardly from the flat surfaces 709 to the first and second ends 701, 702. The flanges 750 can be annular. The flanges 750 may define a recess 751 positioned distally or beyond the reference planes RP.

An inner surface 707 defines a bore 708 through the outer conductor 703. The inner surface 707 may be a cylindrical surface and the bore 708 may be cylindrical. The inner surface 707 may be substantially smooth. The inner surface 707 may be substantially featureless. The inner surface 707 may not include any slots. The inner surface 707 and bore 708 may be tightly toleranced (e.g., made with precision) and may have a fine surface finish. The inner surface 707 may conduct electrical signals during calibration.

As illustrated, for some embodiments, each end of the outer conductor 703 is fitted with a coupling mechanism 706 configured to secure the outer conductor 703 to a female calibration connector 600. As noted above, in the illustrated embodiment, the coupling mechanism 706 comprises a retaining nut. The retaining nuts 706 can be slidingly and/or rotatably mounted on an outer surface 710 of the outer conductor 703. For example, the retaining nuts 706 can include openings 711 through which the outer conductor 703 extends. The openings 711 can be configured in size and shape such the retaining nuts 706 are loosely mounted on the outer conductor in a manner that allows them to slide axially along the outer conductor 703 and also to rotate around the axis 705. Retaining rings 712 can be positioned on the outer surface 710 of the outer conductor 703 to prevent the retaining nuts 706 from sliding off the outer conductor 703. The retaining rings 712 can be partially received in grooves 713 formed on the outer surface 710 of the outer conductor. The retaining rings 712 and/or the grooves 713 can be annular. In some embodiments, the retaining rings 712 comprise a generally triangular cross-section as shown, although other cross-sectional shapes are also possible. The retaining nuts 706 can include a threaded portion 714. The threaded portion 714 may be an interior threaded portion 714. The threaded portion 714 can be positioned so as to engage the threaded portion 611 on the first end of a female calibration connector 600. When the retaining nuts 706 are engaged with the threaded portion 611 of the female calibration connector 600, the surface 709 contacts the distal ends of the flexible arms of the outer conductor 603 of the female calibration connector 600 in the reference plane RP. Thus, an electrical signal can pass from the inner surface of the outer conductor 603 of the female calibration connector 600 to the inner surface 707 of the outer conductor 703 of the male calibration standard 700 at the reference plane RF. The flanges 750 create the recess 751 which can also receive the distal ends of the flexible arms of the outer conductor 603 of the female calibration connector 600.

FIG. 7C is a cross-sectional view of the inner conductor 704 of the male calibration standard 700. The inner conductor 704 includes a body 715. The body 715 can be cylindrical. The body 715 can have an outer surface 716. The diameter of the outer surface 716 can be substantially constant along its length. The outer surface 716 can be substantially smooth. The outer surface 716 can be substantially featureless. The outer surface 716 can be tightly toleranced (e.g. precisely made) and have a fine surface finish.

The inner conductor 704 extends between the first end 701 and the second end 702. Each of the first end 701 and the second end 702 can include a surface 720 that lies in a reference plane RP as shown. Each end 701, 702 of the inner conductor 704 can include a pin 717 extending axially from the surface 720 beyond the reference planes RP.

During calibration, the inner conductor 703 is supported by the pins 717 which are received within the slot 610 of the inner conductor 607 of the female calibration connectors 600 to which it is attached. When supported between two female calibration connectors 600, the end surfaces 720 can contact or abut the end surfaces of the inner conductors 607 of the female calibration connectors 600. As noted above, during calibration, the inner conductor 704 is not supported by and does not contact the outer conductor 703. The inner conductor 704 may be supported only by the engagement features of the connector to which it is intended to be mated.

The materials from which the outer conductor 703 and the inner conductor 704 are made can include copper alloys, steel alloys, or other suitable metals or materials. The outer conductor 703 and the inner conductor 704 can be plated with gold or other materials to improve conductivity. The outer conductor 703 and the inner conductor 704 can be made from the same material or from different materials.

First Example Method of Use

Figure 8C:
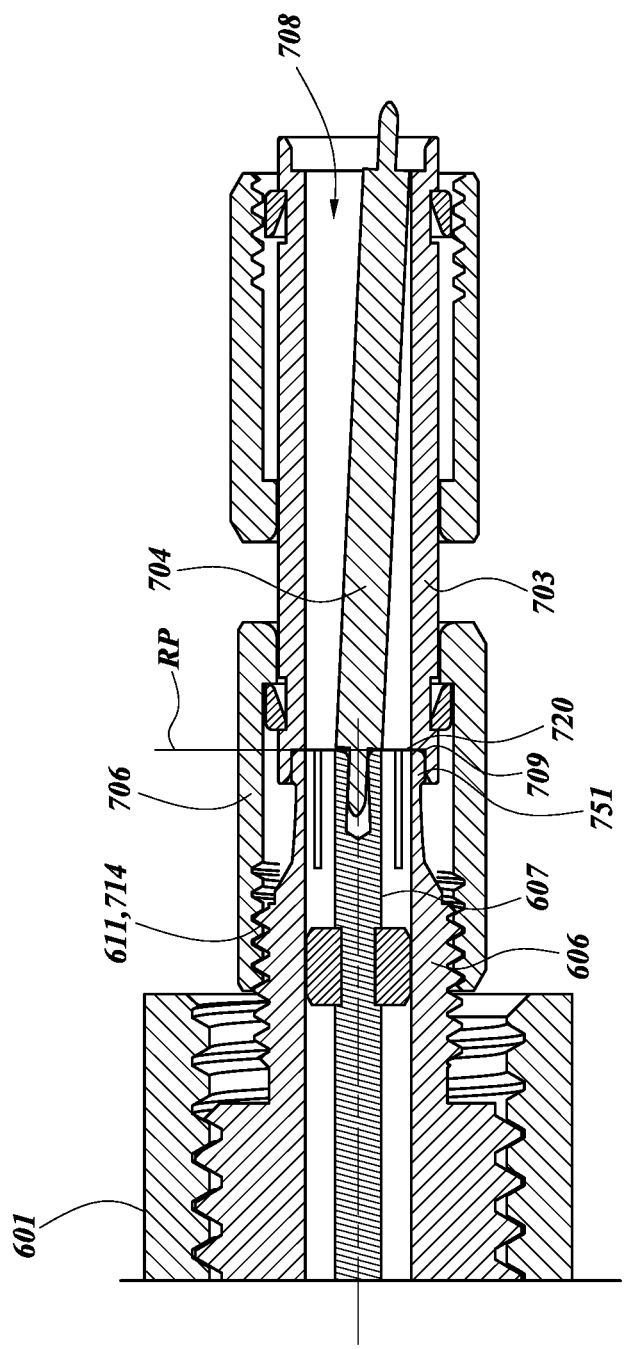

FIGS. 8A-8F are cross-sectional views illustrating several example steps for mating the male calibration standard 700 to the female calibration connector 600. The second end of the female calibration connector 600 (not shown) is connected to a test port of an analyzer (possibly via a cable). As shown in FIG. 8A, the inner conductor 704 of the male calibration standard 700 is connected to the female calibration connector 600. The pin 717 of the inner conductor 704 is inserted into the slot 610 of the inner conductor 607.

In FIG. 8B, the outer conductor 703 of the male calibration standard 700 is inserted over the inner conductor 704. The inner conductor 704 is received within the bore 708. In the illustrated embodiment, the retaining nut 706 is slid back to expose the end of the outer conductor 703. That may simplify the process of inserting the outer conductor 703 over the inner conductor 704.

In FIG. 8C, the retaining nut 706 is slid forward and the threaded portion 714 engages the threaded portion 611 of the female calibration connector 600. As the retaining nut 706 is tightened, the retaining nut 706 pulls the outer conductor 703 into position relative to the outer conductor 606 of the female calibration connector 600. The end surface 709 of the outer conductor 703 is brought into contact with the distal end of the outer conductor 606 in the reference plane RP.

Figure 8D:
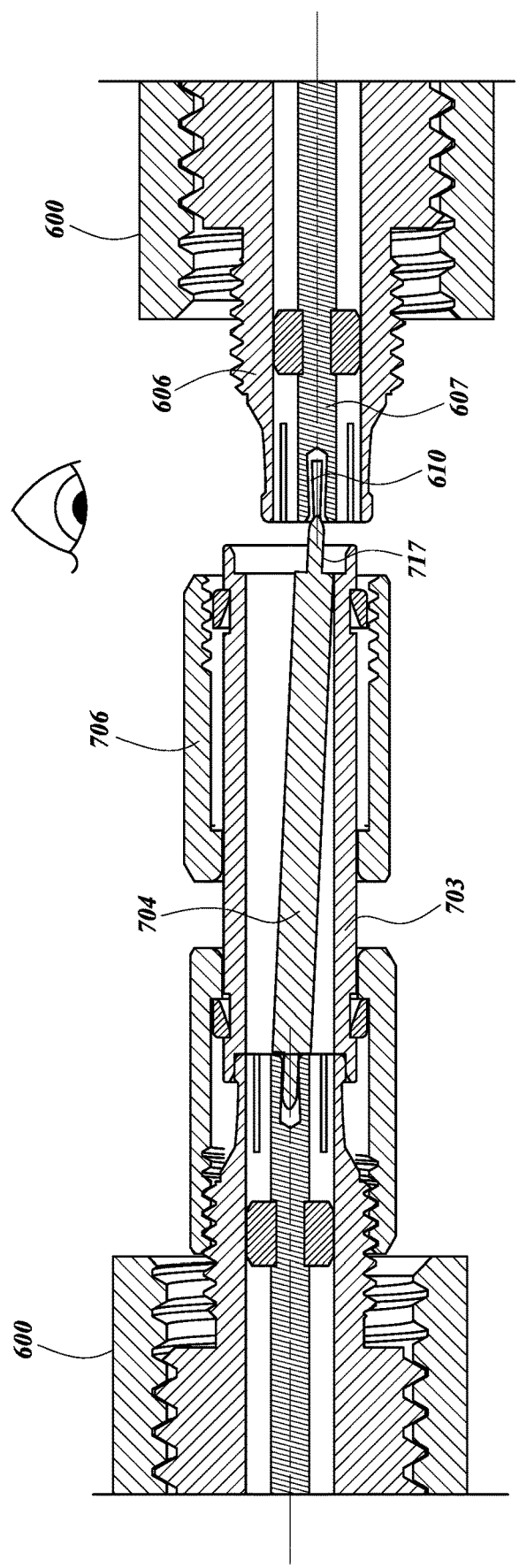
Figure 8E:
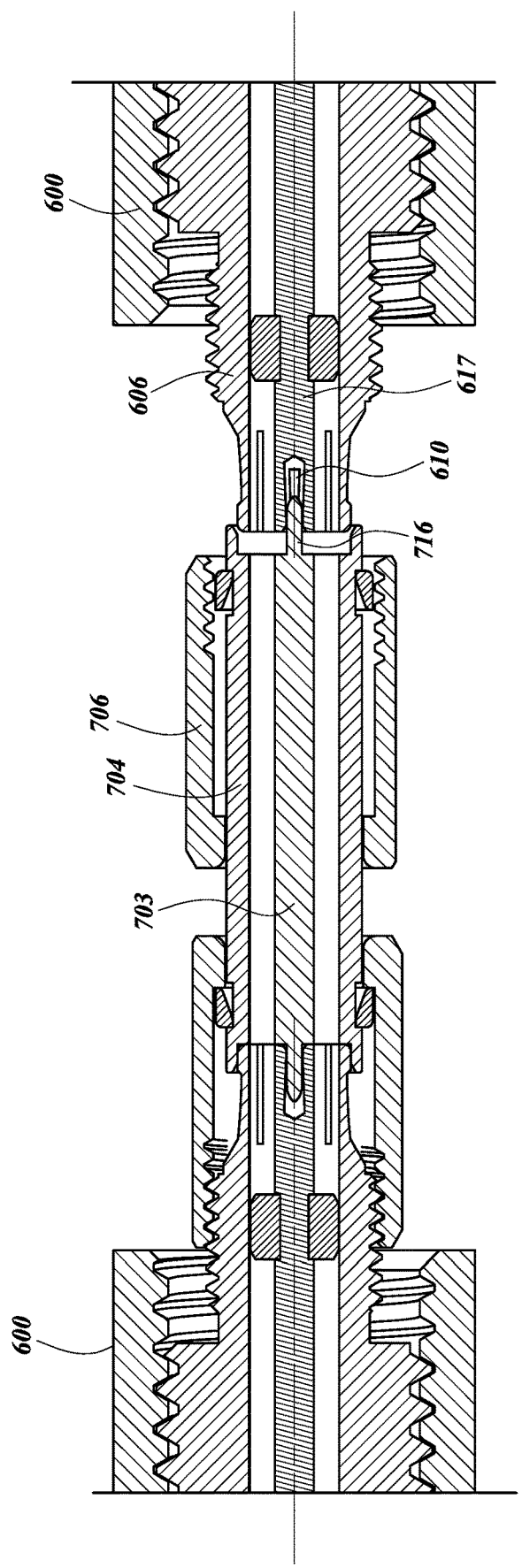

In FIG. 8D, the pin 717 of the inner conductor 704 is visually aligned (as represented by the illustrated eye) and guided into the slot 610 on the inner conductor 607. Again, the retaining nut 706 can be slid back to provide visual access to both the pin 717 and the slot 610. In FIG. 8E, the pin 717 is inserted into the slot 610.

Figure 8F:
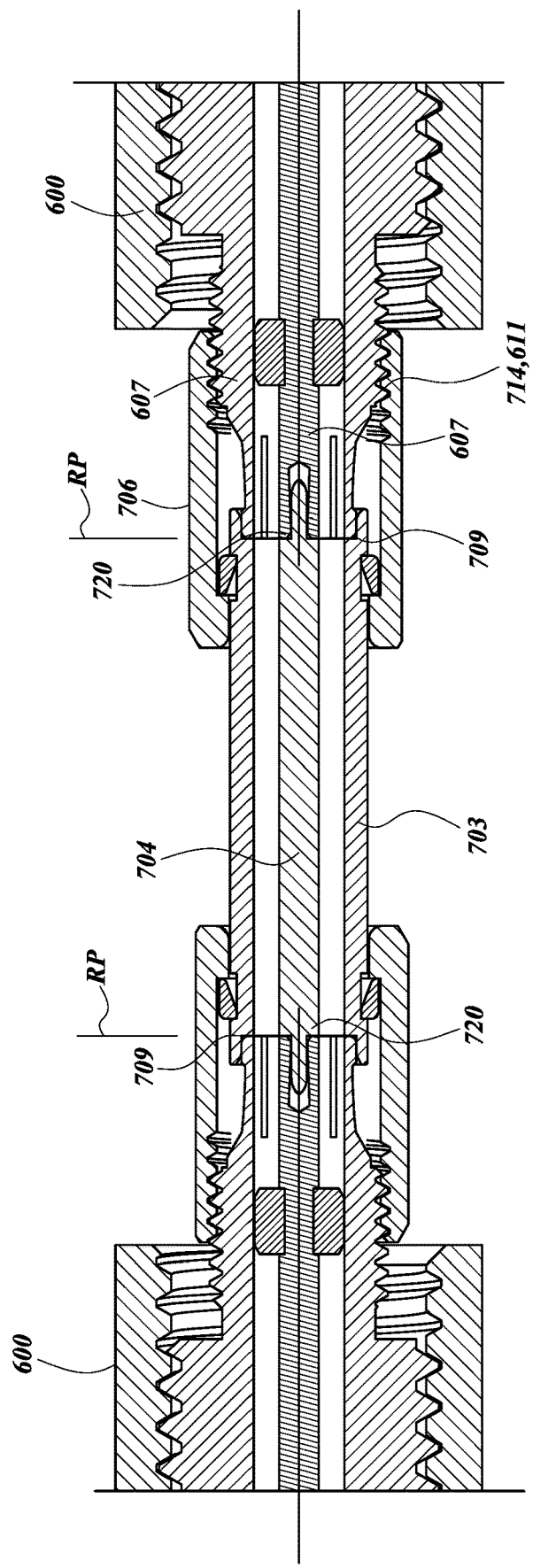

In FIG. 8F, the retaining nut 706 is slid forward and the threaded portion 714 engages the threaded portion 611 of the second female calibration connector 600. As the retaining nut 706 is tightened, the retaining nut 706 pulls the outer conductor 703 into position relative to the outer conductor 706 of the second female calibration connector 600. The end surface 709 of the outer conductor 703 is brought into contact with the distal end outer conductor 607 in the reference planes RP. Similarly, end surfaces 720 of the inner conductor 704 may be brought into contact with surfaces distal ends of the inner conductor 607 of the female calibration connectors 600 in the reference plane RP. As shown, the inner conductor 704 of the male calibration standard 700 is coaxially supported within the outer conductor 703 by the pins 717 which are received with the slots 610 of the inner conductors 607 of the female calibration connectors 600. With the male calibration standard 700 connected to the female calibration connectors 600 as shown in FIG. 8F, a calibration process can be performed on an analyzer.

FIGS. 8A-8F illustrate only certain steps in an example method of use for the female calibration connectors 600 and the male calibration standard 700. Methods of use can include other steps than those shown. Not all illustrated steps need be included in all methods of use. The order of steps may be varied as applicable.

After calibration, the male calibration standard 700 can be removed from the female calibration connectors 600. The female calibration connectors 600 can then be connected to an RF device to be tested or measured such that the now calibrated analyzer can test the RF device. The female calibration connectors 600 are configured for use with RF devices having male push-on connectors. FIGS. 9A and 9B are cross-sectional views illustrating an example of the female calibration connectors 600 and a male push-on connector 140 in unmated and mated states, respectively.

FIG. 9A shows an embodiment of a female calibration connector 600 and an embodiment of a male push-on connector 140. Each of these has been previously described above. FIG. 9B shows the female calibration connector 600 and the male push-on connector 140 in a mated state. As shown, the nib 609 is received in the recess 144 in a manner that secures the female calibration connector 600 to the male push-on connector 140. The outer conductor 606 of the female calibration connector 600 is slotted (as described above) such that flexible arms are formed that deflect as the nib 609 passes the detent 143 in a manner previously described. The pin 145 is received in the slot 610 of inner conductor 607 of the female calibration connector 600.

Second Example Female Calibration Connector

Figure 10A:
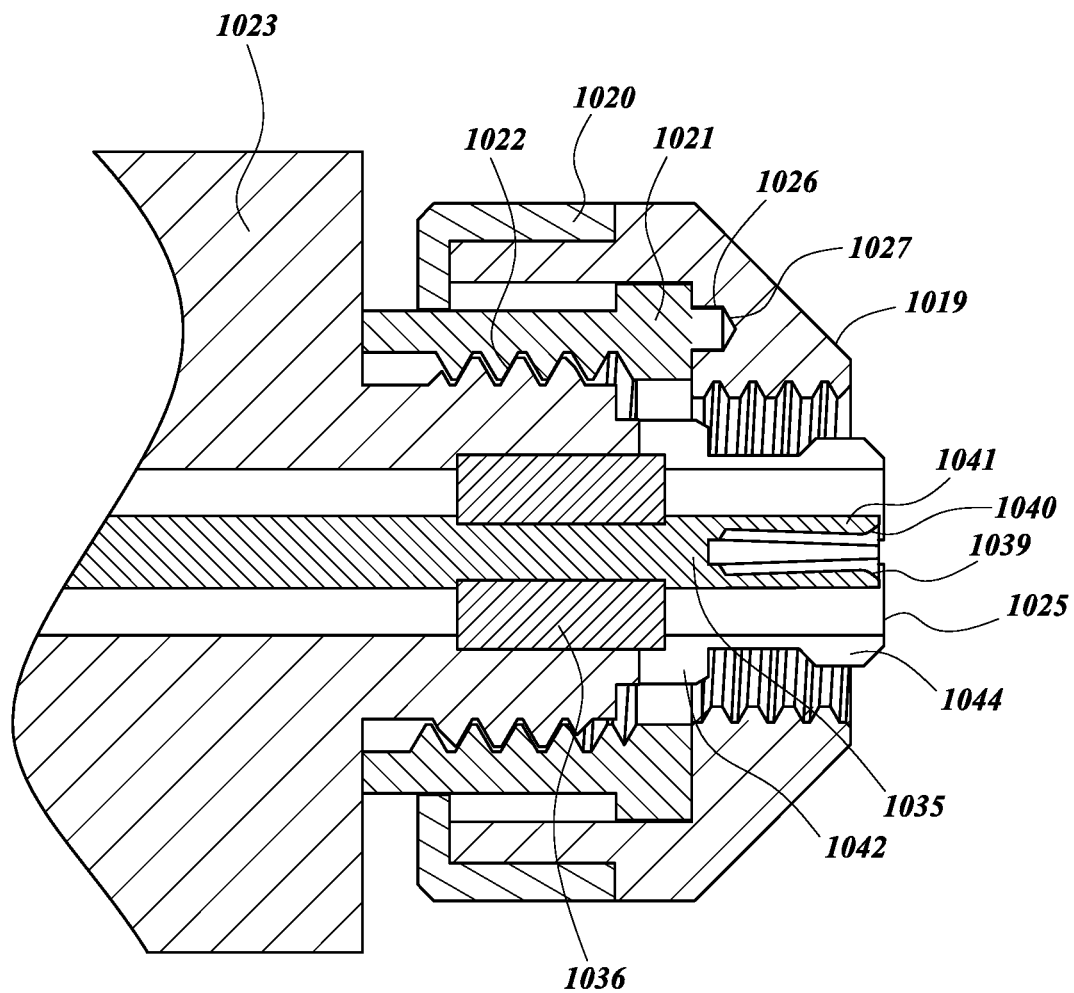
FIG. 10A is a cross-sectional view illustrating an embodiment of a female calibration connector that includes a removable coupling portion.
Figure 10B:
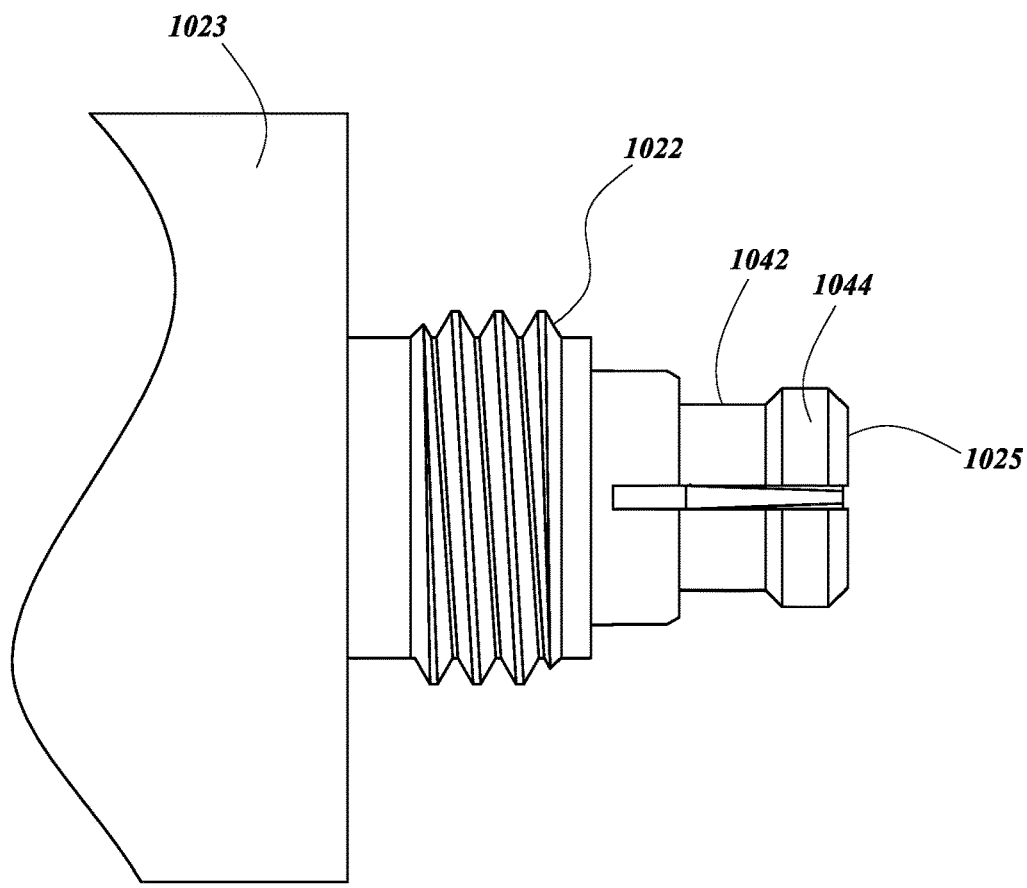
FIG. 10B is a side view of the female calibration connector of FIG. 10A with the removable coupling portion removed.
Figure 10C:
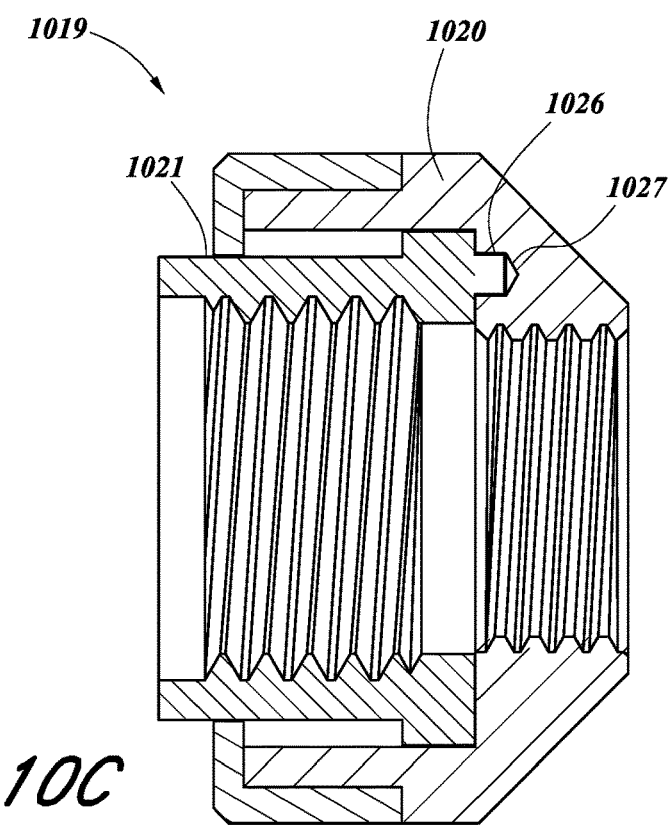
FIG. 10C is a cross-sectional view of the removable coupling portion removed from the female calibration connector of FIG. 10A.

FIG. 10A is a cross-sectional view illustrating an embodiment of another embodiment of a female calibration connector 1000. The female calibration connector 1000 includes a removable coupling portion 1019. FIG. 10B is a side view of the female calibration connector 1000 with the removable coupling portion 1019 removed. FIG. 10C is a cross-sectional view of the removable coupling portion 1019 removed from the female calibration connector 1000.

The removable coupling portion 1019 has an outer component 1020 that is free to slide in a longitudinal direction and rotate about the axis of an inner component 1021. The removable coupling portion 1019 can be attached to the female calibration connector 1000 via threads 1022 or other suitable mechanical feature. An inner conductor 1035 is supported within an outer conductor 1023 by, for example, a solid non-conducting bead 1036. The solid non-conducting bead 1036 can be a dielectric element. The inner conductor 1035 contact includes a cylindrical bore 1039 intended to engage with a pin of male push-on connector or male calibration standard inner conductor.

With the removable coupling portion 1019 removed, as illustrated in FIG. 10B, the female calibration connector 1000 is compatible with standard push-on male connectors 140. The features between the threads 1022 and a reference plane 1025 may be identical in form to the standard female push-on connector 120 described with reference to FIG. 1A. As shown in FIG. 10B, the outer conductor 1023 of the female calibration connector 1000 has a plurality of cantilevered beams forming body fingers of flexible arms 1042. The flexible arms 1042 can be arranged symmetrically about the longitudinal axis. The flexible arms 1042 terminate at their distal ends with nibs 1044 that protrude further from the longitudinal axis than a central portion of the flexible arms 1042. The geometry of the nib 1044 is designed to lock into the interface of a compatible male push-on connector 140. The distally or axially outward facing surfaces of the ends of the flexible arms 1042 lie in the reference plane 1025. The inner conductor 1035 has a cylindrical bore 1039 located on its longitudinal axis and a plurality of slots that divide the end of the inner conductor 1035 conductor into a plurality of cantilevered beams called contact fingers 1040.

FIG. 10C shows the removable coupling portion 1019 detached from the female calibration connector 1000. A feature 1026, such as a pin, in the inner component 1021 can engage a hole 1027 in the outer component 1020. This causes the two components not to spin relative to each other and allows the inner component 1021 to be threaded onto the female calibration connector 1000 by turning the outer component 1020. When the feature 1026 is engaged with the hole 1027, the inner and outer components rotate together as if they were a single piece.

Second Example Male Calibration Standard

Figure 11A:
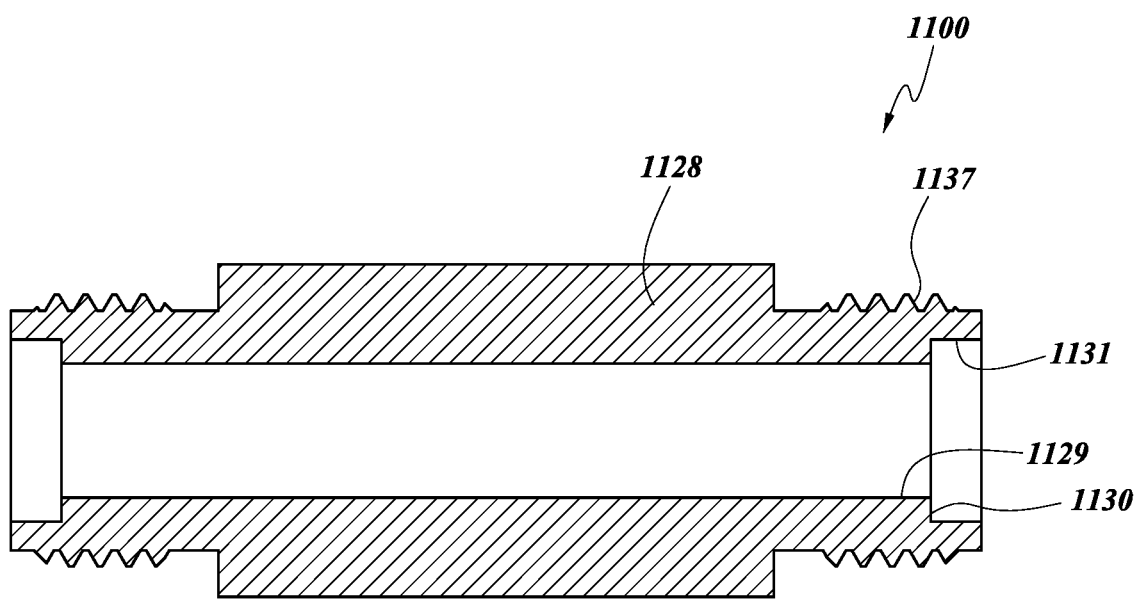
FIG. 11A is a cross-sectional view illustrating an embodiment of an outer conductor of another embodiment of a male calibration standard.

FIG. 11A is a cross-sectional view illustrating an embodiment of an outer conductor 1128 of another embodiment of a male calibration standard 1100. The outer conductor 1128 of the male calibration standard 1100 is compatible with the female calibration connector 1000 described in FIGS. 10A-10C. The outer conductor 1128 has a cylindrical bore 1129 that is tightly toleranced with a fine surface finish. The end of the cylindrical bore 1129 is positioned in a reference plane 1130 that will be in contact with the reference plane 1125 of a mating female calibration connector 1000 when fully mated. The end of the outer conductor 1128 has a cylindrical bore 1131 that engages with the nibs 1044 of a mating female calibration connector 1000. The outer conductor 1128 has threads 1137 or other suitable mechanical features intended to secure it to the female calibration connector 1000 during the calibration process. The material(s) from which the outer conductor 1128 is made include copper alloys, steel alloys, or other suitable metals or materials. The outer conductor 1128 can be plated with gold or other suitable materials to improve conductivity.

Figure 11B:
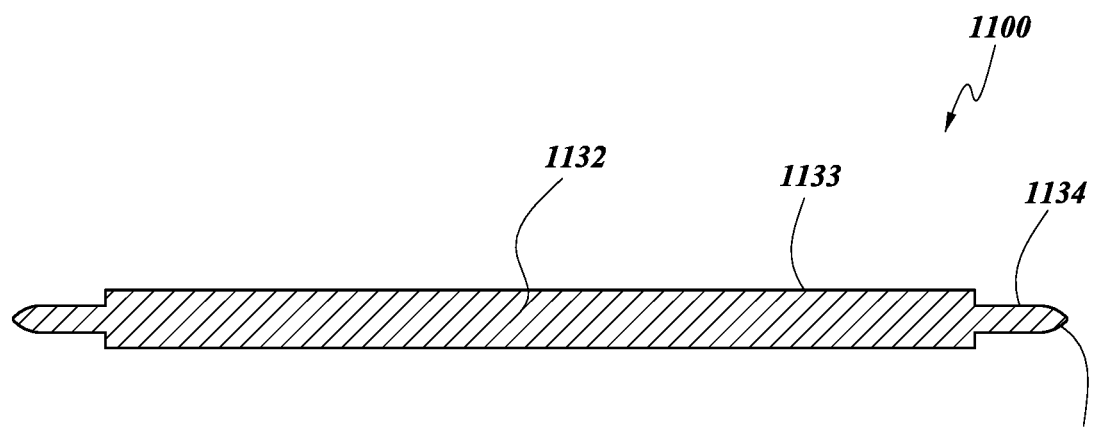
FIG. 11B is a cross-sectional view illustrating an example of an embodiment of an inner conductor of the male calibration standard of FIG. 11A.

FIG. 11B is a cross-sectional view illustrating an example of an embodiment of an inner conductor 1132 of the male calibration standard 1100. An outer surface 1133 of the inner conductor 1132 is tightly toleranced and has a fine surface finish. The end of the inner conductor 1132 has a cylindrical protrusion 1134 designed to engage into the inner conductor 1035 of the female calibration connector 1000. The cylindrical protrusion 1134 can end in a pointed tip 1138. The inner conductor 1132 of the male calibration standard 1100 is not supported within the outer conductor 1128. It is supported only by the inner conductor 1035 of the female calibration standard 1000 to which it is intended to be mated. The material(s) from which the inner conductor 1132 is made are typically copper alloys, steel alloys, or other suitable metals or materials. The inner conductor 1132 can be plated with gold or other suitable materials to improve conductivity.

Second Example Method of Use

FIGS. 12A-12F are cross-sectional views illustrating several example steps for mating the male calibration standard 1100 of FIGS. 11A and 11B to the female calibration connector 1000 of FIG. 10A.

Figure 12A:
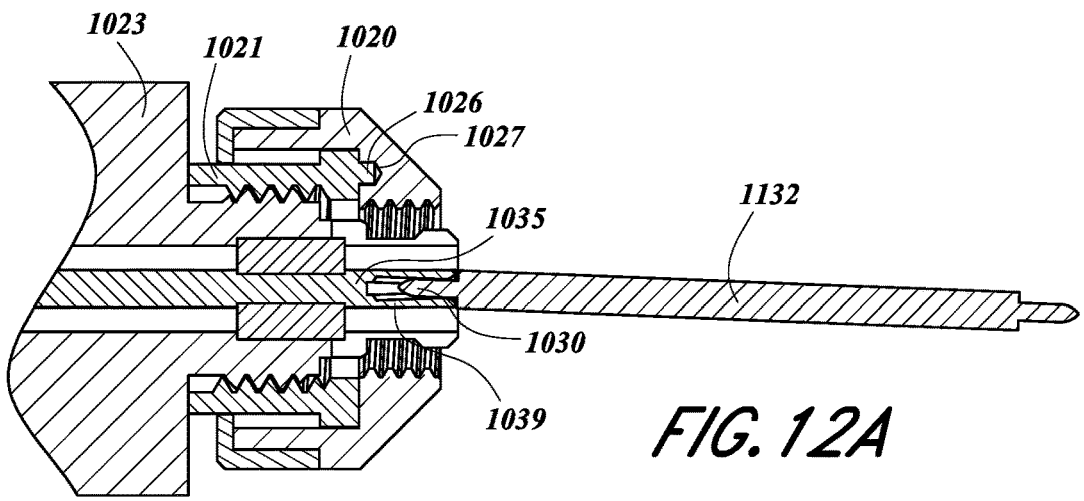
FIGS. 12A-12F are cross-sectional views illustrating several example steps for mating the male calibration standard of FIGS. 11A and 11B to the female calibration connector of FIG. 10A.
Figure 12B:
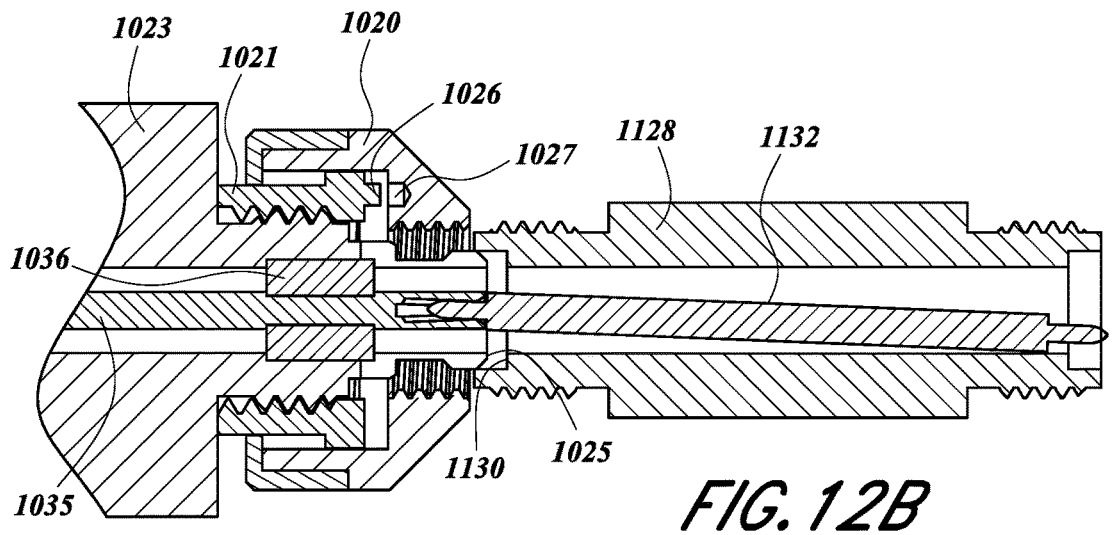
Figure 12C:
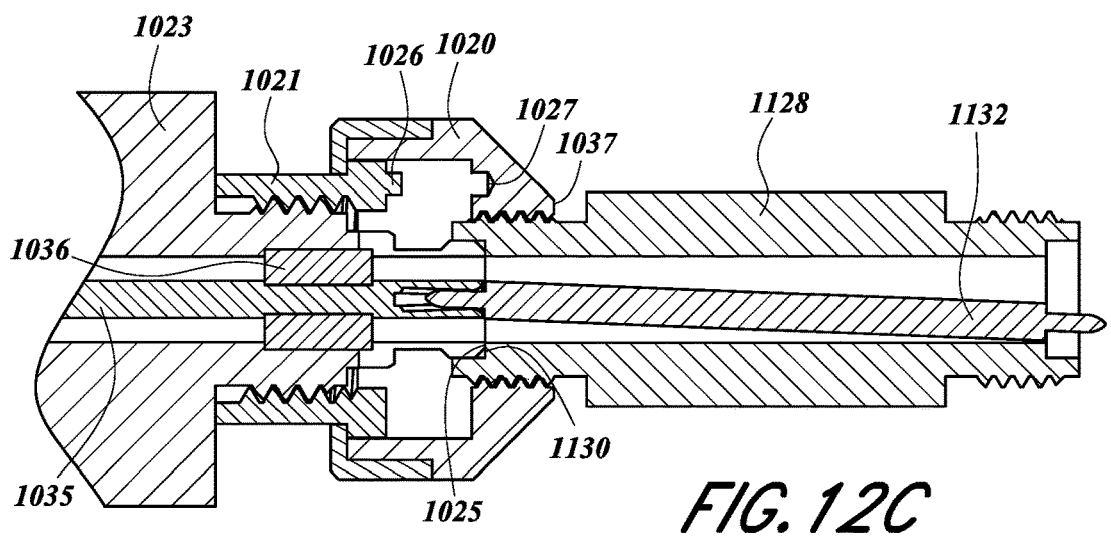

FIGS. 12A-12C illustrate installing a male calibration standard inner conductor 1132 on a first female calibration connector 1000. The tip 1138 of the male calibration standard inner conductor 1132 connects with the center conductor 1035 of the female calibration connector 1000, as shown in FIG. 12A. The tip 1138 of the male inner conductor is inserted into the bore 1039 of the female calibration connector 1000. The cylindrical surface 1134 contacts fingers 1040, as shown in FIG. 12A.

The male calibration standard outer conductor 1128 is positioned over the male calibration standard inner conductor 1132, as shown in FIG. 12B. The outer member 1020 of the female calibration connector 1000 coupling portion 1019 can be slid forward toward the male calibration standard outer conductor 1128. The feature 1026 in the inner component 1021 of the coupling portion 1019 is disengaged from the hole 1027 in the outer component 1020 of the coupling portion 1019. This disengagement allows the outer component 1020 to spin relative to the inner component 1021.

The outer component 1020 of the coupling portion 1019 can be spun onto the threads 1137 of the male calibration standard 1128, as shown in FIG. 12C. This draws the interface of the male calibration standard outer conductor 1128 towards the interface of the female calibration connector 1000 until the reference plane 1130 of the male calibration standard outer conductor 1128 contacts the reference plane 1025 of the female calibration connector 1000.

Figure 12D:
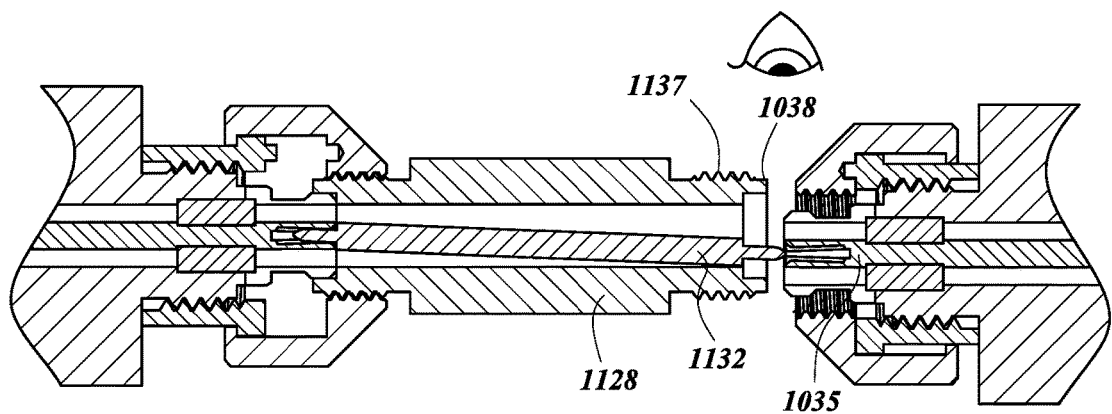
Figure 12E:
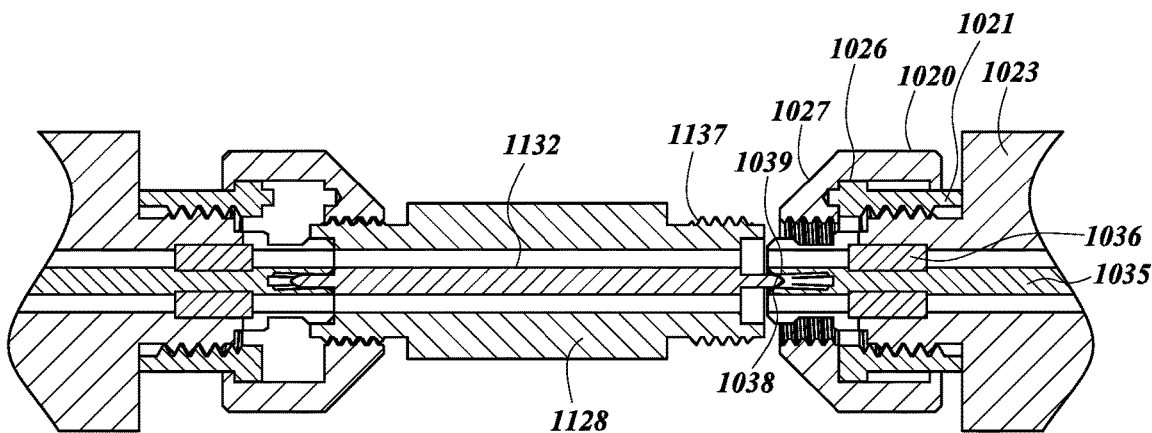
Figure 12F:
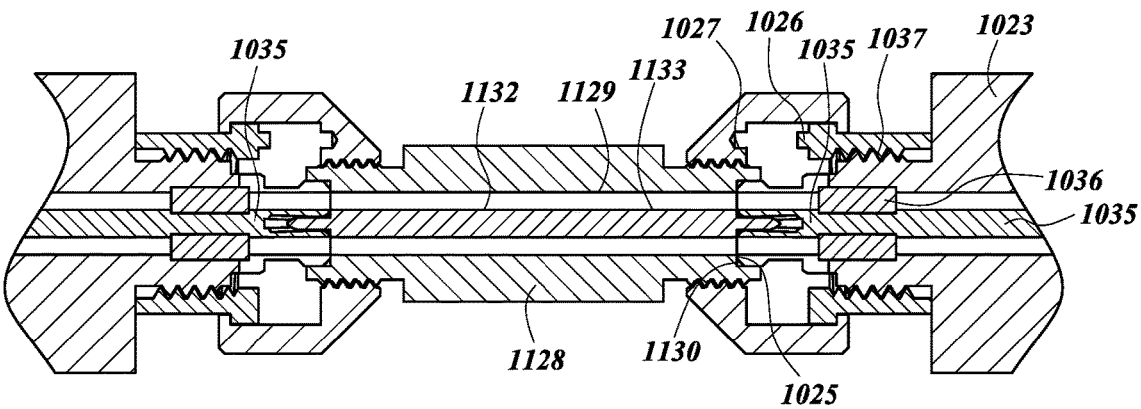

The second end of the male calibration standard 1128 can be connected to a second female calibration connector 1000 with a coupling portion 1019, as shown in FIGS. 12D-12E. The tip 1138 of the male inner conductor 1132 of the calibration standard 1100 can be aligned with a female inner conductor 1035 of the second calibration connector 1000. The tip 1138 of the male inner conductor 1132 may be visible, which aids in alignment. The pointed tip 1138 of the inner conductor 1132 can be inserted into the cylindrical bore 1039 of the inner conductor 1035 of the second female calibration connector 1000, as shown in FIG. 12D.

The feature 1026 disengages from the hole 1027 allowing the outer component 1020 of the coupling portion 1019 to rotate. The coupling mechanism 1020 can be spun onto the threads 1137 of the male calibration standard outer conductor 1128, as shown in FIG. 12E. The outer surface 1133 of the male calibration standard inner conductor 1132 is positioned coaxially within the cylindrical bore 1129 of the outer conductor 1128 of the male calibration standard 1100. The inner conductor 1132 of the male calibration standard 1100 is supported only by the opposing inner conductors 1035 of the female calibration connectors 1000.

The coupling mechanism outer components hold the reference plane 1025 of the second female calibration connector 1000 against the reference plane 1130 of the male calibration standard outer conductor 1128 and the male calibration standard inner conductor 1132. In this configuration calibration data can be transmitted across the calibration standard 1100. When the calibration process is completed the coupling mechanisms 1019 of the female calibration connectors 1000 can be removed so that the female calibration connectors 1000 can be connected to male push-on connectors in the manner shown in FIGS. 9A and 9B.

FIGS. 12A-12F illustrate only certain steps in an example method of use for the female calibration connectors 1000 and the male calibration standard 1100. Methods of use can include other steps than those shown. Not all illustrated steps need be included in all methods of use. The order of steps may be varied as applicable.

Additional Embodiments of Devices, Systems and Methods for Calibration Systems

Example Male-Female Calibration Standards

The calibration standards described above and shown in the figures include the same type of connector (e.g., a male connector or a female connector) on each end. This need not be the case in all embodiments. A calibration standard can include a first end with a male connector or interface and a second end with a female connector or interface.

For example, a calibration standard outer conductor can include a first end configured as the first end 301 of the female calibration standard outer conductor 303 of FIG. 3B, and could also include a second end configured as the second end 702 of the male calibration standard outer conductor 703 of FIG. 7B. A calibration standard inner conductor can include a first end configured as the first end 301 of the female calibration standard inner conductor 304 of FIG. 3C, and could also include a second end configured as the second end 702 of the male calibration standard outer conductor 704 of FIG. 7C. The calibration standard outer conductor can be configured for use with a male calibration connector 200 on the first end and a female calibration connector 600 on the second end.

Any combination of any of the male and female connectors described herein is possible.

Example Alignment Tools

In some embodiments, alignment tools are used to aid a user in positioning the inner conductor of a calibration standard within the outer conductor of a calibration standard. In FIGS. 4A-4F (female calibration standard) and 8A-8F (male calibration standard), which are described above, the inner conductor 304, 704 of the calibration standard 300, 700 is first connected to the male or female calibration connector 200, 600, and then the outer conductor 303, 703 of the calibration standard 300, 700 is installed over the inner conductor 304, 704 and connected to the male or female calibration connector 200, 600. Alternatively, the outer conductor 303, 703 of the calibration standard 300, 700 can first be connected to the male or female calibration connector 200, 600 and then the inner conductor 304, 704 of the calibration standard 300, 700 can be inserted into the outer conductor 303, 703 of the calibration standard 300, 700 and then connected to the male or female calibration connector 200, 600. The alignment tools shown in FIGS. 13A-13C can aid a user in inserting the inner conductor 304, 704 of the calibration standard 300, 700 into the outer conductor 303, 703 of the calibration standard 300, 700 and connecting it to the male or female calibration connector 200, 600.

Figure 13A:
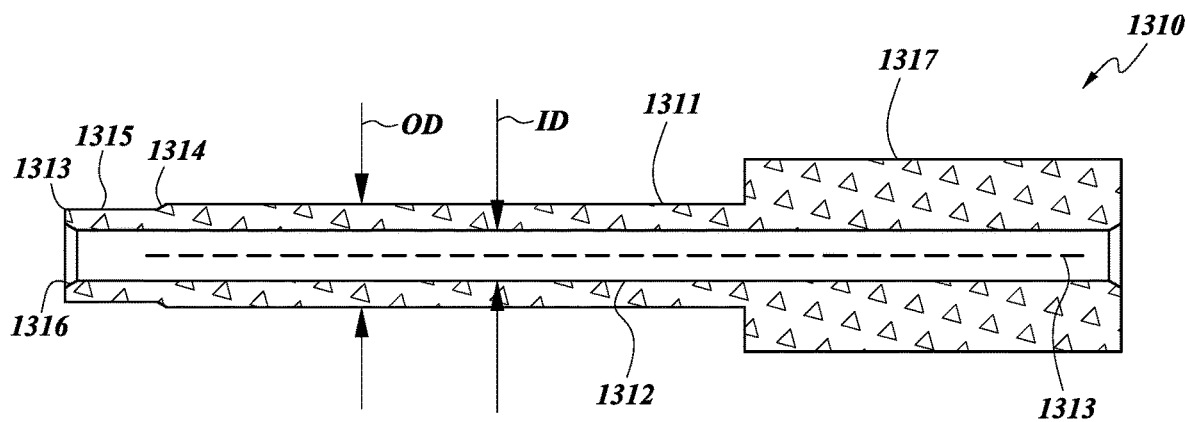
FIG. 13A is a cross-sectional view of an embodiment of an alignment tool for use with some embodiments of calibration systems.

FIG. 13A is a cross-sectional view of an embodiment of an alignment tool 1310 for use with some embodiments of calibration systems. The alignment tool 1310 is configured for inserting the inner conductor 304, 704 of a calibration standard 300, 700 into the outer conductor 303, 703 of the calibration standard 300, 700, which has been connected to a male or female calibration connector 200, 600.

The alignment tool 1310 can include a body 1311. The body 1311 can be cylindrical. The body 1311 can extend along an axis 1313. The body can have an outer diameter OD that is configured to fit within the bore 308, 708 of an outer conductor 303, 703 of a calibration standard 300, 700. In some embodiments, the OD is approximately equal to the inner diameter of the bore 308, 708 such that the body 1311 fits closely within the bore 308, 708 yet can still slide within the bore 308, 708. A channel 1312 is formed through the body 1311. The channel 1312 can extend along the axis 1313. The channel 1312 can have an inner diameter ID that is configured to receive the inner conductor 304, 704 of a calibration standard 300, 700. In some embodiments, the ID is approximately equal to the outer diameter of the inner conductor 304, 704 such that the inner conductor 304, 704 fits closely within the channel 1312 yet can still slide within the channel 1312. An end 1313 of the body 1311 can include a lead in chamber 1316 which can help guide the inner conductor 304, 704 into the channel 1312. The opposite end of the body 1311 can also include a chamfer. Near the end 1313 of the body 1311, a tapered portion 1314 can narrow the outer diameter of the body 1311 in a narrow portion 1315 that extends to the end 1315. Opposite the end 1313, the alignment tool 1310 can include a handle portion 1317. In the illustrated embodiment, the handle portion 1317 is cylindrical but other shapes are possible.

Figure 13B:
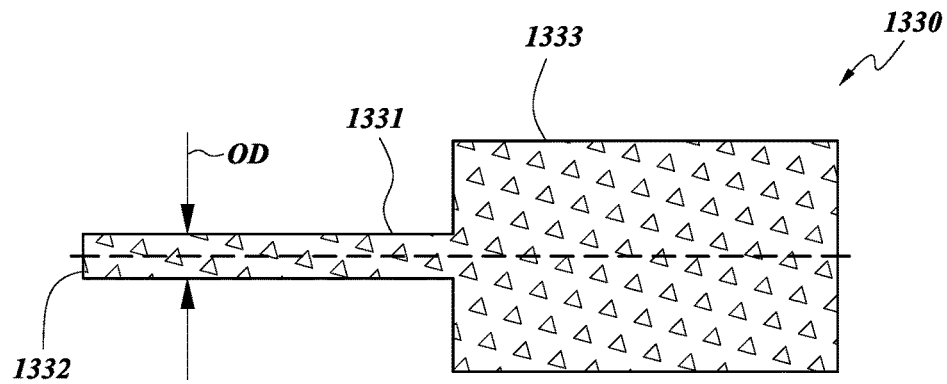
FIG. 13B is a cross-sectional view of an embodiment of a push rod tool for use with some embodiments of calibration systems.

FIG. 13B is a cross-sectional view of an embodiment of a push rod tool 1330 for use with some embodiments of calibration systems. The push rod tool 1330 includes a body 1331. The body 1331 may be cylindrical. The body 1331 may have an outer diameter OD that is configured to fit and slide within the channel 1312 of the alignment tool 1310. The body 1331 can include a flat end 1332. The push rod tool 1330 can include a handle portion 1333. In the illustrated embodiment, the handle portion 1333 is cylindrical but other shapes are possible. The push rod tool 1330 can be configured for use with an inner conductor 304 of a female calibration standard 300. The end 1332 is configured to press on an end surface 320 of the inner conductor 304 to seat the inner conductor 304 onto a pin 215 of a male calibration connector 200.

Figure 13C:
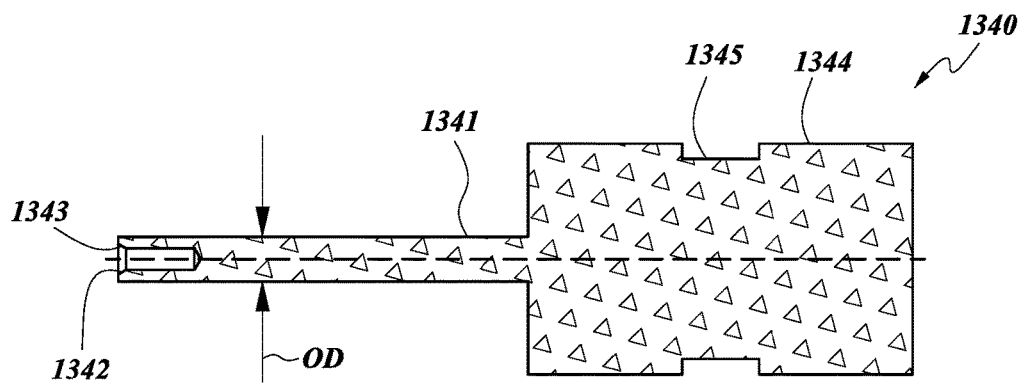
FIG. 13C is a cross-sectional view of another embodiment of a push rod tool for use with some embodiments of calibration systems.

FIG. 13C is a cross-sectional view of another embodiment of a push rod tool 1340 for use with some embodiments of calibration systems. The push rod tool 1340 is configured for use with an inner conductor 704 of a male calibration standard 700. The push rod tool 1340 includes a body 1341. The body 1341 may be cylindrical. The body 1341 may have an outer diameter OD that is configured to fit and slide within the channel 1312 of the alignment tool 1310. The body 1341 can include an end 1342. A bore 1343 extends into the end 1342. The bore 1343 can be configured to receive a pin 717 of the inner conductor 704. The alignment tool 1340 can include a handle portion 1344. In the illustrated embodiment, the handle portion 1344 is cylindrical but other shapes are possible. In the illustrated embodiment, the handle portion 1344 includes an annular groove 1345, although this need not be included in all embodiments. The push rod tool 1330 can be configured for use with an inner conductor 704 of a male calibration standard 700. The end 1332 is configured to press on a surface 720 of the inner conductor 704 and the bore 1343 is configured to receive the pin 717 to seat the inner conductor 704 into a female calibration connector 600.

Use of the alignment tool 1310 and the push rod tools 1330, 1340 can include one or more of the following steps: connecting an outer conductor 303, 703 of a calibration standard 300, 700 to an outer conductor 206, 606 of a male or female calibration connector 200, 600; inserting an inner conductor 304, 704 of the calibration standard 300, 700 into the channel 1312 of the alignment tool 1310; inserting the body 1311 of the alignment tool 1310 into the bore 308, 708 of the outer conductor 303, 703; inserting the body 1331, 1341 of the push rod tool 1330, 1340 into the channel 1312 of the alignment tool 1310; advancing the body 1331, 1341 of the push rod tool 1330, 1340 into the channel 1312 of the alignment tool 1310 to connect the inner conductor 304, 704 of the calibration standard 300, 700 to the inner conductor 207, 607 of the male or female calibration standard 200, 600; removing the body 1331, 1341 of the push rod tool 1330, 1340 from the channel 1313; and/or removing the body 1311 of the alignment tool 1310 from the bore 308, 708, while the inner conductor 304, 704 remains connected to the inner conductor 304, 704 of the calibration standard 300, 700 to the inner conductor 207, 607 of the male or female calibration standard 200, 600.

In some embodiments, the alignment tool 1310 and push rod tools 1330, 1340 are made from plastic, metal, or other suitable materials.

Example "Short" Connectors

Figure 14A:
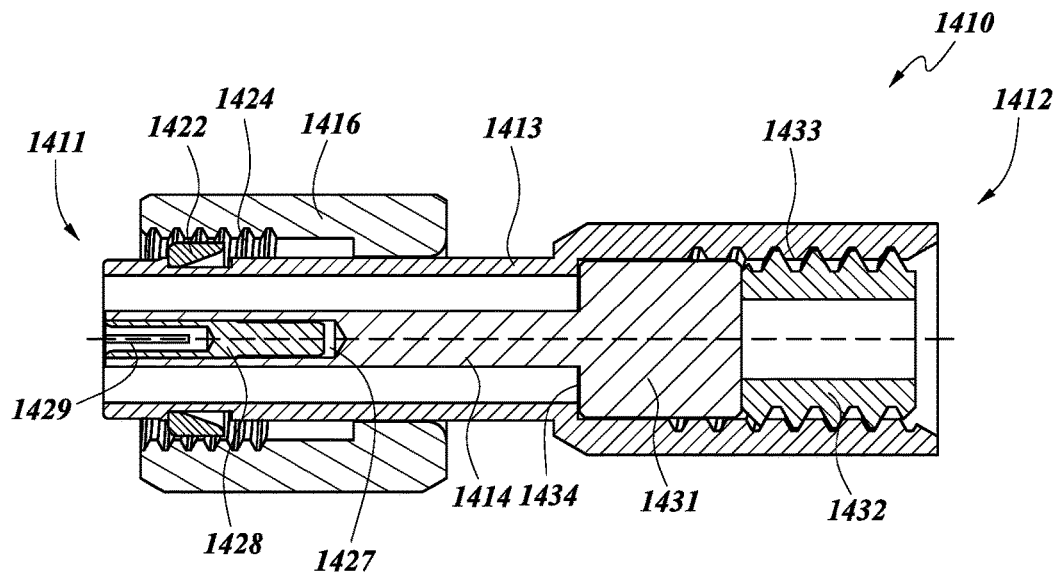
FIG. 14A is a cross-sectional view of a female calibration connector configured to provide a short or reflect signal during a calibration process.
Figure 14B:
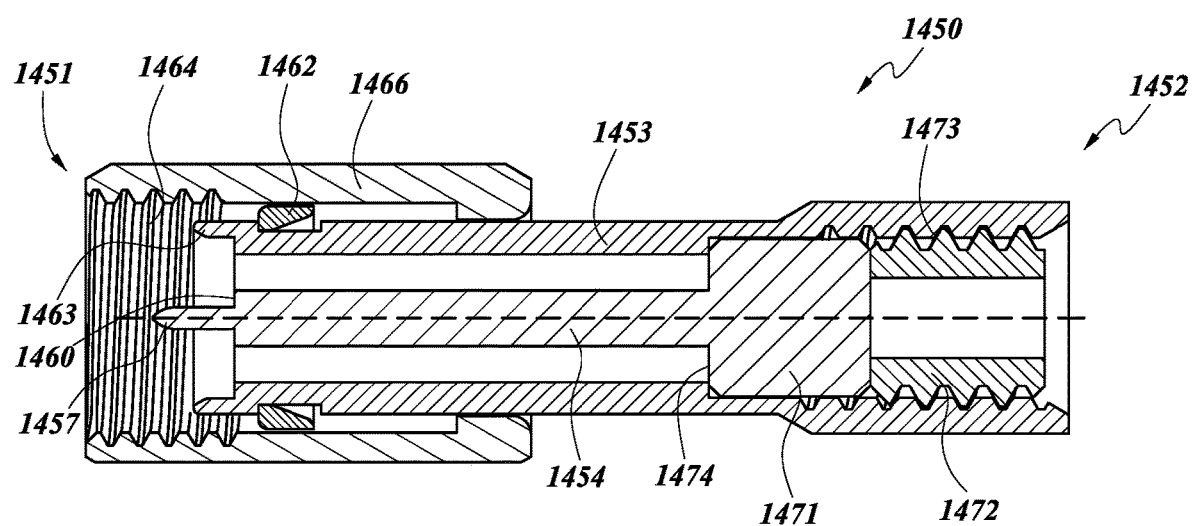
FIG. 14B is a cross-sectional view of a male calibration connector configured to provide a short or reflect signal during calibration.

Some calibration methods (such as TRL or LRL calibration methods) involve making a "reflect" or "short" measurement. This measurement can be made by connecting a "short" connector the test port (or cable connected to the test port) of the analyzer. The short connector is configured to create a short or direct connection between the inner conductor and the outer conductor. FIGS. 14A and 14B illustrate example short connectors having female and male connectors, respectively.

FIG. 14A is a cross-sectional view of a short female calibration connector 1410. The short female calibration connector 1410 is configured to connect to a male calibration connector 200. The short female calibration connector 1410 includes an outer conductor 1413 and an inner conductor 1414. The short female calibration connector 1410 extends between a first end 1411 and a second end 1412. The first end 1411 can be similar to the first end 301 of the female calibration standard 300. For example, the first end 1411 includes a bore 1427 in the end of inner conductor 1414, an insert 1428 positioned within the bore 1427, and a bore 1429 configured to receive a pin of a male connector in the end of the insert 1428. Additionally, a coupling mechanism, such as retaining nut 1426 is positioned on the outer conductor 1413 and retained by a retaining ring 1422. These features may be substantially similar to corresponding features on the first end 301 of the female calibration standard 300.

The second end 1412 is configured to establish a short or direct connection between the inner conductor 1414 and the outer conductor 1413. As illustrated, for some embodiments, the inner conductor 1414 terminates at a block 1413 that contacts the outer conductor 1413. The block 1431 includes a surface 1434 connecting the inner conductor 1414 and the outer conductor 1413. The block 1431 supports the inner conductor 1414 within the outer conductor 1413. A grub screw 1432 or other suitable structure can be threaded into a threaded portion 1433 of the outer conductor 1413 to secure the block 1413.

FIG. 14B is a cross-sectional view of a male calibration connector 1450 configured to provide a short or reflect signal during calibration. The short male calibration connector 1450 is configured to connect to a female calibration connector 600. The short male calibration connector 1450 includes an outer conductor 1453 and an inner conductor 1454. The short male calibration connector 1450 extends between a first end 1451 and a second end 1452. The first end 1451 can be similar to the first end 701 of the male calibration standard 700. For example, the first end 1451 includes pin 1457, an end surface 1451, and a flange 1463. Additionally, a coupling mechanism, such as retaining nut 1466 is positioned on the outer conductor 1453 and retained by a retaining ring 1462. These features may be substantially similar to corresponding features on the first end 701 of the male calibration standard 300.

The second end 1452 is configured to establish a short or direct connection between the inner conductor 1454 and the outer conductor 1453. As illustrated, for some embodiments, the inner conductor 1454 terminates at a block 1473 that contacts the outer conductor 1453. The block 1471 includes a surface 1474 connecting the inner conductor 1454 and the outer conductor 1453. The block 1471 supports the inner conductor 1454 within the outer conductor 1453. A grub screw 1472 or other suitable structure can be threaded into a threaded portion 1473 of the outer conductor 1413 to secure the block 1453.

Example Calibration Kits

Figure 15:
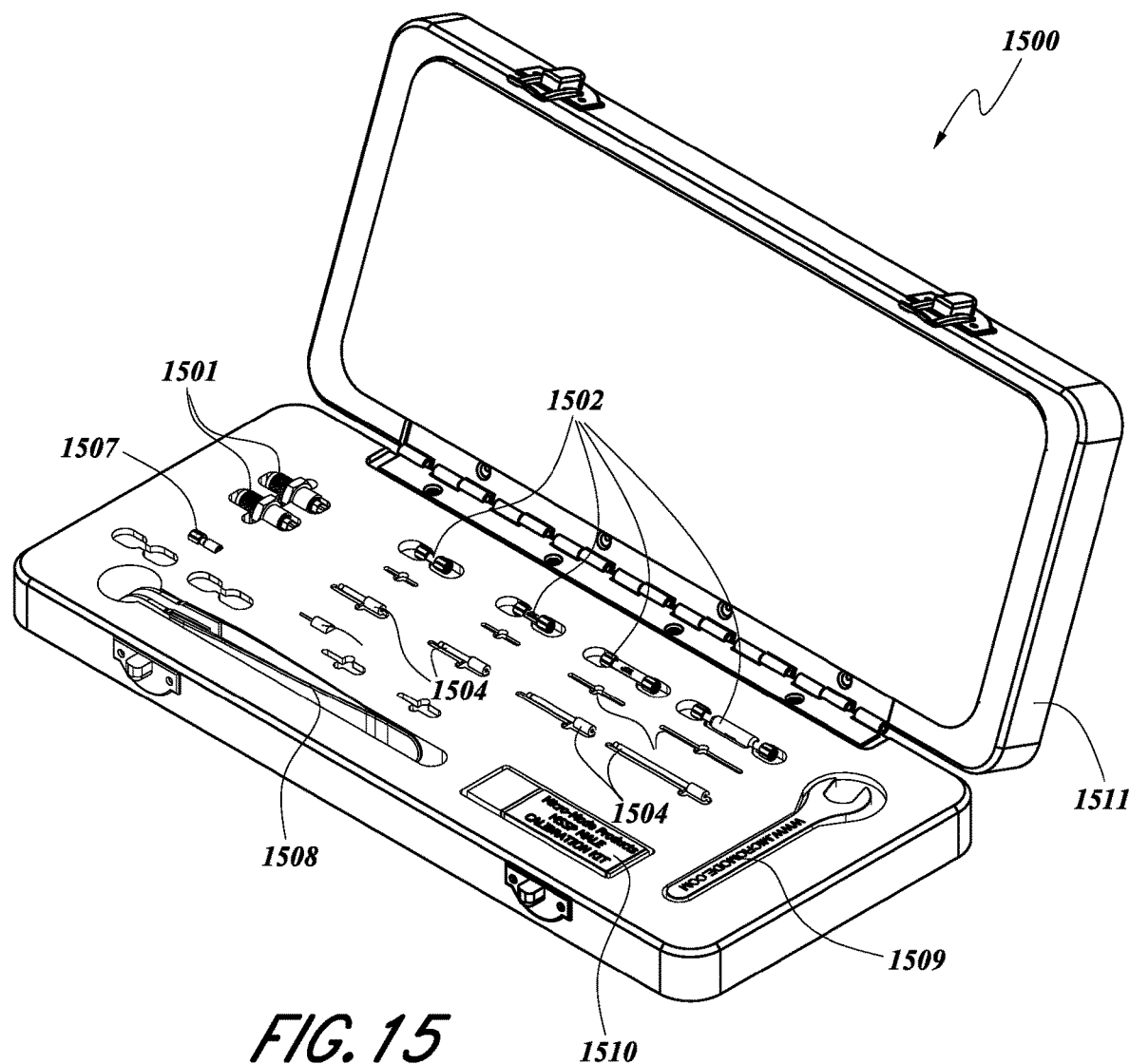
FIG. 15 is an isometric view of an embodiment of a calibration kit.

FIG. 15 is an isometric view an embodiment of a calibration kit 1500. The kit 1500 can include one or more of the following: one or more calibration connectors 1501, one or more calibration standard outer conductors 1502; one or more calibration standard inner conductors 1503; one or more alignment tools 1504; one or more push rod tools 1506; and/or one or more short connectors 1507. The kit 1500 may also include tweezers 1508, a tightening tool 1509, such as a wrench, and/or a computer readable media 1510 including calibration data. The kit 1500 may include a container 1511 for storing the components included in the kit 1500.

In some embodiments, the kit 1500 includes two calibration connectors 1501. The calibration connectors 1501 can be male calibration connectors 200 or female calibration connectors 600, 1000.

In some embodiments, the kit 1500 includes three calibration standards, each including both a calibration standard outer conductor 1502 and a calibration standard inner conductor 1503. Other numbers of calibration standards are possible. The calibration standards may each comprise a different length. The calibration standard outer conductors 1502 and the calibration standard inner conductors 1503 can be male, female, or have one male end and one female end. The calibration standard outer conductors 1502 and the calibration standard inner conductors 1503 can include any of the calibration standard outer and inner conductors described herein.

In some embodiments, the kit 1500 includes three alignment tools 1504. The alignment tools may have different lengths corresponding to the length of the calibration standards. The alignment tools 1504 may be the alignment tool 1310 described above. The kit 1500 can include one or more push rod tools 1506. The push rod tools 156 can be the push rod tools 1330 and 1340 described above.

In some embodiments, the kit 1500 includes two short connectors 1507. Other numbers of short connectors 1507 can also be included. The short connectors 1507 can be the short connectors 1410, 1405 described above.

Example Calibration Kits

Certain embodiments of the subject matter described herein are provided below. The subject matter described herein is not limited to these embodiments.

1. A male calibration kit for use with RF components having female push-on connectors, the kit comprising:
a first male calibration connector including an annular outer conductor, an inner conductor supported within a bore of the outer conductor by a dielectric support structure, the inner conductor including a pin, and a removable detent portion removably attached to a first end of the first male calibration connector, the first male calibration connector configured to connect to a female push-on connector when the removable detent portion is attached to the first male calibration connector;

a first female calibration standard outer conductor including an annular body having a smooth inner surface defining a bore through the body, a first attachment mechanism positioned at a first end of the first female calibration standard outer conductor, the first attachment mechanism configured to attach the first end of the first female calibration standard outer conductor to the first end of the first male calibration connector when the removable detent portion is removed from the first male calibration connector; and a first female calibration standard inner conductor comprising a cylindrical body, a first end of the first female calibration standard inner conductor including a first opening configured to receive the pin of the first male calibration connector.

2. The kit of Embodiment 1, further comprising:
a second male calibration connector including an annular outer conductor, an inner conductor supported within a bore of the outer conductor by a dielectric support structure, the inner conductor including a pin, and a removable detent portion removably attached to a first end of the second male calibration connector, the second male calibration connector configured to connect to a female push-on connector when the removable detent portion is attached to the second male calibration connector;
wherein a second end of first female calibration standard outer conductor includes a second attachment mechanism configured to attach the second end of the first female calibration standard outer conductor to the first end of the second male calibration connector when the removable detent portion is removed from the second male calibration connector; and
wherein a second end of the first female calibration standard inner conductor comprises a second opening configured to receive the pin of the second male calibration connector.

3. The kit of Embodiment 2, wherein the first female calibration standard outer conductor and the first female calibration standard inner conductor each comprise a first length, and wherein the kit further comprises:
a second female calibration standard outer conductor; and
a second female calibration standard inner conductor;
wherein the second female calibration standard outer conductor and the second female calibration standard inner conductor each comprise a second length different from the first length.

4. The kit of Embodiment 1, further comprising an alignment tool comprising a body extending along an axis, the body having a channel formed therethrough, an inner diameter of the channel corresponding to an outer diameter of the first female calibration standard inner conductor, an outer diameter of the channel corresponding to an inner diameter of the bore of the first female calibration standard outer conductor, and the alignment tool further comprising a handle.

5. The kit of Embodiment 4, further comprising a push rod tool comprising a cylindrical body extending along an axis, an outer diameter of the cylindrical body configured to correspond to the inner diameter of the channel of the alignment tool, and the push rod further comprising a handle.

6. The kit of Embodiment 5, further comprising a short connector comprising:
an annular outer conductor;
an inner conductor positioned within the outer conductor, the inner conductor including a block connecting the inner conductor to the outer conductor.

7. A male calibration connector, comprising:
an annular outer conductor extending along an axis between a first end and a second end, the outer conductor having an outer surface and an inner surface, the outer surface including a threaded portion proximal the first end, the inner surface defining a bore extending along the axis through the outer conductor;
an inner conductor positioned within the bore and extending along the axis, the inner conductor having an outer surface spaced apart from the inner surface of the outer conductor;
a support structure supporting the inner conductor within the bore, the support structure extending between the inner surface of the outer conductor and the outer surface of the inner conductor, the support structure comprising a dielectric material; and
a removable detent portion having an inner surface defining an opening through the detent portion, a first portion of the inner surface including a detent extending therefrom, a second portion of the inner surface including a threaded portion removably engaging the threaded portion of the outer surface of the outer conductor.

8. The male calibration connector of Embodiment 7, wherein, when the removable detent portion is engaged with the threaded portion of the outer surface of the outer conductor, the male calibration connector is configured to connect to a female push-on connector.

9. The male calibration connector of Embodiment 8, wherein, when the removable detent portion is removed from the threaded portion of the outer surface of the outer conductor, the male calibration connector is configured to connect to a female calibration standard.

10. A female calibration standard, comprising:
an annular outer conductor extending along an axis between a first end and a second end, the outer conductor including an inner surface defining a cylindrical bore that extends along the axis;
a rotatable first retaining nut retained on the first end of the outer conductor by a first retaining ring positioned within a first annular groove on the first end of an outer surface of the outer conductor, the first rotatable nut including a first threaded portion configured to engage a corresponding threaded portion of a first male calibration connector; and
a rotatable second retaining nut positioned around the outer conductor proximal to the second end, the second retaining nut retained on the second end of the outer conductor by a second retaining ring positioned within a second annular groove on the second end of an outer surface of the outer conductor, the second rotatable nut including a second threaded portion configured to engage a corresponding threaded portion of a second male calibration connector; and
an inner conductor extending along the axis between a first end and a second end, the first end including an opening configured to receive a pin of the first male calibration connector and the second end including an opening configured to receive a pin of the second male calibration connector.

11. The female calibration standard of Embodiment 10, wherein the first and second retaining nuts each include an opening, wherein the outer conductor extends through the openings of the first and second retaining nuts, and wherein the first and second retaining nuts are configured to slide axially along the outer conductor.

12. The female calibration standard of Embodiment 10, wherein the inner surface of the outer conductor is smooth.

13. The female calibration standard of Embodiment 10, wherein the inner surface of the outer conductor does not include slots.

14. The female calibration standard of Embodiment 10, wherein the inner conductor includes an outer surface, and wherein the outer surface of the inner conductor is smooth.

15. The female calibration standard of Embodiment 10, wherein the openings of the first end and the second end of the inner conductor are configured to receive inserts, the inserts including bores configured to receive the pins of the first and second male calibration connectors.

16. The female calibration standard of Embodiment 10, wherein the inner conductor is not connected to the outer conductor.

17. A male calibration system, comprising:
    a first male calibration connector including
        an annular outer conductor extending along an axis between a first end and a second end, the outer conductor having an outer surface and an inner surface, the outer surface including a threaded portion proximal the first end, the inner surface defining a bore extending along the axis through the outer conductor,
        an inner conductor positioned within the bore and extending along the axis, the inner conductor having an outer surface spaced apart from the inner surface of the outer conductor,
        a support structure supporting the inner conductor within the bore, the support structure extending between the inner surface of the outer conductor and the outer surface of the inner conductor, the support structure comprising a dielectric material;
    a female calibration standard outer conductor including
        an annular outer conductor extending along an axis between a first end and a second end, the outer conductor including an inner surface defining a cylindrical bore that extends along the axis,
        a rotatable first retaining nut positioned around the first end of the outer conductor, the first rotatable nut including a first threaded portion engaging the threaded portion of the first male calibration connector; and
    a female calibration standard inner conductor extending along the axis between a first end and a second end, the first end including an opening a pin of the inner conductor of the first male calibration connector received in the opening.

18. The system of Embodiment 17, further comprising:
    a second male calibration connector including
        an annular outer conductor extending along an axis between a first end and a second end, the outer conductor having an outer surface and an inner surface, the outer surface including a threaded portion proximal the first end, the inner surface defining a bore extending along the axis through the outer conductor,
        an inner conductor positioned within the bore and extending along the axis, the inner conductor having an outer surface spaced apart from the inner surface of the outer conductor,
        a support structure supporting the inner conductor within the bore, the support structure extending between the inner surface of the outer conductor and the outer surface of the inner conductor, the support structure comprising a dielectric material;
    wherein a rotatable second retaining nut is positioned around the second end of the female calibration standard outer conductor, the second rotatable nut including a second threaded portion engaging the threaded portion of the second male calibration connector; and
    wherein a pin of the inner conductor of the second male calibration connector is received in a second opening on a second end of the female calibration standard inner conductor.

19. The system of Embodiment 18, wherein the female calibration standard inner conductor is supported within the bore of the female calibration standard outer conductor by the first male calibration connector and the second male calibration connector.

20. The system of Embodiment 19, wherein only air is positioned between the female calibration standard inner conductor and the female calibration standard outer conductor.

21. The system of Embodiment 17, wherein the outer conductor of the female calibration standard does not include slots.

22. A male connector kit, comprising:
    an annular outer conductor having an outer surface and an inner surface, the outer surface including a threaded portion, the inner surface defining a cylindrical bore through the outer conductor;
    an inner conductor positioned within the bore, an outer surface of the inner conductor spaced apart from the inner surface of the outer conductor, the inner conductor supported by a dielectric support bead;
    a first removable detent portion having an inner surface defining an opening therethrough, a first portion of the inner surface including an annular detent extending therefrom, the annular detent having a first diameter, a second portion of the inner surface including a threaded portion configured to selectively and removably engage the threaded portion of the outer surface of the outer conductor; and
    a second removable detent portion having an inner surface defining an opening therethrough, a first portion of the inner surface including an annular detent extending therefrom, the annular detent having a second diameter different than the first diameter, a second portion of the inner surface including a threaded portion configured to selectively and removably engage the threaded portion of the outer surface of the outer conductor.

23. The kit of Embodiment 22, wherein the first removable detent portion can be attached to the outer conductor to form a male connector that is configured to attach to a female push-on connector with a first insertion and retention force.

24. The kit of Embodiment 23, the second removable detent portion can be attached to the outer conductor to form a male connector that is configured to attach to a female push-on connector with a second insertion and retention force different from the first insertion and retention force.

25. A method for calibrating an analyzer, the method comprising:
    attaching a first male calibration connector to a first test port of the analyzer;
    removing a removable detent portion from the first male calibration connector;
    connecting a female calibration standard inner conductor to the first male calibration connector by receiving a pin of the first male calibration connector in a first opening on a first end of the female calibration standard inner conductor;
    securing a female calibration standard outer conductor to the first male calibration connector by attaching a first threaded retaining nut of the female calibration standard outer conductor to the first male calibration connector.

26. The method of Embodiment 25, wherein securing the female calibration standard outer conductor to the first male calibration is performed prior to connecting the female calibration standard inner conductor to the first male calibration connector, and wherein connecting the female calibration standard inner conductor to the first male calibration connector comprises:
    inserting the female calibration standard inner conductor into a channel of an alignment tool;
    inserting the alignment tool into a bore of the female calibration standard outer conductor; and
    pushing the female calibration standard inner conductor toward the first male calibration connector by inserting a push rod into the channel of the alignment tool such that the pin of the first male calibration connector is received in the first opening of the female calibration inner conductor.

27. The method of Embodiment 25, further comprising:
    attaching a second male calibration connector to a second test port of the analyzer;
    removing a removable detent portion from the second male calibration connector;
    connecting the female calibration standard inner conductor to the second male calibration connector by receiving a pin of the second male calibration connector in a second opening on a second end of the female calibration standard inner conductor;
    securing the female calibration standard outer conductor to the second male calibration connector by attaching a second threaded retaining nut of the female calibration standard outer conductor to the second male calibration connector.

28. The method of Embodiment 27, further comprising:
    detaching the female calibration standard outer conductor and the female calibration standard inner conductor from the first male calibration connector;
    attaching the removable detent portion to the first male calibration connector; and
    connecting the first male calibration connector to a first female push-on connector of a device to be tested.

29. The method of Embodiment 28, further comprising:
    detaching the female calibration standard outer conductor and the female calibration standard inner conductor from the second male calibration connector;
    attaching the removable detent portion to the second male calibration connector; and
    connecting the second male calibration connector to a second female push-on connector of a device to be tested.

30. A female calibration kit for use with RF components having male push-on connectors, the kit comprising:
    a first female calibration connector including
        an annular outer conductor having a plurality of slots dividing a distal end of the outer conductor into a plurality of flexible arms, a nib extending radially outward from the distal tip of each of the plurality of flexible arms, and a threaded portion on an outer surface of the outer conductor, and
        an inner conductor supported within a bore of the outer conductor by a dielectric support structure, the inner conductor including a slotted opening;
    a first male calibration standard outer conductor including an annular body having a smooth inner surface defining a bore through the body, a first attachment mechanism positioned at a first end of the first male calibration standard outer conductor, the first attachment mechanism configured to attach the first end of the first male calibration standard outer conductor to the threaded portion of the first female calibration connector; and
    a first male calibration standard inner conductor comprising a cylindrical body, a first end of the first female calibration standard inner conductor including a pin configured to be received in the slotted opening of first female calibration connector.

31. The kit of Embodiment 30, further comprising:
    a second female calibration connector including an annular outer conductor including a threaded portion on an outer surface thereof, an inner conductor supported within a bore of the outer conductor by a dielectric support structure, the inner conductor including a slotted opening;
    wherein a second end of first male calibration standard outer conductor includes a second attachment mechanism configured to attach the second end of the first female calibration standard outer conductor to the threaded portion of the second female calibration connector; and
    wherein a second end of the first male calibration standard inner conductor comprises a second pin configured to be received in the slotted opening of the second female calibration connector.

32. The kit of Embodiment 31, wherein the first male calibration standard outer conductor and the first male calibration standard inner conductor each comprise a first length, and wherein the kit further comprises:
    a second male calibration standard outer conductor; and
    a second male calibration standard inner conductor;
    wherein the second male calibration standard outer conductor and the second male calibration standard inner conductor each comprise a second length different from the first length.

33. The kit of Embodiment 30, further comprising an alignment tool comprising an body extending along an axis, the body having a channel formed therethrough, an inner diameter of the channel corresponding to an outer diameter of the first male calibration standard inner conductor, an outer diameter of the channel corresponding to an inner diameter of the bore of the first female calibration standard outer conductor, and the alignment tool further comprising a handle.

34. The kit of Embodiment 33, further comprising a push rod tool comprising a cylindrical body extending along an axis, an outer diameter of the cylindrical body configured to correspond to the inner diameter of the channel of the alignment tool, a bore formed in a distal opening of the body, the bore configured to receive a pin, and the push rod further comprising a handle.

35. The kit of Embodiment 34, further comprising a short connector comprising:
   an annular outer conductor;
   an inner conductor positioned within the outer conductor, the inner conductor including a block connecting the inner conductor to the outer conductor.

36. A female calibration connector, comprising:
   an annular outer conductor extending along an axis between a first end and a second end, the outer conductor having an outer surface and an inner surface, the outer surface including a threaded portion proximal the first end, the inner surface defining a bore extending along the axis through the outer conductor, the first end including a plurality of slots that divide the outer conductor into a plurality of flexible arms, each flexible arm including a nib positioned on a distal tip thereof;
   an inner conductor positioned within the bore and extending along the axis, the inner conductor having an outer surface spaced apart from the inner surface of the outer conductor, the inner conductor including a slotted opening configured to receive a pin; and
   a support structure supporting the inner conductor within the bore, the support structure extending between the inner surface of the outer conductor and the outer surface of the inner conductor, the support structure comprising a dielectric material.

37. A male calibration standard, comprising:
   an annular outer conductor extending along an axis between a first end and a second end, the outer conductor including an inner surface defining a cylindrical bore that extends along the axis;
   a rotatable first retaining nut retained on the first end of the outer conductor by a first retaining ring positioned within a first annular groove on the first end of an outer surface of the outer conductor, the first rotatable nut including a first threaded portion configured to engage a corresponding threaded portion of a first male calibration connector; and
   a rotatable second retaining nut positioned around the outer conductor proximal to the second end, the second retaining nut retained on the second end of the outer conductor by a second retaining ring positioned within a second annular groove on the second end of an outer surface of the outer conductor, the second rotatable nut including a second threaded portion configured to engage a corresponding threaded portion of a second male calibration connector; and
   an inner conductor extending along the axis between a first end and a second end, each of the first end and the second end including a pin extending outwardly therefrom.

38. The male calibration standard of Embodiment 37, wherein the first and second retaining nuts each include an opening, wherein the outer conductor extends through the openings of the first and second retaining nuts, and wherein the first and second retaining nuts are configured to slide axially along the outer conductor.

39. The male calibration standard of Embodiment 37, wherein the inner surface of the outer conductor is smooth.

40. The male calibration standard of Embodiment 37, wherein the inner surface of the outer conductor does not include slots.

41. The male calibration standard of Embodiment 37, wherein the inner conductor includes an outer surface, and wherein the outer surface of the inner conductor is smooth.

42. The male calibration standard of Embodiment 37, wherein the inner conductor is not connected to the outer conductor.

43. A female calibration system, comprising:
   a first female calibration connector including
      an annular outer conductor extending along an axis between a first end and a second end, the outer conductor having an outer surface and an inner surface, the outer surface including a threaded portion proximal the first end, the inner surface defining a bore extending along the axis through the outer conductor, and a plurality of slots that divide the first end of the outer conductor into a plurality of flexible arms, each of the flexible arms including a nib,
      an inner conductor positioned within the bore and extending along the axis, the inner conductor having an outer surface spaced apart from the inner surface of the outer conductor, and end of the inner conductor including a slotted opening, and
      a support structure supporting the inner conductor within the bore, the support structure extending between the inner surface of the outer conductor and the outer surface of the inner conductor, the support structure comprising a dielectric material; and
   a male calibration standard outer conductor including
      an annular outer conductor extending along an axis between a first end and a second end, the outer conductor including an inner surface defining a cylindrical bore that extends along the axis,
      a rotatable first retaining nut positioned around the first end of the outer conductor, the first rotatable nut including a first threaded portion engaging the threaded portion of the first female calibration connector; and
   a male calibration standard inner conductor extending along the axis between a first end and a second end, the first end including a pin received in the slotted opening of the female calibration connector.

44. The system of Embodiment 43, further comprising:
   a second female calibration connector including
      an annular outer conductor extending along an axis between a first end and a second end, the outer conductor having an outer surface and an inner surface, the outer surface including a threaded portion proximal the first end, the inner surface defining a bore extending along the axis through the outer conductor, and a plurality of slots that divide the first end of the outer conductor into a plurality of flexible arms, each of the flexible arms including a nib,
      an inner conductor positioned within the bore and extending along the axis, the inner conductor having an outer surface spaced apart from the inner surface of the outer conductor, an end of the outer conductor including a slotted opening, and
      a support structure supporting the inner conductor within the bore, the support structure extending between the inner surface of the outer conductor and the outer surface of the inner conductor, the support structure comprising a dielectric material;

wherein a rotatable second retaining nut is positioned around the second end of the male calibration standard outer conductor, the second rotatable nut including a second threaded portion engaging the threaded portion of the second female calibration connector; and wherein a pin on the second end of the male calibration standard inner conductor is received in the slotted opening of the second female calibration connector.

45. The system of Embodiment 44, wherein the male calibration standard inner conductor is supported within the bore of the male calibration standard outer conductor by the first female calibration connector and the second female calibration connector.

46. The system of Embodiment 45, wherein only air is positioned between the male calibration standard inner conductor and the male calibration standard outer conductor.

47. The system of Embodiment 44, wherein the outer conductor of the male calibration standard does not include slots.

48. A method for calibrating an analyzer, the method comprising:
attaching a first female calibration connector to a first test port of the analyzer;
connecting a male calibration standard inner conductor to the first female calibration connector by receiving a first pin of the first male calibration standard inner conductor in a slotted opening on the female calibration connector;
securing a male calibration standard outer conductor to the first female calibration connector by attaching a first threaded retaining nut of the male calibration standard outer conductor to the first female calibration connector.

49. The method of Embodiment 48, wherein securing the male calibration standard outer conductor to the first female calibration is performed prior to connecting the male calibration standard inner conductor to the first female calibration connector, and wherein connecting the male calibration standard inner conductor to the first female calibration connector comprises:
inserting the male calibration standard inner conductor into a channel of an alignment tool;
inserting the alignment tool into a bore of the male calibration standard outer conductor; and
pushing the male calibration standard inner conductor toward the first female calibration connector by inserting a push rod into the channel of the alignment tool such that the pin of the first male calibration standard inner conductor is received in the slotted opening of the first female calibration connector.

50. The method of Embodiment 48, further comprising:
attaching a second female calibration connector to a second test port of the analyzer;
connecting the male calibration standard inner conductor to the second female calibration connector by receiving a second pin of the male calibration standard inner conductor in a slotted opening on the second female calibration connector;
securing the male calibration standard outer conductor to the second female calibration connector by attaching a second threaded retaining nut of the calibration outer conductor to the second male calibration connector.

51. The method of Embodiment 50, further comprising:
detaching the male calibration standard outer conductor and the male calibration standard inner conductor from the first female calibration connector; and
connecting the first female calibration connector to a first male push-on connector of a device to be tested.

52. The method of Embodiment 51, further comprising:
detaching the male calibration standard outer conductor and the male calibration standard inner conductor from the second female calibration connector; and
connecting the second female calibration connector to a second male push-on connector of a device to be tested.

Conclusion

Although various systems, devices, and methods have been disclosed in the context of certain embodiments and examples, it will be understood by those skilled in the art that the assemblies extend beyond the specifically disclosed embodiments to other alternative embodiments and/or uses of the embodiments and certain modifications and equivalents thereof. Use with any structure is expressly within the scope of this invention. Various features and aspects of the disclosed embodiments can be combined with or substituted for one another in order to form varying modes of the assembly. The scope of this disclosure should not be limited by the particular disclosed embodiments described herein.

Certain features that are described in this disclosure in the context of separate implementations or embodiments can also be implemented in combination in a single implementation or embodiment. Conversely, various features that are described in the context of a single implementation or embodiment can also be implemented in multiple implementations or embodiments separately or in any suitable subcombination. Moreover, although features may be described above as acting in certain combinations, one or more features from a claimed combination can, in some cases, be excised from the combination, and the combination may be claimed as any subcombination or variation of any subcombination.

Terms of orientation used herein, such as "top," "bottom," "proximal," "distal," "longitudinal," "lateral," and "end," are used in the context of the illustrated embodiment. However, the present disclosure should not be limited to the illustrated orientation. Indeed, other orientations are possible and are within the scope of this disclosure. Terms relating to circular shapes as used herein, such as diameter or radius, should be understood not to require perfect circular structures, but rather should be applied to any suitable structure with a cross-sectional region that can be measured from side-to-side. Terms relating to shapes generally, such as "circular," "cylindrical," "semi-circular," or "semi-cylindrical" or any related or similar terms, are not required to conform strictly to the mathematical definitions of circles or cylinders or other structures, but can encompass structures that are reasonably close approximations.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language, such as the phrase "at least one of X, Y, and Z," unless specifically stated otherwise, is otherwise understood with the context as used in general to convey that an item, term, etc. may be either X, Y, or Z.

Thus, such conjunctive language is not generally intended to imply that certain embodiments require the presence of at least one of X, at least one of Y, and at least one of Z.

The terms "approximately," "about," and "substantially" as used herein represent an amount close to the stated amount that still performs a desired function or achieves a desired result. For example, in some embodiments, as the context may dictate, the terms "approximately," "about," and "substantially," may refer to an amount that is within less than or equal to 10% of the stated amount. The term "generally" as used herein represents a value, amount, or characteristic that predominantly includes or tends toward a particular value, amount, or characteristic. As an example, in certain embodiments, as the context may dictate, the term "generally parallel" can refer to something that departs from exactly parallel by less than or equal to 20 degrees.

Some embodiments have been described in connection with the accompanying drawings. The figures may be to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

In summary, various embodiments and examples of systems, devices, and methods have been disclosed. Although these have been disclosed in the context of those embodiments and examples, this disclosure extends beyond the specifically disclosed embodiments to other alternative embodiments and/or other uses of the embodiments, as well as to certain modifications and equivalents thereof. This disclosure expressly contemplates that various features and aspects of the disclosed embodiments can be combined with, or substituted for, one another. Accordingly, the scope of this disclosure should not be limited by the particular disclosed embodiments described above, but should be determined only by a fair reading of the claims that follow.

What is claimed is:

1. A male calibration kit for use with RF components having female push-on connectors, the kit comprising:
   a first male calibration connector including
      an annular outer conductor,
      an inner conductor supported within a bore of the outer conductor by a dielectric support structure, the inner conductor including a pin, and
      a removable detent portion removably attached to a first end of the first male calibration connector, the removable detent portion comprising a detent formed as an annular protrusion extending radially inward from an inner surface of the removable detent portion, the first male calibration connector configured to connect to a female push-on connector when the removable detent portion is attached to the first male calibration connector through engagement of the detent with a nib of the female push-on connector;
   a first female calibration standard outer conductor including
      an annular body having a slot-free, smooth inner surface defining a bore through the body,
      a first attachment mechanism positioned at a first end of the first female calibration standard outer conductor, the first attachment mechanism configured to attach the first end of the first female calibration standard outer conductor to the first end of the first male calibration connector when the removable detent portion is removed from the first male calibration connector; and
   a first female calibration standard inner conductor comprising a cylindrical body, a first end of the first female calibration standard inner conductor including a first opening configured to receive the pin of the first male calibration connector,
   wherein the first female calibration standard inner conductor is supported within the first female calibration standard outer conductor by the pin of the first male calibration connector such that there is an air gap between the first female calibration standard inner conductor and the first female calibration standard outer conductor when the first female calibration standard outer conductor and the first female standard calibration inner conductor are attached to the first male calibration connector.

2. The kit of claim 1, further comprising:
   a second male calibration connector including an annular outer conductor, an inner conductor supported within a bore of the outer conductor by a dielectric support structure, the inner conductor including a pin, and a removable detent portion removably attached to a first end of the second male calibration connector, the second male calibration connector configured to connect to a female push-on connector when the removable detent portion is attached to the second male calibration connector;
   wherein a second end of first female calibration standard outer conductor includes a second attachment mechanism configured to attach the second end of the first female calibration standard outer conductor to the first end of the second male calibration connector when the removable detent portion is removed from the second male calibration connector; and
   wherein a second end of the first female calibration standard inner conductor comprises a second opening configured to receive the pin of the second male calibration connector.

3. The kit of claim 2, wherein the first female calibration standard outer conductor and the first female calibration standard inner conductor each comprise a first length, and wherein the kit further comprises:
   a second female calibration standard outer conductor; and
   a second female calibration standard inner conductor;
   wherein the second female calibration standard outer conductor and the second female calibration standard inner conductor each comprise a second length different from the first length.

4. The kit of claim 1, further comprising an alignment tool comprising a body extending along an axis, the body having a channel formed therethrough, an inner diameter of the channel corresponding to an outer diameter of the first female calibration standard inner conductor, an outer diameter of the channel corresponding to an inner diameter of the bore of the first female calibration standard outer conductor, and the alignment tool further comprising a handle.

5. The kit of claim 4, further comprising a push rod tool comprising a cylindrical body extending along an axis, an outer diameter of the cylindrical body configured to correspond to the inner diameter of the channel of the alignment tool, and the push rod further comprising a handle.

6. The kit of claim 5, further comprising a short connector comprising:
an annular outer conductor;
an inner conductor positioned within the outer conductor, the inner conductor including a block connecting the inner conductor to the outer conductor.

7. A female calibration standard, comprising:
an annular outer conductor extending along an axis between a first end and a second end, the outer conductor including an inner surface defining a cylindrical bore that extends along the axis, wherein the inner surface is smooth and slot-free between the first end and the second end;
a rotatable first retaining nut retained on the first end of the outer conductor by a first retaining ring positioned within a first annular groove on the first end of an outer surface of the outer conductor, the first rotatable nut including a first threaded portion configured to engage a corresponding threaded portion of a first male calibration connector; and
a rotatable second retaining nut positioned around the outer conductor proximal to the second end, the second retaining nut retained on the second end of the outer conductor by a second retaining ring positioned within a second annular groove on the second end of an outer surface of the outer conductor, the second rotatable nut including a second threaded portion configured to engage a corresponding threaded portion of a second male calibration connector; and
an inner conductor extending along the axis between a first end and a second end, the first end including an opening configured to receive a pin of the first male calibration connector and the second end including an opening configured to receive a pin of the second male calibration connector,
wherein the inner the inner conductor is supported within the outer conductor by pins of a first male calibration connector and a second male calibration connector such that there is an air gap between the inner conductor and the outer conductor and no structure extends between the inner conductor and outer conductor between the first end and the second end of the inner surface of the outer conductor when the female calibration standard is connected between the first male calibration connector and the second male calibration connector.

8. The female calibration standard of claim 7, wherein the first and second retaining nuts each include an opening, wherein the outer conductor extends through the openings of the first and second retaining nuts, and wherein the first and second retaining nuts are configured to slide axially along the outer conductor.

9. The female calibration standard of claim 7, wherein the inner conductor includes an outer surface, and wherein the outer surface of the inner conductor is smooth.

10. The female calibration standard of claim 7, wherein the openings of the first end and the second end of the inner conductor are configured to receive inserts, the inserts including bores configured to receive the pins of the first and second male calibration connectors.

11. The female calibration standard of claim 7, wherein the inner conductor is not connected to the outer conductor.

* * * * *